US012685016B2

(12) United States Patent
Kim et al.

(10) Patent No.: US 12,685,016 B2
(45) Date of Patent: Jul. 14, 2026

(54) ORGANIC LIGHT-EMITTING DEVICE AND APPARATUS INCLUDING THE SAME

(71) Applicant: SAMSUNG DISPLAY CO., LTD., Yongin-si (KR)

(72) Inventors: Hyojeong Kim, Yongin-si (KR); Minje Kim, Yongin-si (KR); Eungdo Kim, Yongin-si (KR); Hyunyoung Kim, Yongin-si (KR); Hyosup Shin, Yongin-si (KR); Seokgyu Yoon, Yongin-si (KR); Youngki Lee, Yongin-si (KR); Jungsub Lee, Yongin-si (KR); Jiyoung Lee, Yongin-si (KR); Hyejin Jung, Yongin-si (KR); Kunwook Cho, Yongin-si (KR); Hyeongu Cho, Yongin-si (KR); Minsoo Choi, Yongin-si (KR); Youngeun Choi, Yongin-si (KR); Jaejin Lyu, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/064,787

(22) Filed: Dec. 12, 2022

(65) Prior Publication Data

US 2023/0119261 A1 Apr. 20, 2023

Related U.S. Application Data

(63) Continuation of application No. 16/859,894, filed on Apr. 27, 2020, now Pat. No. 11,527,725.

(30) Foreign Application Priority Data

Oct. 4, 2019 (KR) ........................ 10-2019-0123356

(51) Int. Cl.
*H01L 51/50* (2006.01)
*C09K 11/06* (2006.01)
(Continued)

(52) U.S. Cl.
CPC .......... *H10K 85/6572* (2023.02); *C09K 11/06* (2013.01); *H10K 85/322* (2023.02);
(Continued)

(58) Field of Classification Search
None
See application file for complete search history.

(56) References Cited

U.S. PATENT DOCUMENTS 9,604,928 B2 3/2017 Shitagaki et al.
9,666,817 B2 5/2017 Kim et al.
(Continued)

FOREIGN PATENT DOCUMENTS

CN 106910831 A 6/2017
CN 107275496 A 10/2017
(Continued)

OTHER PUBLICATIONS

Translation—JP-2004273190-A (Year: 2004).
(Continued)

*Primary Examiner* — Gregory D Clark
(74) *Attorney, Agent, or Firm* — Womble Bond Dickinson (US) LLP

(57) ABSTRACT

An organic light-emitting device having improved efficiency and lifespan includes: a first electrode, a second electrode, and an organic layer between the first electrode and the second electrode, wherein the organic layer includes an emission layer, the emission layer includes a first compound, a second compound, a third compound, and a fourth compound, the first compound, the second compound, the third compound, and the fourth compound are different from each
(Continued)

other, the third compound includes a metal element having an atomic number of 40 or more, the fourth compound includes boron (B), the third compound and the fourth compound each satisfy Conditions 1-1 and 1-2 below, and the fourth compound satisfies Condition 2 or 3:

$$T_1(C3)_{onset} \geq S_1(C4)_{onset} \quad \text{Condition 1-1}$$

$$T_1(C3)_{max} \geq S_1(C4)_{max} \quad \text{Condition 1-2}$$

$$K_{RISC}(C4) \geq 10^3\, S^{-1} \quad \text{Condition 2}$$

$$f(C4) \geq 0.1 \quad \text{Condition 3.}$$

20 Claims, 2 Drawing Sheets

(51) Int. Cl.

| | |
|---|---|
| ***H10K 85/30*** | (2023.01) |
| ***H10K 85/40*** | (2023.01) |
| ***H10K 85/60*** | (2023.01) |
| *H10K 50/11* | (2023.01) |
| *H10K 101/00* | (2023.01) |
| *H10K 101/10* | (2023.01) |
| *H10K 101/30* | (2023.01) |

(52) U.S. Cl.

CPC ........... *H10K 85/342* (2023.02); *H10K 85/40* (2023.02); *H10K 85/633* (2023.02); *H10K 85/636* (2023.02); *H10K 85/654* (2023.02); *H10K 85/6574* (2023.02); *C09K 2211/1077* (2013.01); *C09K 2211/185* (2013.01); *H10K 50/11* (2023.02); *H10K 2101/00* (2023.02); *H10K 2101/10* (2023.02); *H10K 2101/30* (2023.02); *H10K 2101/90* (2023.02)

(56) References Cited

U.S. PATENT DOCUMENTS

| | | | |
|---|---|---|---|
| 9,741,939 | B2 | 8/2017 | Kim et al. |
| 9,923,155 | B2 | 3/2018 | Li et al. |
| 9,980,358 | B2 | 5/2018 | Kim |
| 9,985,233 | B2 | 5/2018 | Hashimoto et al. |
| 10,008,676 | B2 | 6/2018 | Han et al. |
| 10,062,850 | B2 | 8/2018 | Jung et al. |
| 10,090,483 | B2 | 10/2018 | Kim et al. |
| 10,374,166 | B2 | 8/2019 | Hatakeyama et al. |
| 10,418,573 | B2 | 9/2019 | Kim et al. |
| 10,431,766 | B2 | 10/2019 | Ito et al. |
| 10,886,478 | B2 | 1/2021 | Li et al. |
| 10,916,715 | B2 | 2/2021 | Ko et al. |
| 11,289,660 | B2 | 3/2022 | Lee et al. |
| 11,316,124 | B2 | 4/2022 | Ito et al. |
| 11,482,680 | B2 | 10/2022 | Kim et al. |
| 11,696,499 | B2 | 7/2023 | Cho et al. |
| 2013/0264560 | A1 | 10/2013 | Dobbs et al. |
| 2013/0264561 | A1 | 10/2013 | Dobbs et al. |
| 2014/0077172 | A1 | 3/2014 | So et al. |
| 2015/0001502 | A1 | 1/2015 | Seo et al. |
| 2015/0105556 | A1 | 4/2015 | Li et al. |
| 2015/0207079 | A1 | 7/2015 | Cho et al. |
| 2015/0295197 | A1 | 10/2015 | Adamovich et al. |
| 2016/0028028 | A1 | 1/2016 | Li et al. |
| 2016/0087227 | A1 | 3/2016 | Kim et al. |
| 2016/0164020 | A1 | 6/2016 | Kim et al. |
| 2016/0233442 | A1 | 8/2016 | Yen et al. |
| 2016/0301014 | A1 | 10/2016 | Kawamura et al. |
| 2017/0179395 | A1 | 6/2017 | Kim et al. |
| 2017/0294613 | A1 | 10/2017 | Cho et al. |
| 2017/0346029 | A1 | 11/2017 | Kim et al. |
| 2018/0033987 | A1 | 2/2018 | Kim et al. |
| 2018/0108857 | A1 | 4/2018 | Adachi et al. |
| 2018/0151821 | A1 | 5/2018 | Peng et al. |
| 2018/0312533 | A1 | 11/2018 | Ahn et al. |
| 2018/0323394 | A1 | 11/2018 | Haldi et al. |
| 2018/0337361 | A1 | 11/2018 | Lee et al. |
| 2018/0375036 | A1 | 12/2018 | Chen et al. |
| 2019/0013478 | A1 | 1/2019 | Iijima et al. |
| 2019/0019964 | A1 | 1/2019 | Jeon et al. |
| 2019/0019971 | A1 | 1/2019 | Xie et al. |
| 2019/0036055 | A1 | 1/2019 | Lin et al. |
| 2019/0058124 | A1 | 2/2019 | Hatakeyama et al. |
| 2019/0058137 | A1 | 2/2019 | Ko et al. |
| 2019/0062312 | A1 | 2/2019 | Zink |
| 2019/0067616 | A1 | 2/2019 | Jeon et al. |
| 2019/0093009 | A1 | 3/2019 | Yen et al. |
| 2019/0097155 | A1 | 3/2019 | Kim et al. |
| 2019/0103564 | A1 | 4/2019 | Ogawa et al. |
| 2019/0148640 | A1 | 5/2019 | Lim et al. |
| 2019/0157351 | A1 | 5/2019 | Kim et al. |
| 2019/0203114 | A1 | 7/2019 | Ihn et al. |
| 2019/0207112 | A1 | 7/2019 | Hatakeyama et al. |
| 2019/0296254 | A1 | 9/2019 | Ko et al. |
| 2019/0393422 | A1 | 12/2019 | Sakamoto |
| 2020/0083461 | A1 | 3/2020 | Duan et al. |
| 2020/0136046 | A1 | 4/2020 | Béalle et al. |
| 2020/0203651 | A1 | 6/2020 | Duan et al. |
| 2020/0321539 | A1 | 10/2020 | Zhao et al. |
| 2021/0098713 | A1 | 4/2021 | Choi et al. |
| 2021/0098714 | A1 | 4/2021 | Choi et al. |
| 2021/0098716 | A1 | 4/2021 | Lee et al. |
| 2021/0098721 | A1 | 4/2021 | Jung et al. |
| 2021/0104681 | A1 | 4/2021 | Kim et al. |
| 2021/0292342 | A1 | 9/2021 | Suzuki et al. |
| 2022/0024958 | A1 | 1/2022 | Ko et al. |
| 2022/0131086 | A1 | 4/2022 | Lee et al. |
| 2023/0127039 | A1 | 4/2023 | Naijo et al. |
| 2023/0138754 | A1 | 5/2023 | Lee et al. |

FOREIGN PATENT DOCUMENTS

| | | | |
|---|---|---|---|
| CN | 107359257 | A | 11/2017 |
| CN | 107408634 | A | 11/2017 |
| CN | 108431984 | A | 8/2018 |
| CN | 109075259 | A | 12/2018 |
| CN | 109192874 | A | 1/2019 |
| CN | 109786569 | A | 5/2019 |
| CN | 110105281 | A | 8/2019 |
| CN | 110299457 | A | 10/2019 |
| EP | 3109253 | A1 | 12/2016 |
| EP | 3435438 | A2 | 1/2019 |
| EP | 3800683 | A1 | 4/2021 |
| JP | 2004273190 | A | 9/2004 |
| JP | 2011-153276 | A | 8/2011 |
| JP | 2016-130231 | A | 7/2016 |
| JP | 2019-169710 | A | 10/2019 |
| KR | 10-1219668 | B1 | 1/2013 |
| KR | 10-1419810 | B1 | 7/2014 |
| KR | 10-2016-0012941 | A | 2/2016 |
| KR | 10-2016-0034528 | A | 3/2016 |
| KR | 10-2016-0039974 | A | 4/2016 |
| KR | 10-1617877 | B1 | 5/2016 |
| KR | 10-2016-0067629 | A | 6/2016 |
| KR | 10-2016-0101519 | A | 8/2016 |
| KR | 10-1646732 | B1 | 8/2016 |
| KR | 10-2016-0119683 | A | 10/2016 |
| KR | 10-1680934 | B1 | 11/2016 |
| KR | 10-2017-0014797 | A | 2/2017 |
| KR | 10-1706752 | B1 | 2/2017 |
| KR | 10-2017-0026075 | A | 3/2017 |
| KR | 10-2017-0078573 | A | 7/2017 |
| KR | 10-2017-0083960 | A | 7/2017 |
| KR | 10-2018-0013380 | A | 2/2018 |
| KR | 10-2018-0033094 | A | 4/2018 |
| KR | 10-2018-0043886 | A | 5/2018 |
| KR | 10-2018-0108604 | A | 10/2018 |
| KR | 10-2018-0120865 | A | 11/2018 |
| KR | 20180134850 | A | 12/2018 |
| KR | 10-2019-0000812 | A | 1/2019 |
| KR | 10-2019-0008481 | A | 1/2019 |

(56) References Cited

FOREIGN PATENT DOCUMENTS

| | | | |
|---|---|---|---|
| KR | 10-2019-0034126 | A | 4/2019 |
| WO | WO 2011081286 | A2 | 7/2011 |
| WO | WO 2016/152605 | A1 | 9/2016 |
| WO | 2019/128105 | A1 | 7/2019 |

OTHER PUBLICATIONS

Translation—WO-2011081286-A2 (Year: 2011).

Liang, Xiao, et al. "Peripheral amplification of multi-resonance induced thermally activated delayed fluorescence for highly efficient OLEDs." Angewandte Chemie 130.35 (2018): 11486-11490. (Year: 2018).

U.S. Office Action dated Jan. 24, 2023, issued in U.S. Appl. No. 16/919,858 (25 pages).

U.S. Office Action dated Feb. 3, 2023, issued in U.S. Appl. No. 16/997,715 (11 pages).

Martin C. E. Huber, et al., "The measurement of oscillator strengths," Reports on Progress in Physics, Institute of Physics Publishing, Bristol, GB, Vo. 49, No. 4, Apr. 1, 1986, pp. 397-490, XP020024846, DOI: 10.1088/0034-4885/49/4/002.

US Notice of Allowance dated Jun. 28, 2023, issued in U.S. Appl. No. 16/997,715 (5 pages).

JP-2011153276-A—translation (Year: 2011).

US Final Office Action dated Aug. 2, 2023, issued in U.S. Appl. No. 16/919,858 (26 pages).

Chiu, et al., "High-Efficiency Blue Phosphorescence Organic Light-Emitting Diode with Ambipolar Carbozole-Triazole Host," J. Phys. Chem. C (2015), vol. 119, pp. 16846-16852.

Choi, et al., "Simultaneous achievement of High Efficiency and Long Lifetime in Deep Blue Phosphorescent Organic Light-Emitting Diodes," Advanced Optical Materials (2019), vol. 7, No. 23, pp. 1901374-1901374.

Finkenzeller, et al., "Emission of Ir(ppy)$_3$. Temperature dependence, Decay Dynamics, and Magnetic Field Properties", Chemical Physics Letters (2003), vol. 377 pp. 299-305.

Hatakeyama, et al., "Ultrapure Blue Thermally Activated Delayed Fluorescence Molecules: Efficient HOMO-LUMO Separation by the Multiple Resonance Effect," Adv. Mater. (2016), vol. 28, pp. 2777-2781.

Hedley, et al., "Ultrafast Luminescence in Ir(ppy)$_3$," Chemical Physics Letters (2008), vol. 450, pp. 292-296.

Huang, et al., "Investigation of Exciton Recombination Zone in Quantum Dot Light- Emitting Diodes Using a Fluorescent Probe", ACS Appl. Mater. Interfaces (2017), vol. 9, pp. 27809-27816.

Joo, et al., "Development of Solution-Processable Blue/Hybrid-White OLEDs Based on Thermally Activated Delayed Fluorescence", Journal of Industrial and Engineering Chemistry (2018), vol. 65, pp. 35-39.

Lee, et al., "Phosphor Sensitized Thermally Activated Delayed Fluorescence Organic Light-Emitting Diodes with Ideal Deep Blue Device Performances", Journal of Materials Chemistry C (2019), vol. 7, pp. 8562-8568.

Li, et al. "Efficient and Stable White Organic Light-Emitting Diodes Employing a Single Emitter," Adv. Mater. (2014), vol. 26, pp. 2931-2936.

Li, et al., "Efficient Solution-Processed Blue and White OLEDs Based on a High-Triplet Bipolar Host and a Blue TADF Emitter", Organic Electronics (2018), vol. 58, pp. 276-282.

Office Action for U.S. Appl. No. 17/131,555 dated Oct. 18, 2023, 20 pages.

Park, et al., "High Efficiency of Over 25% and Long Device Lifetime of Over 500 h at 1000 nit in Blue Fluorescent Organic Light-Emitting Diodes" Adv. Mater. (2022), vol. 34, 7 pages.

Saghaei, et al., "Effect of PEDOT:PSS on the Performance of Solution-Processed Blue Phosphorescent Organic Light-emitting Diodes with an Exciplex Host," Mater. Adv. (2022), vol. 3, pp. 1055-1063.

Zhao, et al., "Highly Efficient Red OLEDs Using DCJTB as the Dopant and Delayed Fluorescent Exciplex as the Host," Scientific Reports (2015), vol. 5, 8 pages.

US Office Action dated Feb. 12, 2024, issued in U.S. Appl. No. 16/919,858 (19 pages).

US Final Office Action dated Mar. 8, 2024, issued in U.S. Appl. No. 17/131,555 (19 pages).

US Final Office Action dated Jun. 12, 2024, issued in U.S. Appl. No. 16/919,858 (20 pages).

Wong, Michael Y., and Eli Zysman-Colman. "Purely organic thermally activated delayed fluoresence materials for organic light-emitting diodes." Advanced Materials 29.22 (2017): 1605444. (Year: 2017).

US Office Action dated Oct. 10, 2024, issued in U.S. Appl. No. 18/528,604 (8 pages).

US Office Action dated Oct. 10, 2024, issued in U.S. Appl. No. 17/131,555 (25 pages).

US Office Action dated Dec. 18, 2024, issued in U.S. Appl. No. 16/919,858 (20 pages).

S Notice of Allowance dated Feb. 12, 2025, issued in U.S. Appl. No. 18/52,604 (9 pages).

Liu et al., "Novel bipolar host materials based on 1,3,5-triazine derivatives for highly efficient phosphorescent OLEDs with extremely low efficiency roll-off," Phys. Chem. Chem: Phys, 2012, 14, pp. 14255-14261.

US Final Office Action dated Mar. 20, 2025, issued in U.S Appl. No. 17/131,555 (20 pages).

US Final Rejection dated May 29, 2025, issued in U.S. Appl. No. 16/919,858 (28 pages).

Shin, Su Kyeong, et al, "High triplet energy exciplex host derived from a CN modified carbazole based n-type host for imoproved efficiency and lifetime in blue phosphorescent organic light-emitting diodes," Journal of Materials Chemistry C, 2018, pp. 10308-10314.

US Office Action dated Sep. 24, 2025, issued in U.S. Appl. No. 17/131,555 (15 pages).

US Notice of Allowance dated Jan. 13, 2026, issued in U.S. Appl. No. 16/919,858 (21 pages).

US Final Office Action dated Fe. 18, 2026, issued in U.S. Appl. No. 17/131,555 (13 pages).

US Final Office Action dated Sep. 9, 2025, issued in U.S. Appl. No. 16/919,858 (31 pages).

ORGANIC LIGHT-EMITTING DEVICE AND APPARATUS INCLUDING THE SAME

CROSS-REFERENCE TO RELATED APPLICATIONS

This application is a continuation of U.S. patent application Ser. No. 16/859,894, filed Apr. 27, 2020, which claims priority to and the benefit of Korean Patent Application No. 10-2019-0123356, filed Oct. 4, 2019, the entire content of both of which is incorporated herein by reference.

BACKGROUND

1. Field

One or more aspects of embodiments of the present disclosure relate to an organic light-emitting device and an apparatus including the same.

2. Description of Related Art

Organic light-emitting devices are self-emission devices that can produce full-color images, and also have wide viewing angles, high contrast ratios, short response times, as well as excellent characteristics in terms of brightness, driving voltage, and/or response speed.

An example of the organic light-emitting devices may include a first electrode positioned on a substrate, and a hole transport region, an emission layer, an electron transport region, and a second electrode, which are sequentially positioned on the first electrode. Holes provided from the first electrode may move toward the emission layer through the hole transport region, and electrons provided from the second electrode may move toward the emission layer through the electron transport region. Carriers, such as holes and electrons, may then recombine in the emission layer to produce excitons. These excitons transition from an excited state to a ground state, thereby generating light.

SUMMARY

One or more aspects of embodiments of the present disclosure are directed toward an organic light-emitting device and an apparatus including the same.

Additional aspects will be set forth in part in the description which follows and, in part, will be apparent from the description, or may be learned by practice of the presented embodiments of the disclosure.

One or more embodiments include an organic light-emitting device including a first electrode, a second electrode, and an organic layer between the first electrode and the second electrode, wherein the organic layer includes an emission layer, the emission layer includes a first compound, a second compound, a third compound, and a fourth compound, the first compound, the second compound, the third compound, and the fourth compound are different from each other, the third compound includes a metal element of atomic number of 40 or more, the fourth compound includes boron (B), the third compound and the fourth compound each satisfy Conditions 1-1 and 1-2 below, and the fourth compound satisfies Conditions 2 or 3:

$$T_1(C3)_{onset} \geq S_1(C4)_{onset} \quad \text{Condition 1-1}$$

$$T_1(C3)_{max} \geq S_1(C4)_{max} \quad \text{Condition 1-2}$$

$$K_{RISC}(C4) \geq 10^3\ S^{-1} \quad \text{Condition 2}$$

$$f(C4) \geq 0.1, \quad \text{Condition 3}$$

wherein in Conditions 1-1, 1-2, 2, and 3, $S_1(C4)_{onset}$ is a singlet energy of the fourth compound at the onset wavelength ($\lambda_{onset}$) of a photoluminescence (PL) spectrum;

$T_1(C3)_{onset}$ is a triplet energy of the third compound at the onset wavelength of the PL spectrum;

$S_1(C4)_{max}$ is a singlet energy of the fourth compound at the maximum emission wavelength ($\lambda_{max}$) of the PL spectrum;

$T_1(C3)_{max}$ is a triplet energy of the third compound at the maximum emission wavelength of the photoluminescence spectrum;

$K_{RISC}(C4)$ is a reverse intersystem crossing (RISC) constant of the fourth compound; and f(C4) is the oscillation strength of the fourth compound.

One or more embodiments include an apparatus including a thin-film transistor including a source electrode, a drain electrode, and an activation layer and the organic light-emitting device, wherein the first electrode of the organic light-emitting device is electrically connected to the source electrode or drain electrode of the thin-film transistor.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
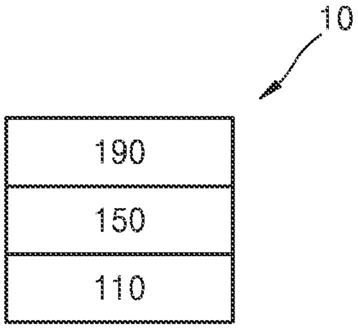
FIG. 1 is a schematic view of an organic light-emitting device according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof. Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention."

Hereinafter, embodiments of the present disclosure will be described in more detail with reference to the accompanying drawings. The same or corresponding components will be denoted by the same reference numerals, and thus redundant description thereof will not be provided.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

As used herein, the terms "use," "using," and "used" may be considered synonymous with the terms "utilize," "utilizing," and "utilized," respectively.

It will be understood that when a layer, region, or component is referred to as being "on" or "onto" another layer, region, or component, it may be directly or indirectly formed on the other layer, region, or component. That is, for example, intervening layers, regions, or components may be present. In contrast, when a layer, region, or component is referred to as being "directly on" or "directly onto" another layer, region, or component, no intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments of the present disclosure are not limited thereto.

The term "organic layer" as used herein refers to a single layer and/or a plurality of layers between the first electrode and the second electrode of the organic light-emitting device. A material included in the "organic layer" is not limited to an organic material.

An embodiment of the present disclosure provides an organic light-emitting device including:

a first electrode, a second electrode, and an organic layer between the first electrode and the second electrode, wherein the organic layer includes an emission layer, the emission layer includes a first compound, a second compound, a third compound, and a fourth compound, the first compound, the second compound, the third compound, and the fourth compound are different from each other, the third compound includes a metal element of atomic number of 40 or more, the fourth compound includes boron (B), the third compound and the fourth compound each satisfy Conditions 1-1 and 1-2 below, and the fourth compound satisfies Condition 2 and/or Condition 3 below:

$$T_1(C3)_{onset} \geq S_1(C4)_{onset} \quad \text{Condition 1-1}$$

$$T_1(C3)_{max} \geq S_1(C4)_{max} \quad \text{Condition 1-2}$$

$$K_{RISC}(C4) \geq 10^3\ S^{-1} \quad \text{Condition 2}$$

$$f(C4) \geq 0.1. \quad \text{Condition 3}$$

In Conditions 1-1, 1-2, 2, and 3, $S_1(C4)_{onset}$ is the singlet energy of the fourth compound at the onset wavelength ($\lambda_{onset}$) of the photoluminescence (PL) spectrum;

$T_1(C3)_{onset}$ is the triplet energy of the third compound at the onset wavelength of the PL spectrum;

$S_1(C4)_{max}$ is the singlet energy of the fourth compound at the maximum emission wavelength ($\lambda_{max}$) of the PL spectrum;

$T_1(C3)_{max}$ is the triplet energy of the third compound at the maximum emission wavelength of the photoluminescence spectrum;

$K_{RISC}(C4)$ is a reverse intersystem crossing (RISC) constant of the fourth compound;

f(C4) is the oscillation strength of the fourth compound.

The term "singlet energy at the onset wavelength" used herein refers to singlet energy at the beginning of the PL spectrum, and may be calculated from the singlet energy at the point at which the function obtained by plotting the PL spectrum as a quadratic function meets the wavelength axis (that is, x-intercept).

The term "triplet energy at the onset wavelength" used herein refers to triplet energy at the beginning of the PL spectrum, and may be calculated from the triplet energy at the point at which the function obtained by plotting the PL spectrum as a quadratic function meets the wavelength axis (that is, x-intercept).

In this regard, the room-temperature PL spectrum was measured at room temperature by using a PL measuring device using a $1\times10^{-5}$ M compound dissolved in toluene; and the low-temperature PL spectrum was measured at low temperature (77K) by using $1\times10^{-5}$ M compound dissolved in THF. Compared to the room-temperature PL spectrum, peaks found only at low temperature are analyzed and a singlet energy level and a triplet energy level are obtained therefrom.

$K_{RISC}(C4)$ is calculated from Equation 1:

$$k_{RISC}(C4) = \frac{\phi_{PL}}{k_r \tau_p \tau_d} \quad \text{Equation 1}$$

In Equation 1, $\Phi_{PL}$ is a photoluminescence quantum yield of a prompt luminescent component derived from the transient electroluminescence spectrum of the fourth compound, $k_r$ is a radioactive decay rate constant of the fourth compound from S1 to S0, and is calculated by the following Equation 2.

$$k_r(C4) = \frac{\Phi_{PL}}{\tau_p} \quad \text{Equation 2}$$

$\tau_p$ is the lifespan of a luminescent component derived from the transient electroluminescence spectrum of the fourth compound, $\tau_d$ is the lifespan of a luminescent component derived from the delayed electroluminescence spectrum of the fourth compound, f(C4) is calculated by using a non-empirical molecular orbital method. Specifically, it is calculated as B3LYP/6-31G(d) using Gaussian 09 from Gaussian Inc.

For example, the first compound may be represented by Formula 1 below, the second compound may be represented by Formula 10 below, the third compound may be represented by Formula 3 below, and the fourth compound may be represented by Formula 4 below:

Formula 1

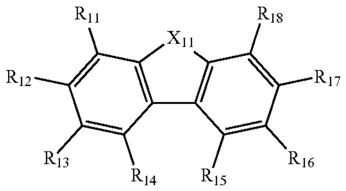

Formula 10

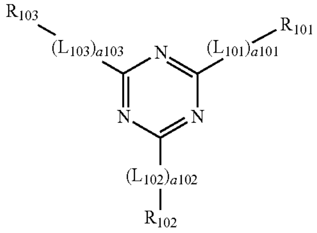

Formula 3

$M_{31}(L_{31})_{n31}(L_{32})_{n32}$

Formula 3A

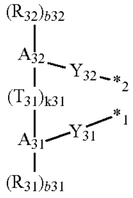

Formula 3B

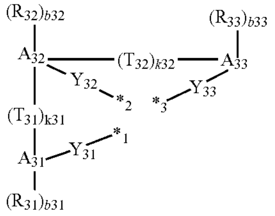

Formula 3C

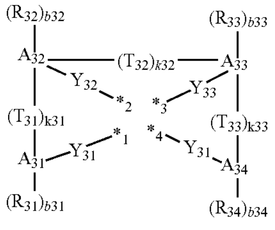

Formula 3D

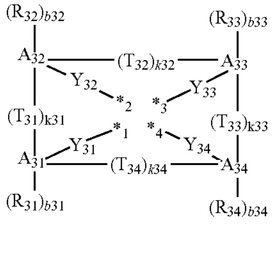

-continued

Formula 4

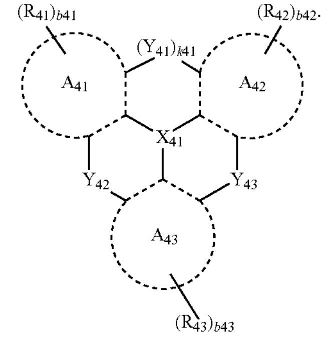

In Formulae 1, 3, 4, and 10, $X_{11}$ may be selected from O, S, $N(R_{19})$, and $C(R_{19})(R_{20})$, $R_{11}$ to $R_{20}$ may each independently be selected from:

a group represented by $*-(L_{11})_{a11}-A_{11}$, hydrogen, deuterium, a $C_1$-$C_{60}$ alkyl group, a π electron-depleted nitrogen-free cyclic group, $—C(Q_1)(Q_2)(Q_3)$, $—Si(Q_1)(Q_2)(Q_3)$, $—B(Q_1)(Q_2)$, and $—N(Q_1)(Q_2)$;

a π electron-depleted nitrogen-free cyclic group substituted with at least one selected from deuterium, a $C_1$-$C_{60}$ alkyl group, a π electron-depleted nitrogen-free cyclic group, $—C(Q_{31})(Q_{32})(Q_{33})$, $—Si(Q_{31})(Q_{32})(Q_{33})$, $—B(Q_{31})(Q_{32})$, and $—N(Q_{31})(Q_{32})$; and a π electron-depleted nitrogen-free cyclic group substituted with a π electron-depleted nitrogen-free cyclic group substituted with at least one selected from deuterium, a $C_1$-$C_{60}$ alkyl group, a π electron-depleted nitrogen-free cyclic group, $—C(Q_{21})(Q_{22})(Q_{23})$, $—Si(Q_{21})(Q_{22})(Q_{23})$, $—B(Q_{21})(Q_{22})$, and $—N(Q_{21})(Q_{22})$, $L_{11}$ may be selected from:

a π electron-depleted nitrogen-free cyclic group, $—C(Q_1)(Q_2)-$, $—Si(Q_1)(Q_2)-$, $—B(Q_1)-$, and $—N(Q_1)-$; and a π electron-depleted nitrogen-free cyclic group substituted with at least one selected from deuterium, a $C_1$-$C_{60}$ alkyl group, a π electron-depleted nitrogen-free cyclic group, $—C(Q_{31})(Q_{32})(Q_{33})$, $—Si(Q_{31})(Q_{32})(Q_{33})$, $—B(Q_{31})(Q_{32})$, and $—N(Q_{31})(Q_{32})$, a11 may be selected from 1, 2, and 3, $A_{11}$ may be selected from:

a π electron-depleted nitrogen-free cyclic group;

a π electron-depleted nitrogen-free cyclic group substituted with at least one selected from deuterium, a $C_1$-$C_{60}$ alkyl group, a π electron-depleted nitrogen-free cyclic group, $—C(Q_{31})(Q_{32})(Q_{33})$, $—Si(Q_{31})(Q_{32})(Q_{33})$, $—B(Q_{31})(Q_{32})$, and $—N(Q_{31})(Q_{32})$; and a π electron-depleted nitrogen-free cyclic group substituted with a π electron-depleted nitrogen-free cyclic group substituted with at least one selected from deuterium, a $C_1$-$C_{60}$ alkyl group, a π electron-depleted nitrogen-free cyclic group, $—C(Q_{21})(Q_{22})(Q_{23})$, $—Si(Q_{21})(Q_{22})(Q_{23})$, $—B(Q_{21})(Q_{22})$, and $—N(Q_{21})(Q_{22})$, $L_{101}$ to $L_{103}$ may each independently be selected from a substituted or unsubstituted $C_5$-$C_{30}$ carbocyclic group and a substituted or unsubstituted $C_1$-$C_{30}$ heterocyclic group, a101 to a103 may each independently be selected from 0, 1, and 2, and $R_{101}$ to $R_{103}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$C(Q_1)(Q_2)(Q_3)$, —$Si(Q_1)(Q_2)(Q_3)$, —$B(Q_1)(Q_2)$, —$N(Q_1)(Q_2)$, —$P(Q_1)(Q_2)$, —$C(=O)(Q_1)$, —$S(=O)(Q_1)$, —$S(=O)_2(Q_1)$, —$P(=O)(Q_1)(Q_2)$, and —$P(=S)(Q_1)(Q_2)$, $M_{31}$ may be selected from transition metals of Period 4, Period 5, and Period 6 of the Periodic Table of Elements, $L_{31}$ may be a ligand represented by one selected from Formulae 3A to 3D, $L_{32}$ may be selected from a monodentate ligand, a bidentate ligand, and a tridentate ligand, n31 may be 1 or 2, n32 may be selected from 0, 1, 2, 3, and 4, $A_{31}$ to $A_{34}$ may each independently be selected from a $C_5$-$C_{30}$ carbocyclic group and a $C_1$-$C_{30}$ heterocyclic group, $T_{31}$ to $T_{34}$ may each independently be selected from a single bond, a double bond, *—O—*', *—S—*', *—C(=O)—*', *—S(=O)—*', *—$C(R_{35})(R_{36})$—*', *—$C(R_{35})=C(R_{36})$—*', *—$C(R_{35})$=*', *—$Si(R_{35})(R_{36})$—*', *—$B(R_{35})$—*', *—$N(R_{35})$—*', and *—$P(R_{35})$—*', k31 to k34 may each independently be selected from 1, 2, and 3, $Y_{31}$ to $Y_{34}$ may each independently be selected from a single bond, *—O—*', *—S—*', *—$C(R_{37})(R_{38})$—*', *—$Si(R_{37})(R_{38})$—*', *—$B(R_{37})$—*', *—$N(R_{37})$—*', and *—$P(R_{37})$—*', $*_1$, $*_2$, $*_3$, and $*_4$ each indicate a binding site to $M_{31}$, $R_{31}$ to $R_{38}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$C(Q_1)(Q_2)(Q_3)$, —$Si(Q_1)(Q_2)(Q_3)$, —$B(Q_1)(Q_2)$, —$N(Q_1)(Q_2)$, —$P(Q_1)(Q_2)$, —$C(=O)(Q_1)$, —$S(=O)(Q_1)$, —$S(=O)_2(Q_1)$, —$P(=O)(Q_1)(Q_2)$, and —$P(=S)(Q_1)(Q_2)$, wherein $R_{31}$ to $R_{38}$ are optionally linked to each other to form a substituted or unsubstituted $C_5$-$C_{60}$ carbocyclic group and/or a substituted or unsubstituted $C_1$-$C_{60}$ heterocyclic group, b31 to b34 may each independently be an integer from 0 to 10, $X_{41}$ may be N, B, P(=)($R_{44}$), or P(=S)($R_{44}$), $Y_{41}$ to $Y_{43}$ may each independently be O, S, $N(R_{45})$, $B(R_{45})$, $C(R_{45})(R_{46})$, or $Si(R_{45})(R_{46})$, k41 may be 0 or 1, wherein, when k41 is 0, —$(Y_{41})_{k41}$— is not present, $A_{41}$ to $A_{43}$ may each independently be selected from a $C_5$-$C_{30}$ carbocyclic group and a $C_1$-$C_{30}$ heterocyclic group, $R_{41}$ to $R_{46}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$C(Q_1)(Q_2)(Q_3)$, —$Si(Q_1)(Q_2)(Q_3)$, —$B(Q_1)(Q_2)$, —$N(Q_1)(Q_2)$, —$P(Q_1)(Q_2)$, —$C(=O)(Q_1)$, —$S(=O)(Q_1)$, —$S(=O)_2(Q_1)$, —$P(=O)(Q_1)(Q_2)$, and —$P(=S)(Q_1)(Q_2)$, wherein $R_{41}$ to $R_{46}$ may optionally be linked to each other to form a substituted or unsubstituted $C_5$-$C_{30}$ carbocyclic group and/or a substituted or unsubstituted $C_1$-$C_{30}$ heterocyclic group, b41 to b43 may each independently be an integer from 0 to 10, and $Q_1$ to $Q_3$, $Q_{21}$ to $Q_{23}$, and $Q_{31}$ to $Q_{33}$ may each be independently selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a biphenyl group, and a terphenyl group.

For example, at least one selected from $R_{11}$ to $R_{19}$ in Formula 1 may be a group represented by *-$(L_{11})_{a11}$-$A_{11}$.

For example, $X_{11}$ Formula 1 may be $N(R_{19})$.

For example, $R_{11}$ to $R_{20}$ in Formula 1 may each independently be selected from:

a group represented by *-$(L_{11})_{a11}$-$A_{11}$, hydrogen, deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, —$C(Q_1)(Q_2)(Q_3)$, —$Si(Q_1)(Q_2)(Q_3)$, —$B(Q_1)(Q_2)$, and —$N(Q_1)(Q_2)$;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group, each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, —$C(Q_{31})(Q_{32})(Q_{33})$, —$Si(Q_{31})(Q_{32})(Q_{33})$, —$B(Q_{31})(Q_{32})$, and —$N(Q_{31})(Q_{32})$; and a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group, each substituted with at least one selected from a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group, that are each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, —$C(Q_{21})(Q_{22})(Q_{23})$, —$Si(Q_{21})(Q_{22})(Q_{23})$, —$B(Q_{21})(Q_{22})$, and —$N(Q_{21})(Q_{22})$.

For example, $L_{11}$ in Formula 1 may be selected from:

a benzene group, a naphthalene group, a phenalene group, an anthracene group, a fluoranthene group, a triphenylene group, a phenanthrene group, a pyrene group, a chrysene group, a perylene group, a fluorene group, a carbazole group, a dibenzofuran group, a dibenzothiophene group, —$C(Q_1)(Q_2)$-, and —$Si(Q_1)(Q_2)$-; and a benzene group, a naphthalene group, a phenalene group, an anthracene group, a fluoranthene group, a triphenylene group, a phenanthrene group, a pyrene group, a chrysene group, a perylene group, a fluorene group, a carbazole group, a dibenzofuran group, and a dibenzothiophene group, each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, —$C(Q_{31})(Q_{32})(Q_{33})$, and —$Si(Q_{31})(Q_{32})(Q_{33})$.

In one embodiment, $L_{11}$ in Formula 1 may be selected from:

a benzene group, a fluorene group, a carbazole group, a dibenzofuran group, and a dibenzothiophene group, —$C(Q_1)(Q_2)$-, and —$Si(Q_1)(Q_2)$-; and a benzene group, a fluorene group, a carbazole group, a dibenzofuran group, and a dibenzothiophene group, each substituted with at least one selected from deuterium, a $C_1$-$C_{20}$ alkyl group, a phenyl group, a biphenyl group, a terphenyl group, a fluorenyl group, a carbazolyl group, a dibenzofuranyl group, a dibenzothiophenyl group, —$C(Q_{31})(Q_{32})(Q_{33})$, and —$Si(Q_{31})(Q_{32})(Q_{33})$.

For example, a11 in Formula 1 may be 1 or 2.

For example, $A_{11}$ in Formula 1 may be selected from:

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group, each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, —$C(Q_{31})(Q_{32})(Q_{33})$, —$Si(Q_{31})(Q_{32})(Q_{33})$, —$B(Q_{31})(Q_{32})$, and —$N(Q_{31})(Q_{32})$; and a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group, each substituted with at least one selected from a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, and a dinaphthothiophenyl group, that are each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, —$C(Q_{21})(Q_{22})(Q_{23})$, —$Si(Q_{21})(Q_{22})(Q_{23})$, —$B(Q_{21})(Q_{22})$, and —$N(Q_{21})(Q_{22})$.

In one embodiment, $A_{11}$ in Formula 1 may be selected from:

a phenyl group, a biphenyl group, a terphenyl group, a fluorenyl group, a carbazolyl group, a dibenzofuranyl group, and a dibenzothiophenyl group;

a phenyl group, a biphenyl group, a terphenyl group, a fluorenyl group, a carbazolyl group, a dibenzofuranyl group, and a dibenzothiophenyl group, each substituted with at least one selected from deuterium, a $C_1$-$C_{20}$ alkyl group, a phenyl group, a biphenyl group, a terphenyl group, a fluorenyl group, a carbazolyl group, a dibenzofuranyl group, a dibenzothiophenyl group, —$C(Q_{31})(Q_{32})(Q_{33})$, and —$Si(Q_{31})(Q_{32})(Q_{33})$; and a phenyl group, a biphenyl group, a terphenyl group, a fluorenyl group, a carbazolyl group, a dibenzofuranyl group, and a dibenzothiophenyl group, each substituted with at least one selected from a phenyl group, a biphenyl group, a terphenyl group, a fluorenyl group, a carbazolyl group, a dibenzofuranyl group, and a dibenzothiophenyl group, that are each substituted with at least one selected from deuterium, a $C_1$-$C_{20}$ alkyl group, a phenyl group, a biphenyl group, a terphenyl group, a fluorenyl group, a carbazolyl group, a dibenzofuranyl group, a dibenzothiophenyl group, —$C(Q_{21})(Q_{22})(Q_{23})$, and —$Si(Q_{21})(Q_{22})(Q_{23})$.

In one or more embodiments, $A_{11}$ in Formula 1 may be represented by one of Formulae 8-1 to 8-5 below:

8-1

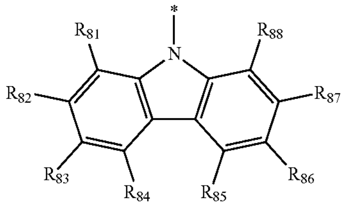

8-2

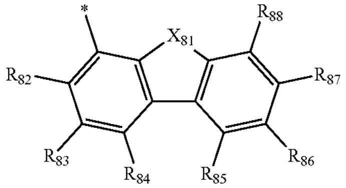

8-3

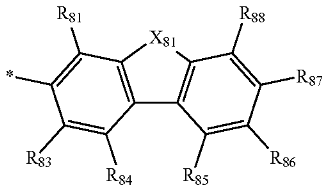

8-4

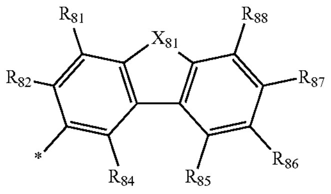

-continued 8-5

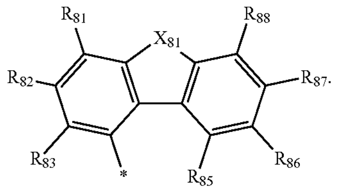

In Formulae 8-1 to 8-5, $X_{81}$ may be selected from O, S, $N(R_{89})$, and $C(R_{89})(R_{90})$, $R_{81}$ to $R_{90}$ may each independently be selected from hydrogen, deuterium, a $C_1$-$C_{20}$ alkyl group, a phenyl group, a biphenyl group, a terphenyl group, a fluorenyl group, a carbazolyl group, a dibenzofuranyl group, and a dibenzothiophenyl group, and

* indicates a binding site to a neighboring atom.

In one embodiment, the first compound may be represented by one of Formulae 1-1 to 1-5 below:

1-1

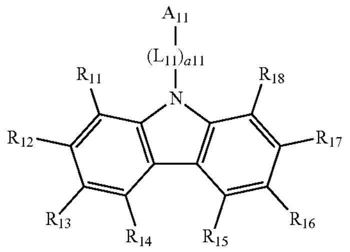

1-2

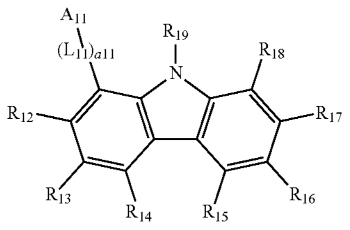

1-3

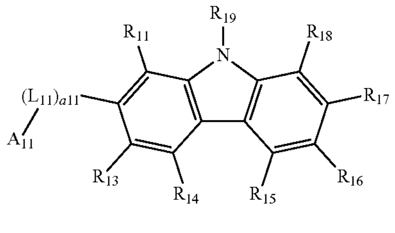

1-4

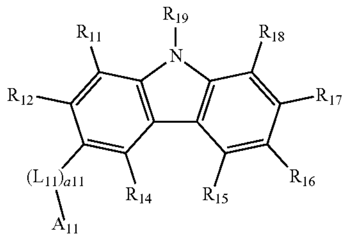

-continued 1-5

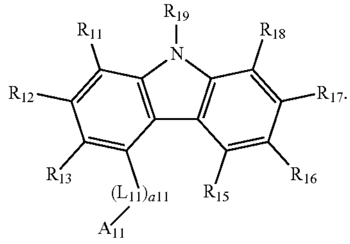

In Formulae 1-1 to 1-5, $L_{11}$, a11, $A_{11}$, and $R_{11}$ to $R_{19}$ may each be understood by referring to the corresponding descriptions provided in connection with Formula 1.

For example, $A_{11}$ in Formulae 1-1 to 1-5 may be represented by one of Formulae 8-1 to 8-5 below:

8-1

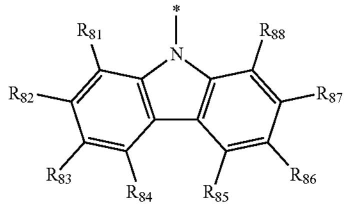

8-2

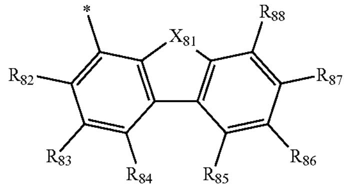

8-3

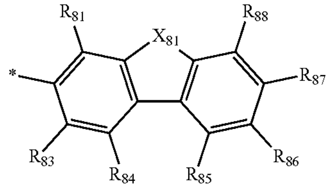

8-4

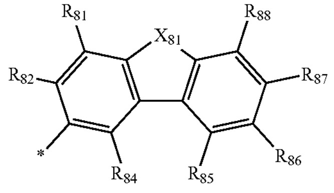

8-5

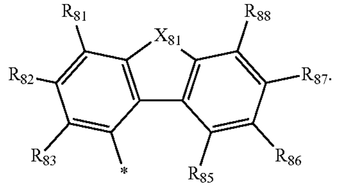

In Formulae 8-1 to 8-5, $X_{81}$ may be selected from O, S, $N(R_{89})$, and $C(R_{89})(R_{90})$, $R_{81}$ to $R_{90}$ may each independently be selected from hydrogen, deuterium, a $C_1$-$C_{20}$ alkyl group, a phenyl group, a biphenyl group, a terphenyl group, a fluorenyl group, a carbazolyl group, a dibenzofuranyl group, and a dibenzothiophenyl group, and

* indicates a binding site to a neighboring atom.

For example, $L_{101}$ to $L_{103}$ in Formula 10 may each independently be selected from:

a benzene group, a naphthalene group, a phenalene group, an anthracene group, a fluoranthene group, a triphenylene group, a phenanthrene group, a pyrene group, a chrysene group, a perylene group, a pyridine group, a pyrimidine group, a pyrazine group, a pyridazine group, a triazine group, a quinoline group, an isoquinoline group, a benzoquinoline group, a benzoisoquinoline group, a phthalazine group, a naphthyridine group, a quinoxaline group, a benzoquinoxaline group, a quinazoline group, a benzoquinazoline group, a fluorene group, a carbazole group, a dibenzofuran group, and a dibenzothiophene group; and a benzene group, a naphthalene group, a phenalene group, an anthracene group, a fluoranthene group, a triphenylene group, a phenanthrene group, a pyrene group, a chrysene group, a perylene group, a pyridine group, a pyrimidine group, a pyrazine group, a pyridazine group, a triazine group, a quinoline group, an isoquinoline group, a benzoquinoline group, a benzoisoquinoline group, a phthalazine group, a naphthyridine group, a quinoxaline group, a benzoquinoxaline group, a quinazoline group, a benzoquinazoline group, a fluorene group, a carbazole group, a dibenzofuran group, and a dibenzothiophene group, each substituted with at least one selected from deuterium, —F, a cyano group, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, an indeno fluorenyl group, an indolofluorenyl group, a benzofurofluorenyl group, a benzothienofluorenyl group, an indeno carbazolyl group, an indolocarbazolyl group, a benzofurocarbazolyl group, a benzothienocarbazolyl group, an indenodibenzofuranyl group, an indolodibenzofuranyl group, a benzofurodibenzofuranyl group, a benzothienodibenzofuranyl group, an indenodibenzothiophenyl group, an indolodibenzothiophenyl group, a benzofurodibenzothiophenyl group, a benzothienodibenzothiophenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazfluorenyl group, a diazcarbazolyl group, a diazadibenzofuranyl group, and a diazadibenzothiophenyl group.

For example, a101 to a103 in Formula 10 may each independently be 0 or 1.

For example, $R_{101}$ to $R_{103}$ in Formula 10 may each independently be selected from:

a phenyl group, a biphenyl group, a naphthyl group, a phenalenyl group, an anthracenyl group, a phenanthrenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a phthalazinyl group, a naphthyridinyl group, a quinoxalinyl group, a quinazolinyl group, a benzoquinoxalinyl group, a benzoquinazolinyl group, a fluorenyl group, a carbazolyl group, a dibenzofuranyl group, a dibenzothiophenyl group, an azafluorenyl group, an azacarbazolyl group, an azadibenzofuranyl group, an azadibenzothiophenyl group, a diazfluorenyl group, a diazcarbazolyl group, a diazadibenzofuranyl group, and a diazadibenzothiophenyl group, each unsubstituted or substituted with at least one selected from deuterium, —F, —Cl, —Br, —I, a hydroxyl group, a cyano group, a nitro group, an amidino group, a hydrazine group, a hydrazone group, a $C_1$-$C_{10}$ alkyl group, a $C_1$-$C_{10}$ alkoxy group, a phenyl group, a biphenyl group, a naphthyl group, a phenalenyl group, an anthracenyl group, a phenanthrenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a phthalazinyl group, a naphthyridinyl group, a quinoxalinyl group, a quinazolinyl group, a benzoquinoxalinyl group, a benzoquinazolinyl group, a fluorenyl group, a carbazolyl group, a dibenzofuranyl group, a dibenzothiophenyl group, an azafluorenyl group, an azacarbazolyl group, an azadibenzofuranyl group, an azadibenzothiophenyl group, a diazfluorenyl group, a diazcarbazolyl group, a diazadibenzofuranyl group, a diazadibenzothiophenyl group, —$C(Q_{31})(Q_{32})(Q_{33})$, —$Si(Q_{31})(Q_{32})(Q_{33})$, —$B(Q_{31})(Q_{32})$, —$N(Q_{31})(Q_{32})$, —$P(Q_{31})(Q_{32})$, —$C(=O)(Q_{31})$, —$S(=O)(Q_{31})$, —$S(=O)_2(Q_{31})$, —$P(=O)(Q_{31})(Q_{32})$, and —$P(=S)(Q_{31})(Q_{32})$; and —$C(Q_1)(Q_2)(Q_3)$, —$Si(Q_1)(Q_2)(Q_3)$, —$B(Q_1)(Q_2)$, —$N(Q_1)(Q_2)$, —$P(Q_1)(Q_2)$, —$C(=O)(Q_1)$, —$S(=O)(Q_1)$, —$S(=O)_2(Q_1)$, —$P(=O)(Q_1)(Q_2)$, and —$P(=S)(Q_1)(Q_2)$, wherein $Q_1$ to $Q_3$ and $Q_{31}$ to $Q_{33}$ may each independently be selected from a phenyl group, a biphenyl group, a naphthyl group, a phenalenyl group, an anthracenyl group, a phenanthrenyl group, a pyridinyl group, a pyrazinyl group, a pyridazinyl group, a pyrimidinyl group, a triazinyl group, a quinolinyl group, an isoquinolinyl group, a benzoquinolinyl group, a benzoisoquinolinyl group, a phthalazinyl group, a naphthyridinyl group, a quinoxalinyl group, a quinazolinyl group, a benzoquinoxalinyl group, a benzoquinazolinyl group, a fluorenyl group, a carbazolyl group, a dibenzofuranyl group, a dibenzothiophenyl group, an azafluorenyl group, an azacarbazolyl group, an azadibenzofuranyl group, an azadibenzothiophenyl group, a diazfluorenyl group, a diazcarbazolyl group, a diazadibenzofuranyl group, and a diazadibenzothiophenyl group.

In one embodiment, $R_{101}$ to $R_{103}$ in Formula 10 may each independently be selected from:

a phenyl group, a biphenyl group, a naphthyl group, a phenalenyl group, an anthracenyl group, a phenanthrenyl group, a fluorenyl group, a carbazolyl group, a dibenzofuranyl group, and a dibenzothiophenyl group, each unsubstituted or substituted with at least one selected from deuterium, a $C_1$-$C_{10}$ alkyl group, a phenyl group, a biphenyl group, a naphthyl group, a phenalenyl group, an anthracenyl group, a phenanthrenyl group, a fluorenyl group, a carbazolyl group, a dibenzofuranyl group, a dibenzothiophenyl group, —$C(Q_{31})(Q_{32})(Q_{33})$, and —$Si(Q_{31})(Q_{32})(Q_{33})$; and —$C(Q_1)(Q_2)(Q_3)$ and —$Si(Q_1)(Q_2)(Q_3)$, and $Q_1$ to $Q_3$ and $Q_{31}$ to $Q_{33}$ may each independently be selected from a phenyl group, a biphenyl group, a naphthyl group, a phenalenyl group, an anthracenyl group, a phenanthrenyl group, a fluorenyl group, a carbazolyl group, a dibenzofuranyl group, and a dibenzothiophenyl group.

In one embodiment, at least one selected from $R_{101}$ to $R_{103}$ Formula 10 may be selected from a group represented by Formula 11-1, a group represented by Formula 11-2, —$C(Q_1)(Q_2)(Q_3)$, and —$Si(Q_1)(Q_2)(Q_3)$:

Formula 11-1

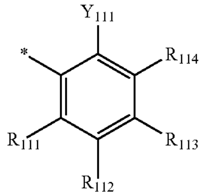

Formula 11-2

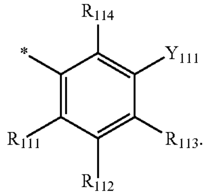

In Formulae 11-1 and 11-2, $Y_{111}$ may be selected from a phenyl group, a biphenyl group, a naphthyl group, a phenalenyl group, an anthracenyl group, a phenanthrenyl group, a fluorenyl group, a carbazolyl group, a dibenzofuranyl group, a dibenzothiophenyl group, —$C(Q_{31})(Q_{32})(Q_{33})$, and —$Si(Q_{31})(Q_{32})(Q_{33})$, and $R_{111}$ to $R_{113}$ may each independently be selected from hydrogen, deuterium, a $C_1$-$C_{10}$ alkyl group, a phenyl group, a biphenyl group, a naphthyl group, a phenalenyl group, an anthracenyl group, a phenanthrenyl group, a fluorenyl group, a carbazolyl group, a dibenzofuranyl group, a dibenzothiophenyl group, —$C(Q_{31})(Q_{32})(Q_{33})$, and —$Si(Q_{31})(Q_{32})(Q_{33})$, $Q_1$ to $Q_3$ and $Q_{31}$ to $Q_{33}$ may each independently be selected from a phenyl group, a biphenyl group, a naphthyl group, a phenalenyl group, an anthracenyl group, a phenanthrenyl group, a fluorenyl group, a carbazolyl group, a dibenzofuranyl group, and a dibenzothiophenyl group, and

* indicates a binding site to a neighboring atom.

For example, $M_{31}$ in Formula 3 may be selected from platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), and thulium (Tm).

In one embodiment, $M_{31}$ in Formula 3 may be selected from Pt and Ir.

For example, $A_{31}$ to $A_{34}$ in Formulae 3A to 3D may each independently be i) a first ring, ii) a second ring, iii) a condensed ring in which two or more first rings are condensed with each other, iv) a condensed ring in which two or more second rings are condensed with each other, and/or v) a condensed ring in which one or more first rings and one or more second rings are condensed with each other, wherein the first ring may be selected from a cyclopentane group, a cyclopentene group, a cyclopentadiene group, a furan group, a thiophene group, a pyrrole group, a borole group, a phosphole group, a silole group, a germole group, a selenophene group, an oxazole group, a dihydroxazole group, an isoxazole group, a dihydroisoxazole group, an oxadiazole group, a dihydroxadiazole group, an isozadiazole group, a dihydroisozadiazole group, an oxatriazole group, a dihydroxatriazole group, an isoxatriazole group, a dihydroisoxatriazole group, a thiazole group, a dihydrothiazole group, an isothiazole group, a dihydroisothiazole group, a thiadiazole group, a dihydrothiadiazole group, an isothiadiazole group, a dihydroisothiadiazole group, a thiatriazole group, a dihydrothiatriazole group, an isothiatriazole group, a dihydroisothiatriazole group, a pyrazole group, a dihydropyrazole group, an imidazole group, a dihydroimidazole group, a triazole group, a dihydrotriazole group, a tetrazole group, a dihydrotetrazole group, an azasilole group, a diazasilole group, and a triazasilole group, and the second ring may be selected from a cyclohexane group, a cyclohexene group, a cyclohexadiene group, an admantane group, a norbornane group, a norbornene group, a benzene group, a pyridine group, a dihydropyridine group, a tetrahydropyridine group, a pyrimidine group, a dihydropyrimidine group, a tetrahydropyrimidine group, a pyrazine group, a dihydropyrazine group, a tetrahydropyrazine group, a pyridazine group, a dihydropyridazine group, a tetrahydropyridazine group, and a triazine group.

In one embodiment, $A_{31}$ to $A_{34}$ in Formulae 3A to 3D may each independently be selected from a benzene group, a naphthalene group, an anthracene group, a phenanthrene group, a triphenylene group, a pyrene group, a chrysene group, a furan group, a thiophene group, a silole group, an indene group, a fluorene group, a benzofuran group, a dibenzofuran group, a benzothiophene group, a dibenzothiophene group, a benzosilole group, a dibenzosilole group, an indole group, a carbazole group, an indenopyridine group, an indolopyridine group, a benzofuropyridine group, a benzothienopyridine group, a benzosilolopyridine group, an indenopyrimidine group, an indolopyrimidine group, a benzofuropyrimidine group, a benzothienopyrimidine group, a benzosilolopyrimidine group, a pyridine group, a pyrimidine group, a pyrazine group, a pyridazine group, a triazine group, a quinoline group, an isoquinoline group, a quinoxaline group, a quinazoline group, a cinnoline group, a phthalazine group, a phenanthroline group, a pyrrole group, a pyrazole group, an imidazole group, a dihydroimidazole group, a triazole group, a dihydrotriazole group, an oxazole group, a dihydroxazole group, an isoxazole group, a thiazole group, a dihydrothiazole group, an isothiazole group, an oxadiazole group, a dihydroxadiazole group, a thiadiazole group, a dihydrothiadiazole group, a benzopyrazole group, a benzimidazole group, a dihydrobenzimidazole group, an imidazopyridine group, an imidazopyrimidine group, an imidazopyrazine group, a benzoxazole group, a dihydrobenzoxazole group, a benzothiazole group, a dihydrobenzothiazole group, a benzoxadiazole group, a dihydrobenzoxadiazole group, a benzothiadiazole group, and a dihydrobenzothiadiazole group.

For example, $T_{31}$ to $T_{34}$ in Formulae 3A to 3D may each independently be selected from a single bond, a double bond, *—O—*', *—S—*', *—C($R_{35}$)($R_{36}$)—*', and *—N($R_{35}$)—*'.

For example, $Y_{31}$ to $Y_{34}$ in Formulae 3A to 3D may each independently be selected from a single bond, *—O—*', and *—S—*'.

For example, $R_{31}$ to $R_{38}$ in Formulae 3A to 3D may each independently be selected from:

hydrogen, deuterium, —F, —Cl, —Br, —I, a cyano group, a $C_1$-$C_{20}$ alkyl group, and a $C_1$-$C_{20}$ alkoxy group;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a quinolinyl group, an isoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group; and a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a quinolinyl group, an isoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group, each substituted with at least one selected from deuterium, —F, —Cl, —Br, —I, a cyano group, a $C_1$-$C_{20}$ alkyl group, a $C_1$-$C_{20}$ alkoxy group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a quinolinyl group, an isoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group; and —B($Q_1$)($Q_2$) and —N($Q_1$)($Q_2$), and $Q_1$ and $Q_2$ may each independently be selected from:

hydrogen, deuterium, and a $C_1$-$C_{20}$ alkyl group;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a quinolinyl group, an isoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group; and a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a quinolinyl group, an isoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group, each substituted with at least one selected from deuterium, a $C_1$-$C_{20}$ alkyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, a dibenzothiophenyl group, a benzofluorenyl group, a benzocarbazolyl group, a benzonaphthofuranyl group, a benzonaphthothiophenyl group, a dibenzofluorenyl group, a dibenzocarbazolyl group, a dinaphthofuranyl group, a dinaphthothiophenyl group, a pyridinyl group, a pyrazinyl group, a pyridazinyl group, a pyrimidinyl group, a triazinyl group, a quinolinyl group, an isoquinolinyl group, a quinolinyl group, an isoquinolinyl group, a naphthyridinyl group, a quinoxalinyl group, a quinazolinyl group, an azafluorenyl group, an azacarbazolyl group, an azadibenzofuranyl group, an azadibenzothiophenyl group, a diazafluorenyl group, a diazacarbazolyl group, a diazadibenzofuranyl group, and a diazadibenzothiophenyl group.

In one embodiment, $R_{31}$ to $R_{38}$ in Formulae 3A to 3D may each independently be selected from:

hydrogen, deuterium, —F, —Cl, —Br, —I, a cyano group, a methyl group, an ethyl group, an n-propyl group, an isopropyl group, an n-butyl group, an isobutyl group, a sec-butyl group, a tert-butyl group, a methoxy group, an ethoxy group, a propoxy group and butoxy group;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, and a dibenzothiophenyl group; and a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, and a dibenzothiophenyl group, each substituted with at least one selected from deuterium, —F, —Cl, —Br, —I, a cyano group, a methyl group, an ethyl group, an n-propyl group, an isopropyl group, an n-butyl group, an isobutyl group, a sec-butyl group, a tert-butyl group, a methoxy group, an ethoxy group, a propoxy group, a butoxy group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, and a dibenzothiophenyl group; and —$B(Q_1)(Q_2)$ and —$N(Q_1)(Q_2)$, and $Q_1$ and $Q_2$ may each independently be selected from: hydrogen, deuterium, a methyl group, an ethyl group, an n-propyl group, an isopropyl group, an n-butyl group, an isobutyl group, a sec-butyl group, and a tert-butyl group;

a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, and a dibenzothiophenyl group; and a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, and a dibenzothiophenyl group, each substituted with at least one selected from deuterium, a methyl group, an ethyl group, an n-propyl group, an isopropyl group, an n-butyl group, an isobutyl group, a sec-butyl group, a tert-butyl group, a phenyl group, a biphenyl group, a terphenyl group, a naphthyl group, a phenanthrenyl group, a triphenylenyl group, a chrysenyl group, a fluoranthenyl group, a fluorenyl group, a carbazolyl group, a dibenzofuranyl group, and a dibenzothiophenyl group.

In one embodiment, the third compound may be represented by one selected from Formulae 3-1 and 3-2 below:

Formula 3-1

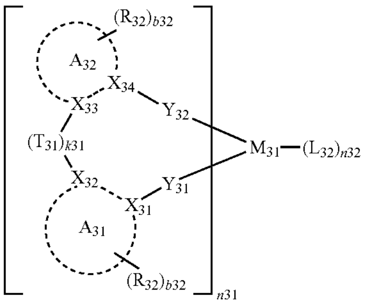

Formula 3-2

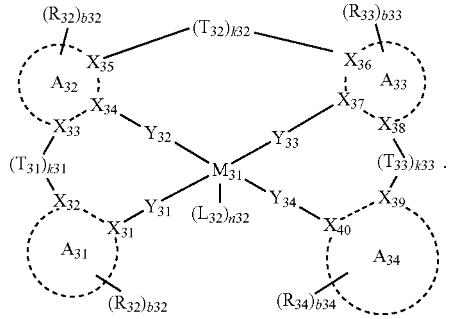

In Formulae 3-1 and 3-2, $X_{31}$ to $X_{40}$ may each independently be selected from N and C, and the remaining components may each be understood by referring to the corresponding descriptions thereof provided herein.

In Formulae 3-1 and 3-2, $X_{31}$ and $X_{32}$ may each independently be a member of ring $A_{31}$, and $X_{33}$ to $X_{40}$ may be also understood by referring to descriptions provided in connection with Formulae 3-1 and 3-2, $X_{31}$, and $X_{32}$.

For example, $X_{41}$ in Formula 4 may be selected from N and B.

For example, $Y_{41}$ to $Y_{43}$ in Formula 4 may each independently be selected from O, S, $N(R_{45})$, and $B(R_{45})$.

For example, $A_{41}$ to $A_{43}$ in Formula 4 may each independently be selected from a benzene group, a naphthalene group, a phenanthrene group, an anthracene group, a triphenylene group, a pyrene group, a chrysene group, a pyridine group, a pyrazine group, a pyrimidine group, a triazine group, a quinoline group, an isoquinoline group, a benzoquinoline group, a benzoisoquinoline group, a 2,6-naphthyridine group, a 1,8-naphthyridine group, a 1,5-naphthyridine group, a 1,6-naphthyridine group, a 1,7-naphthyridine group, a 2,7-naphthyridine group, a quinoxaline group, a quinazoline group, a phenanthridine group, a phenanthroline group, a benzofuran group, a benzothiophene group, an indene group, an indole group, a furopyridine group, a thienopyridine group, a cyclopentapyridine group, a pyrrolopyridine group, a dibenzofuran group, a dibenzothiophene group, a fluorene group, a carbazole group, a benzonaphthofuran group, a benzonaphthothiophene group, a benzofluorene group, a benzocarbazole group, a dinaphthofuran group, a dinaphthothiophene group, a dibenzofluorene group, a dibenzocarbazole group, a benzoxazole group, a benzothiazole group, a benzimidazole group, a naphthofuran, a naphthothiophene, a spiro-bifluorene group, and a spiro-fluorene-indene group; and a group represented by Formula 4A below:

Formula 4A

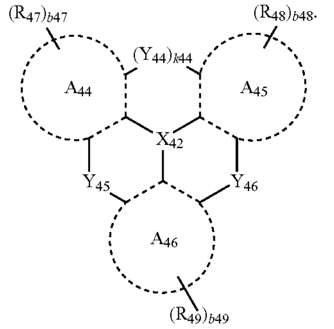

In Formula 4A, $X_{42}$ may be understood by referring to the description provided in connection with $X_{41}$ in Formula 4, $Y_{44}$ to $Y_{46}$ may each be understood by referring to the description provided in connection with $Y_{41}$ to $Y_{43}$ in Formula 4, k44 may be understood by referring to the description provided in connection with k41 in Formula 4, $A_{44}$ to $A_{46}$ may each be understood by referring to the description provided in connection with $A_{41}$ to $A_{43}$ in Formula 4, $R_{47}$ to $R_{49}$ may each be understood by referring to the description provided in connection with $R_{41}$ in Formula 4, and b47 to b49 may each be understood by referring to the description provided in connection with b41 in Formula 4.

For example, $R_{41}$ to $R_{46}$ in Formula 4 may be understood by referring to the description provided in connection with $R_{31}$.

In one embodiment, the fourth compound may be represented by Formula 4-1 below:

Formula 4-1

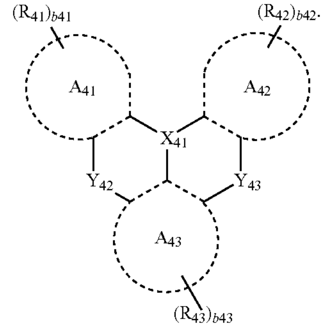

In Formula 4-1, each component may be understood by referring to the corresponding description thereof provided herein.

In one or more embodiments, the fourth compound may be represented by Formula 4-11 or Formula 4-12 below:

Formula 4-11

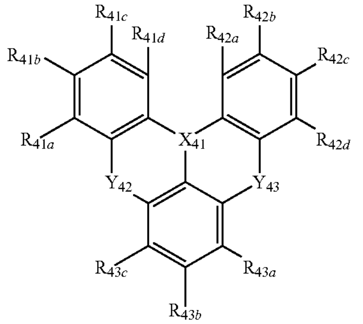

Formula 4-12

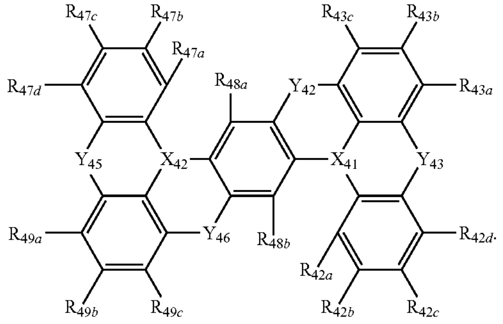

In Formulae 4-11 and 4-12, $R_{41a}$ to $R_{41d}$, $R_{42a}$ to $R_{42d}$, $R_{43a}$ to $R_{43c}$, $R_{47a}$ to $R_{47d}$, $R_{48a}$, $R_{48b}$, and $R_{49a}$ to $R_{49c}$ may each be understood by referring to the description provided in connection with $R_{41}$ in Formula 4, and the remaining components may each be understood by referring to the corresponding descriptions thereof provided herein.

In one embodiment, the first compound may be selected from compounds of Group I, the second compound may be selected from compounds of Group II, the third compound may be selected from compounds of Group III-I and Group III-II, and the fourth compound may be selected from compounds of Group IV:

Group I
HT-01
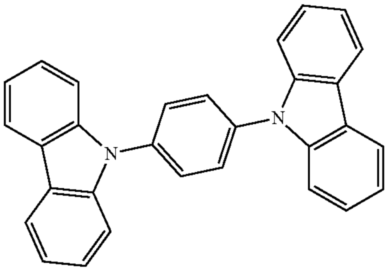
HT-02
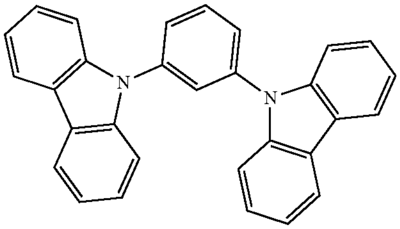
HT-03
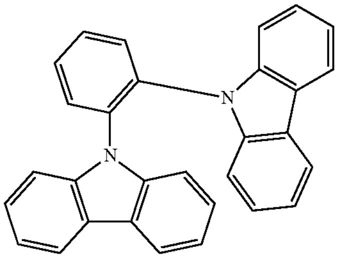
HT-04
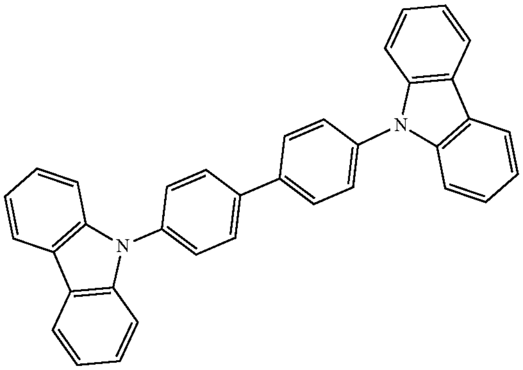
HT-05
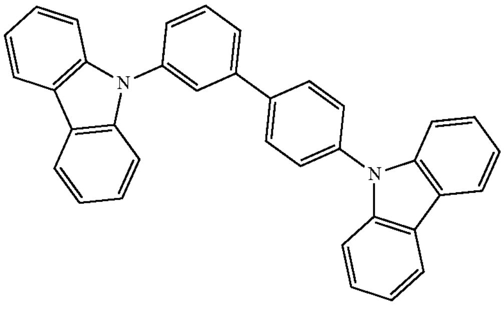
-continued
HT-06
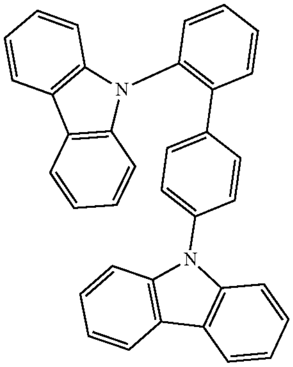
HT-07
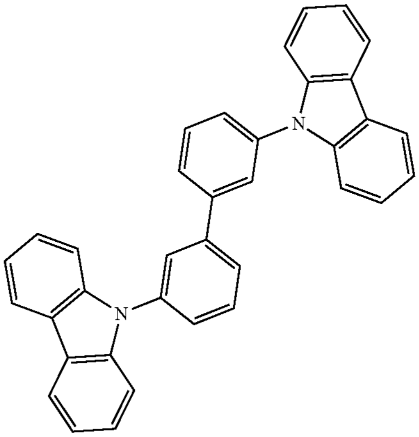
HT-08
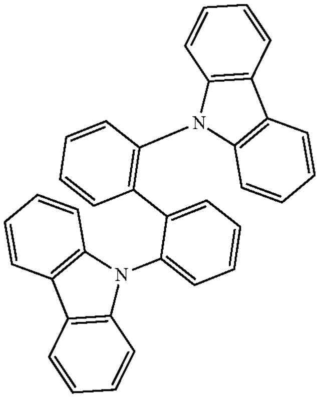
HT-09
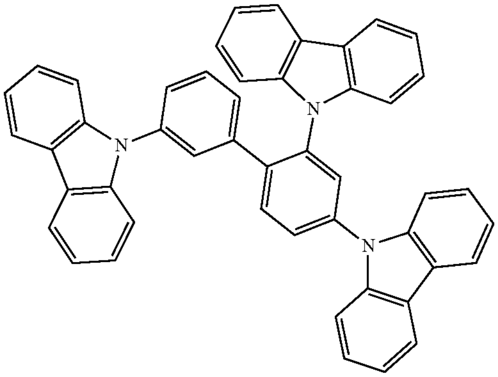

Group II
ET-01
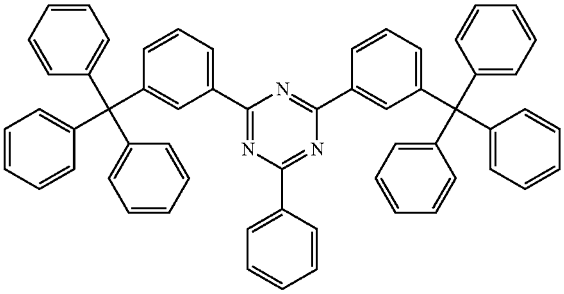
ET-02
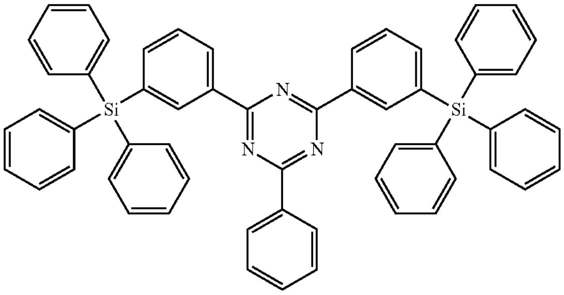
ET-03
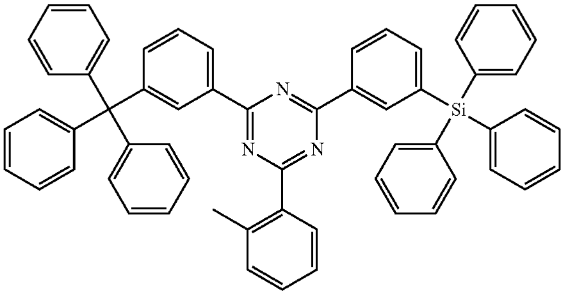
ET-04
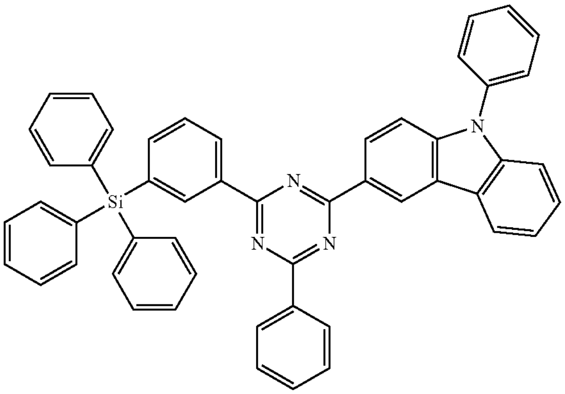
ET-05
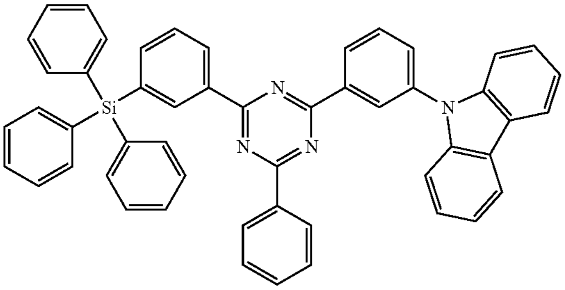
ET-06
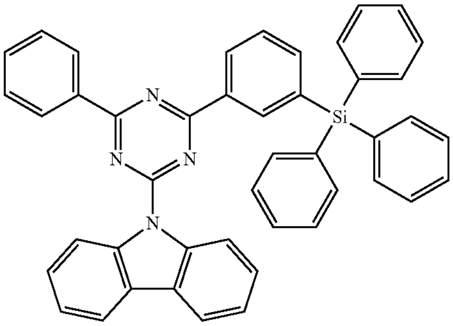
ET-07
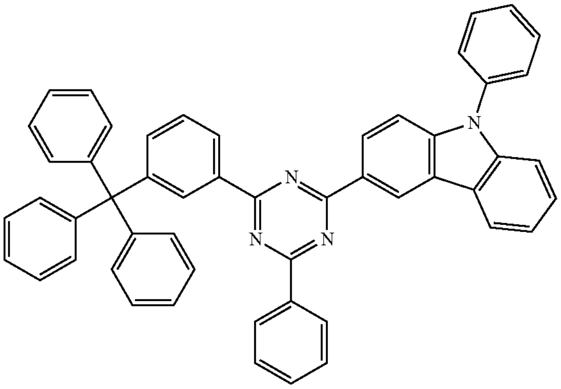
ET-08
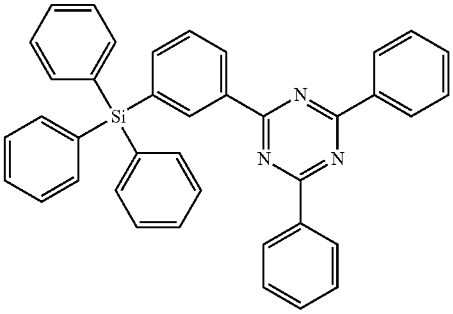

-continued
ET-09
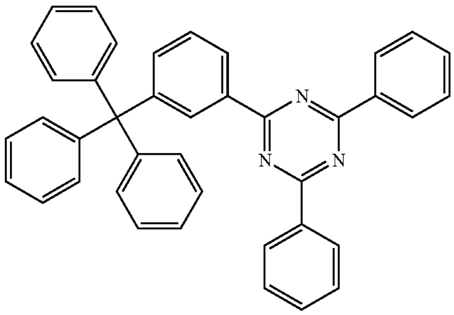
ET-10
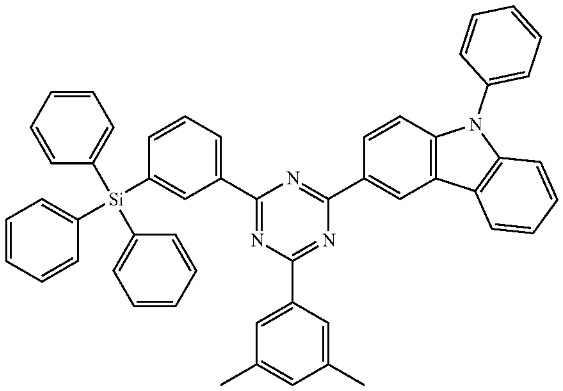
ET-11
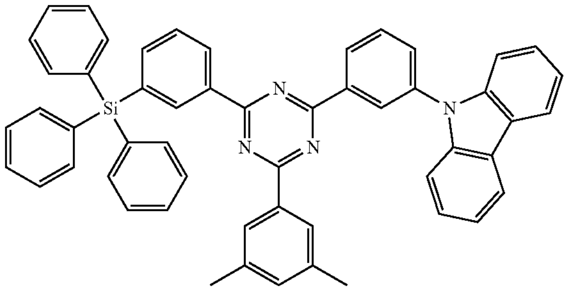
ET-12
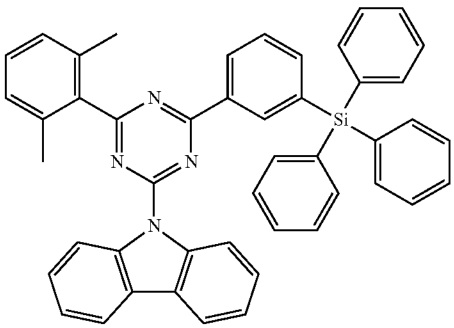
-continued
ET-13
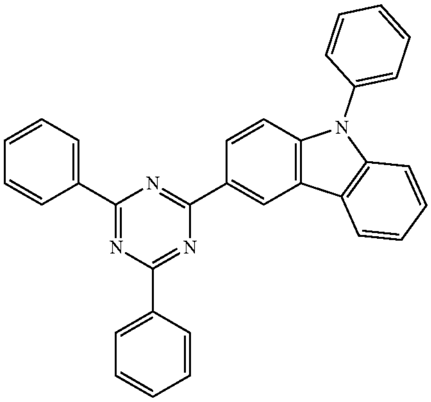
ET-14
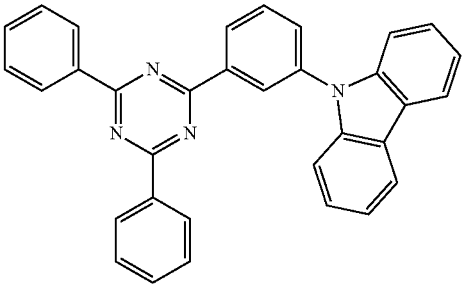
ET-15
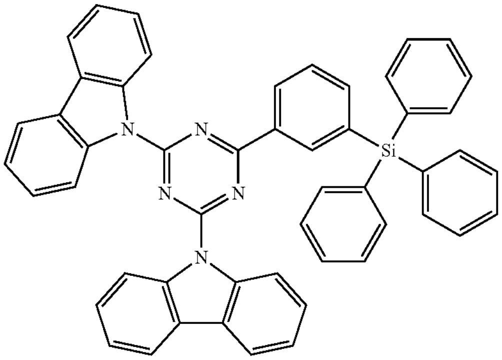
Group III-I
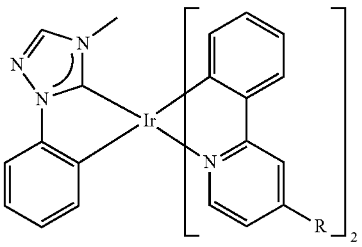
1 (R = H)
2 (R = Me)
3 (R = iso-Pr)
4 (R = tert-Bu)
5 (R = $NMe_2$)

-continued
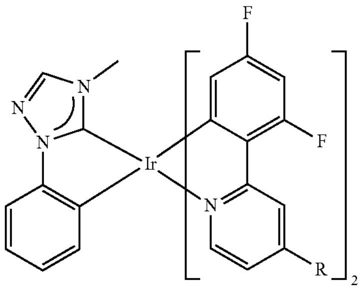
6 (R = H)
7 (R = Me)
8 (R = iso-Pr)
9 (R = tert-Bu)
10 (R = $NMe_2$)
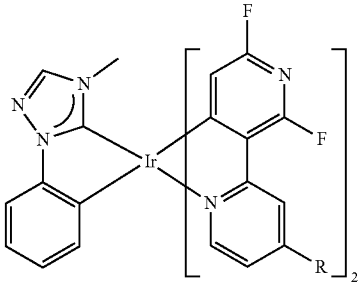
11 (R = H)
12 (R = Me)
13 (R = iso-Pr)
14 (R = tert-Bu)
15 (R = $NMe_2$)
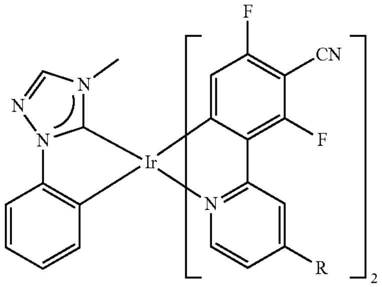
16 (R = H)
17 (R = Me)
18 (R = iso-Pr)
19 (R = tert-Bu)
20 (R = $NMe_2$)
21
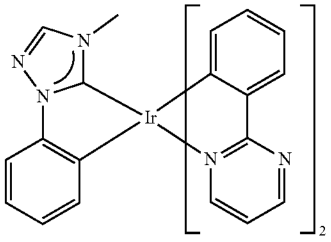
-continued
22
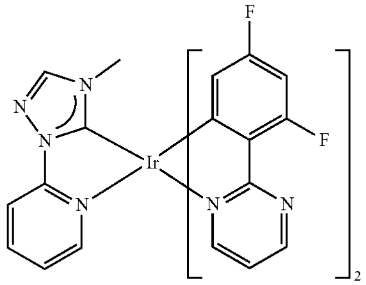
23
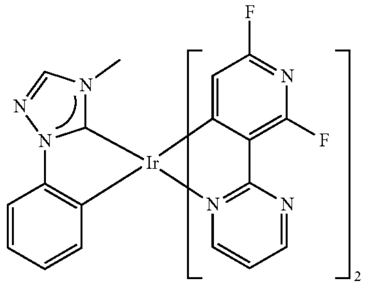
24
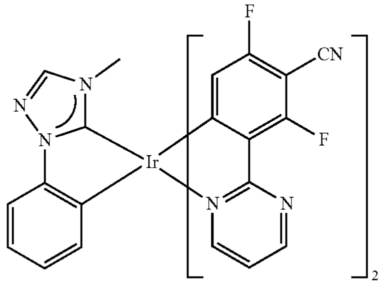
25
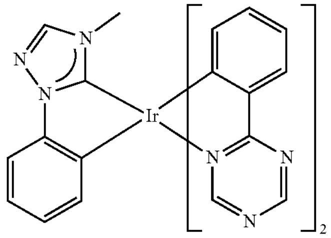
26
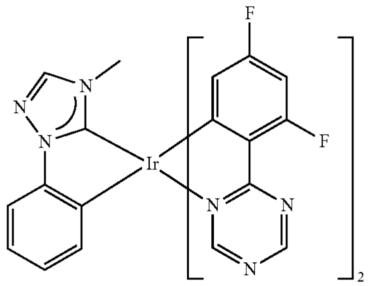

-continued
27
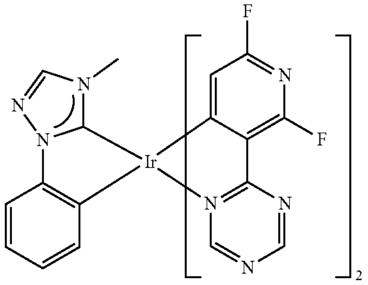
28
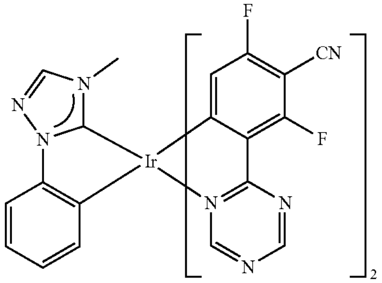
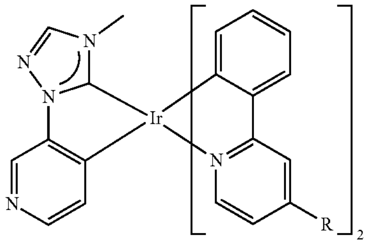
29 (R = H)
30 (R = Me)
31 (R = iso-Pr)
32 (R = tert-Bu)
33 (R = $NMe_2$)
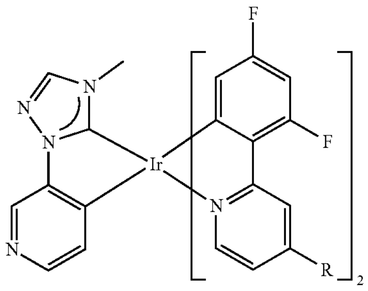
34 (R = H)
35 (R = Me)
36 (R = iso-Pr)
37 (R = tert-Bu)
38 (R = $NMe_2$)
-continued
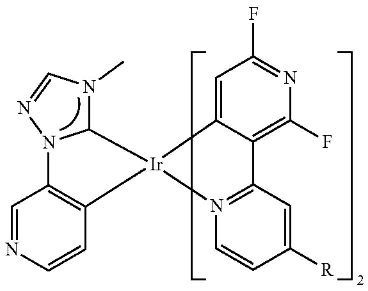
39 (R = H)
40 (R = Me)
41 (R = iso-Pr)
42 (R = tert-Bu)
43 (R = $NMe_2$)
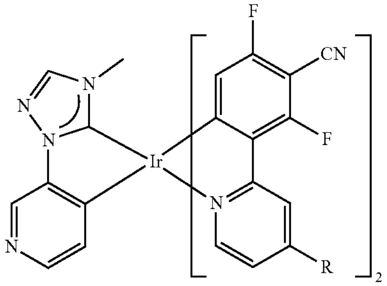
44 (R = H)
45 (R = Me)
46 (R = iso-Pr)
47 (R = tert-Bu)
48 (R = $NMe_2$)
49
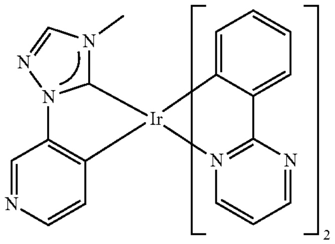
50
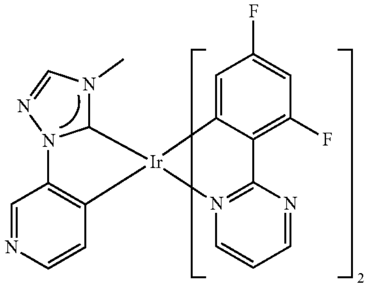

51
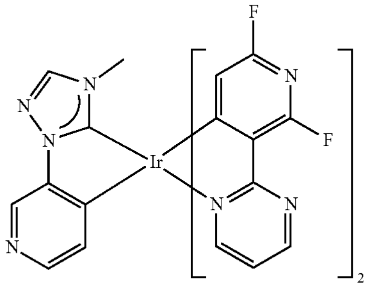
52
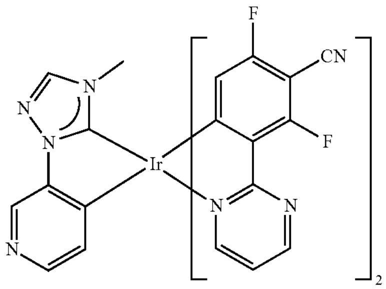
53
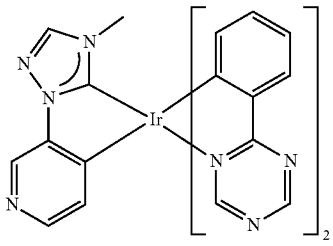
54
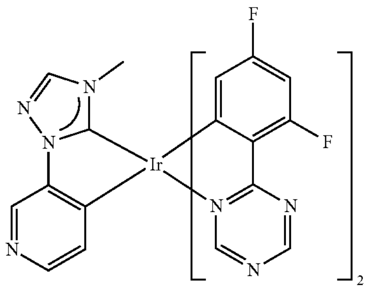
55
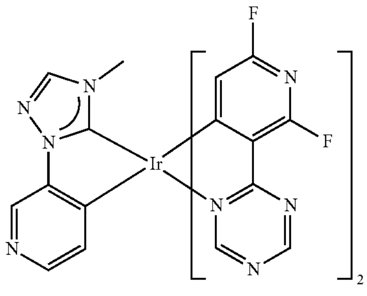
56
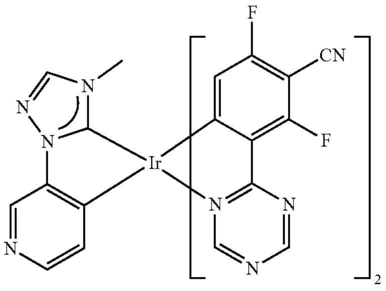
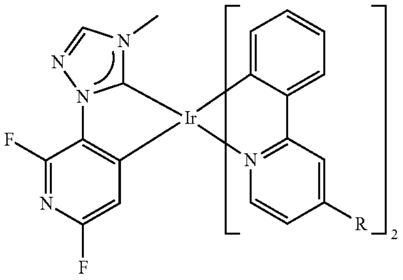
57 (R = H)
58 (R = Me)
59 (R = iso-Pr)
60 (R = tert-Bu)
61 (R = $NMe_2$)
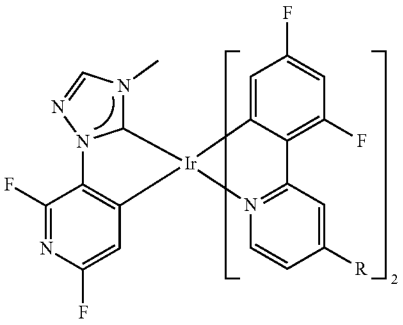
62 (R = H)
63 (R = Me)
64 (R = iso-Pr)
65 (R = tert-Bu)
66 (R = $NMe_2$)
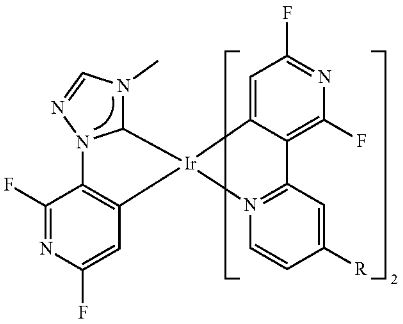
67 (R = H)
68 (R = Me)
69 (R = iso-Pr)
70 (R = tert-Bu)
71 (R = $NMe_2$)

-continued
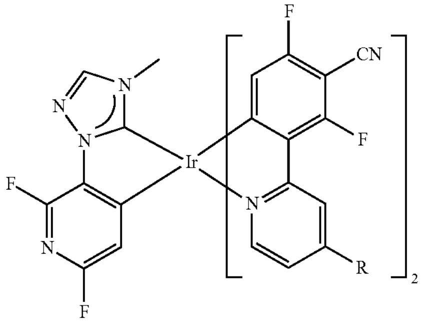
72 (R = H)
73 (R = Me)
74 (R = iso-Pr)
75 (R = tert-Bu)
76 ($R = NMe_2$)
77
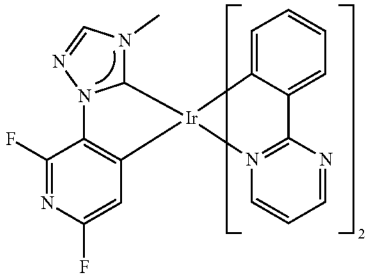
78
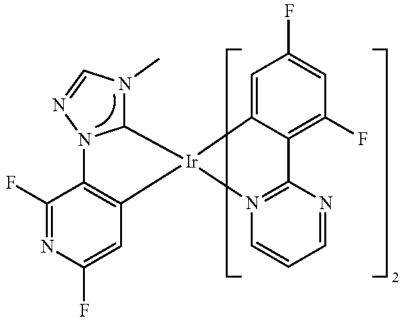
79
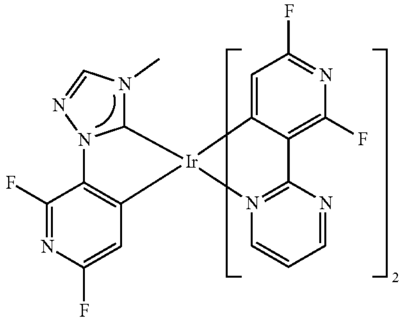
-continued
80
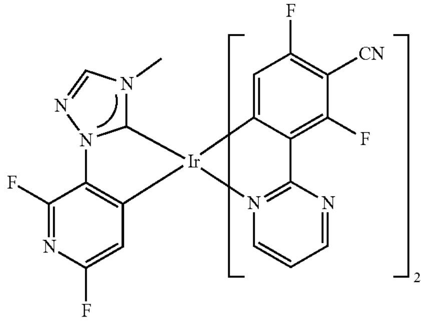
81
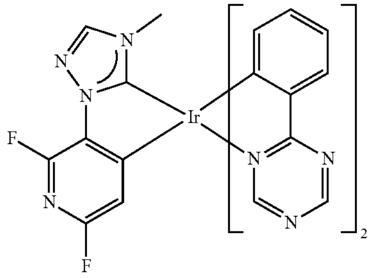
82
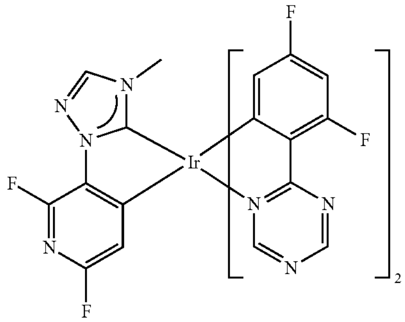
83
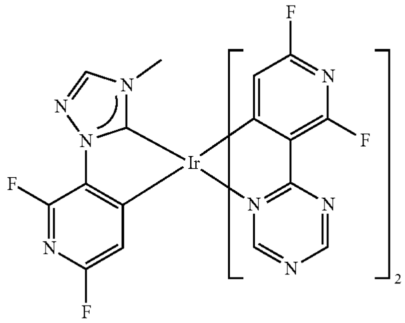
84
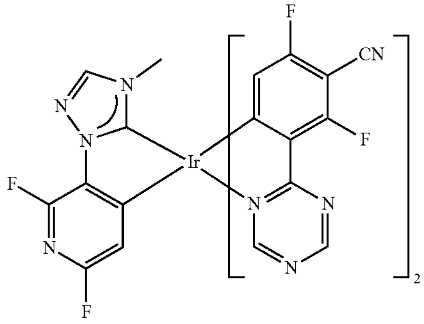

-continued
Group III-II
PT1
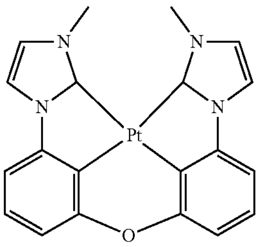
PT2
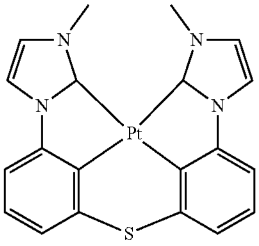
PT3
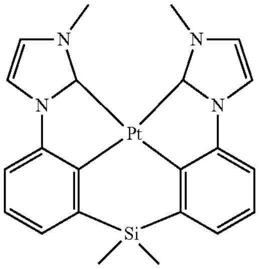
PT4
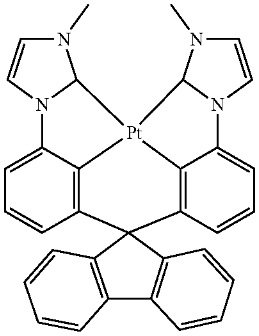
PT5
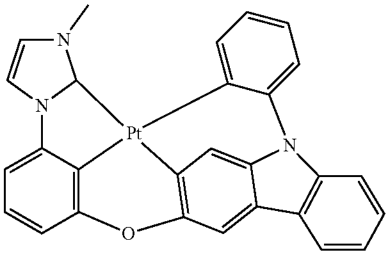
-continued
PT6
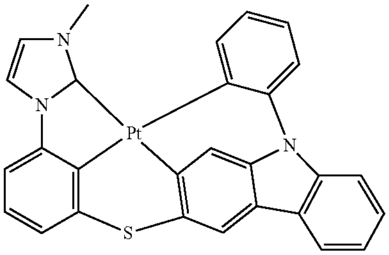
PT7
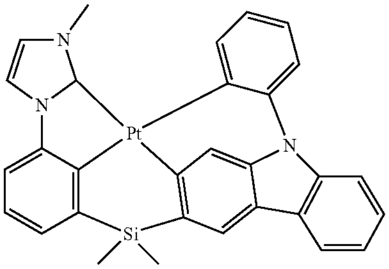
PT8
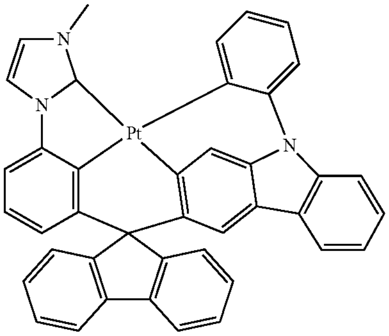
PT9
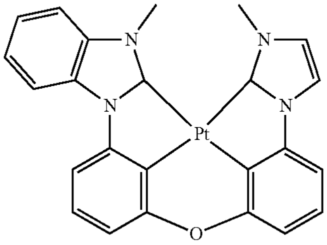
PT10
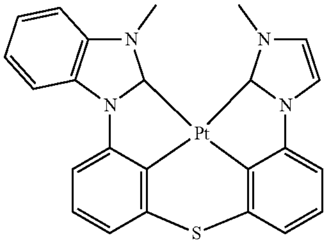

-continued
PT11
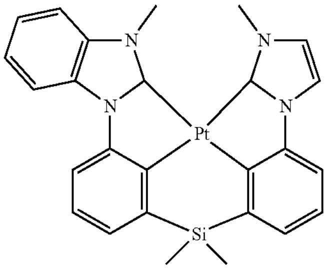
PT12
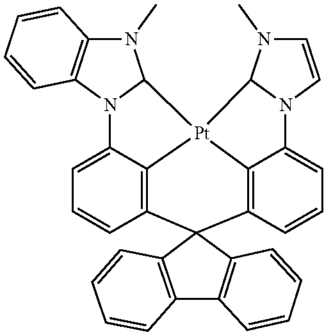
PT13
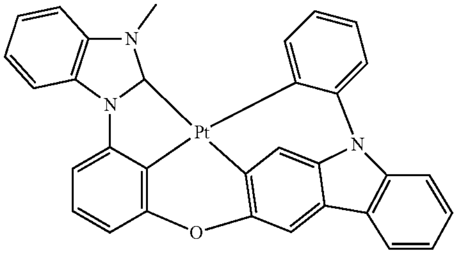
PT14
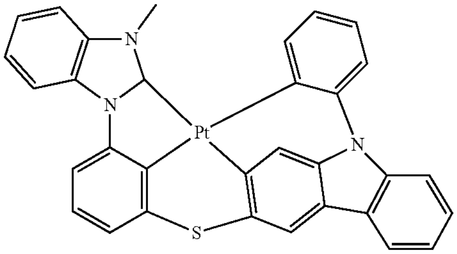
PT15
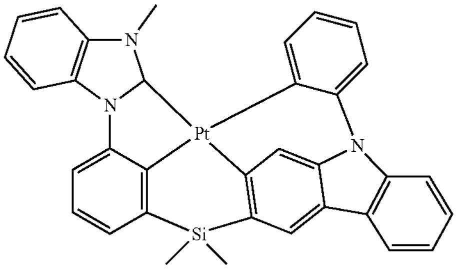
-continued
PT16
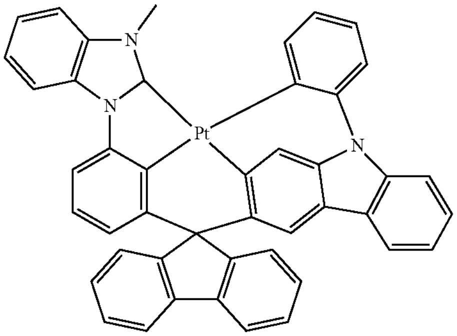
PT17
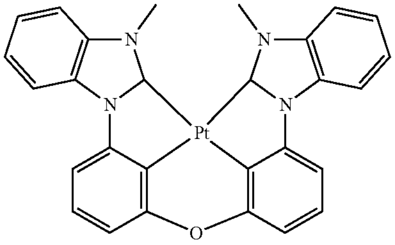
PT18
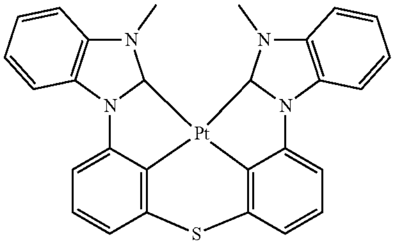
PT19
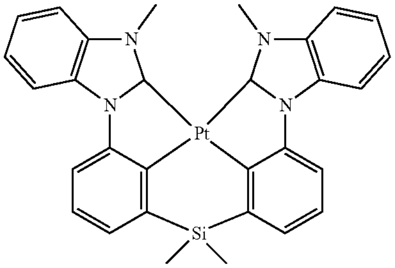
PT20
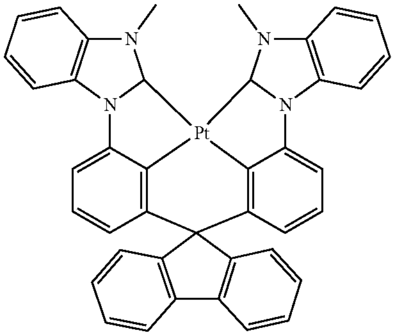

-continued
PT21
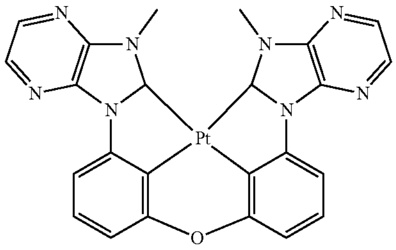
PT22
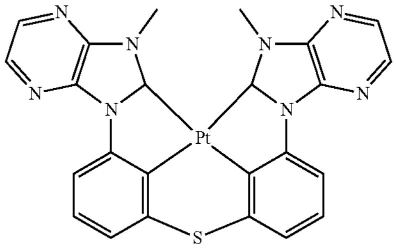
PT23
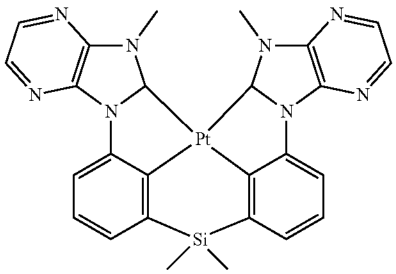
PT24
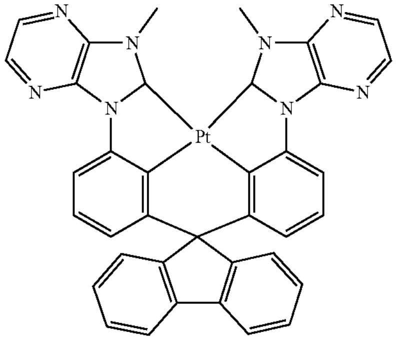
PT25
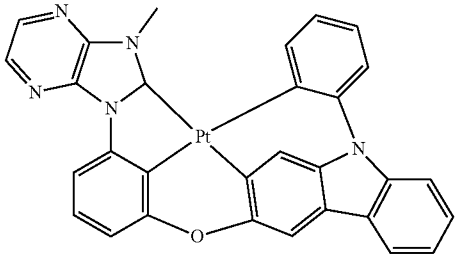
-continued
PT26
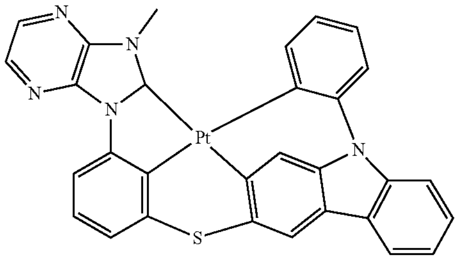
PT27
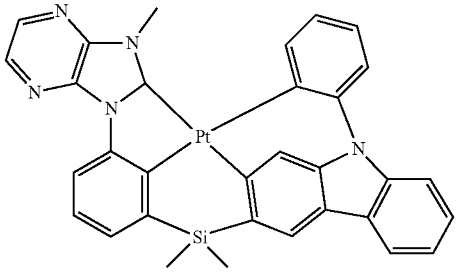
PT28
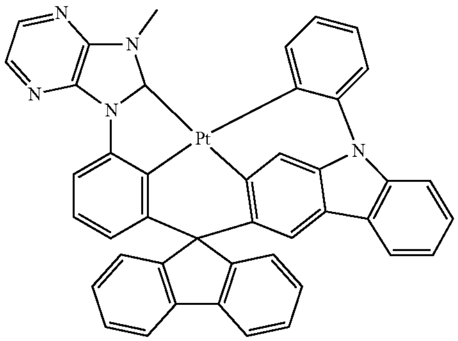
PT29
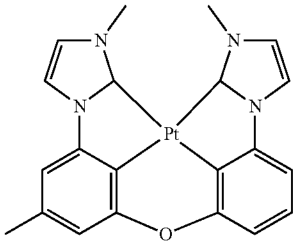
PT30
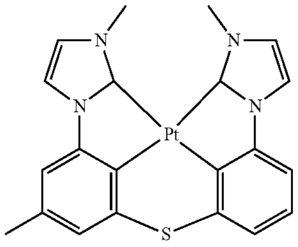

-continued
PT31
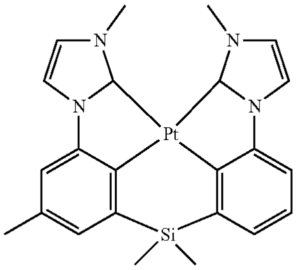
PT32
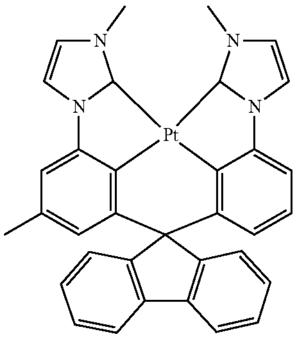
PT33
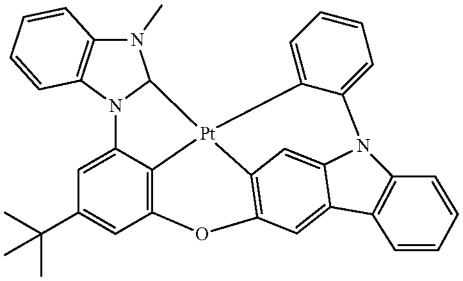
PT34
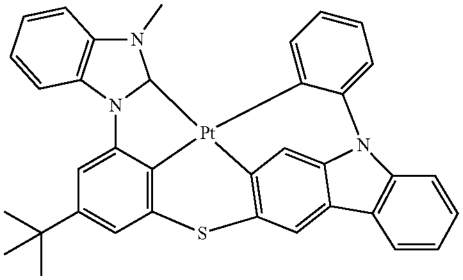
PT35
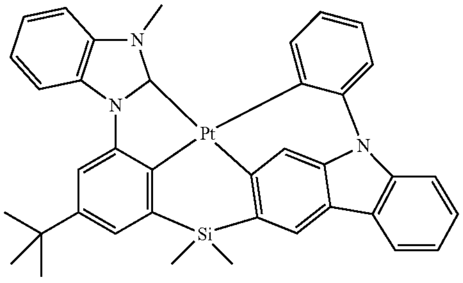
-continued
PT36
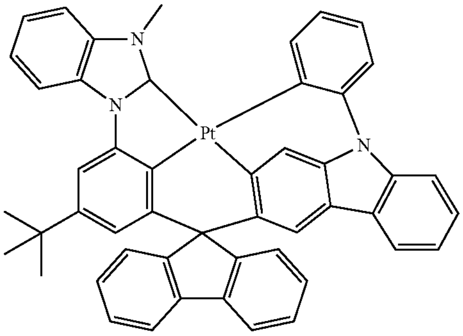
Group IV
D-01
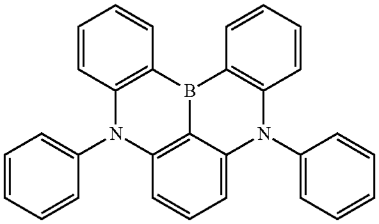
D-02
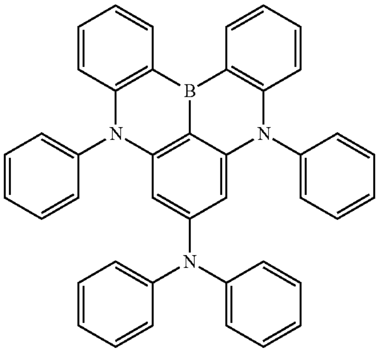
D-03
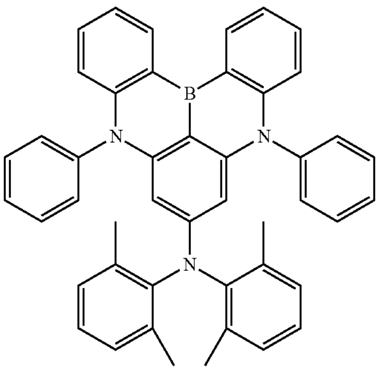

-continued
D-04
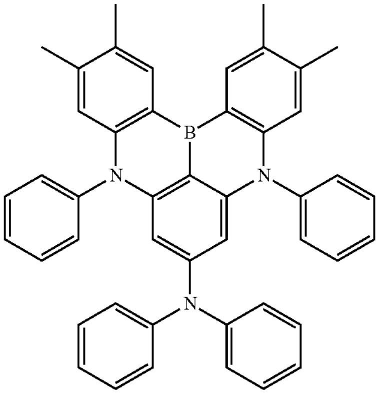
D-05
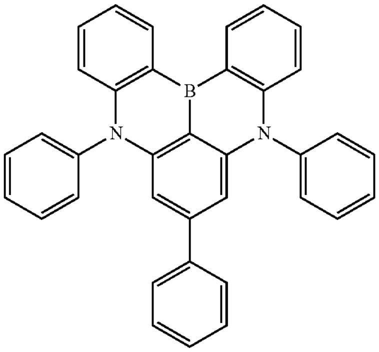
D-06
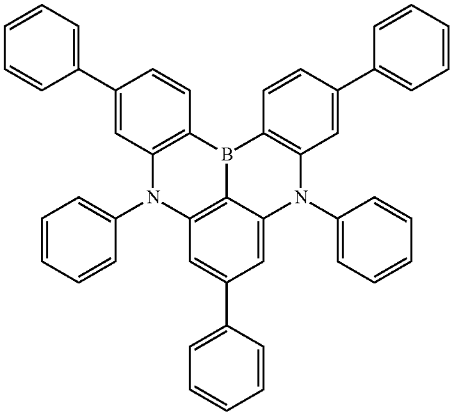
D-07
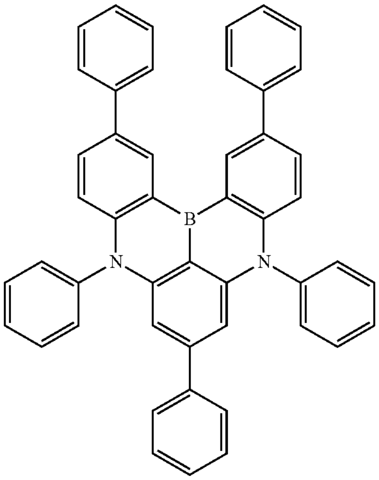
-continued
D-08
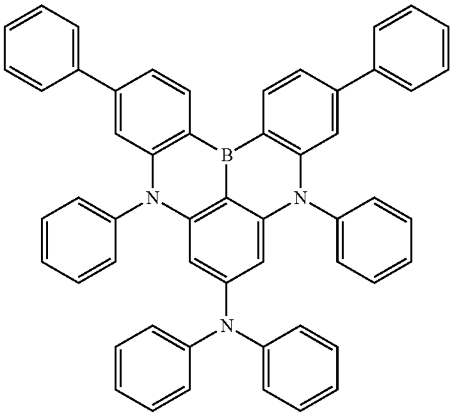
D-09
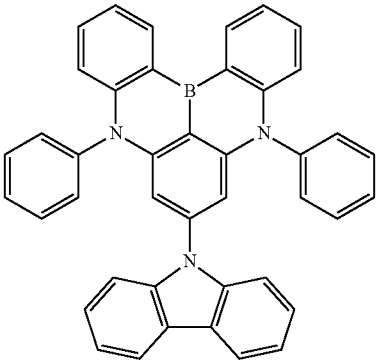
D-10
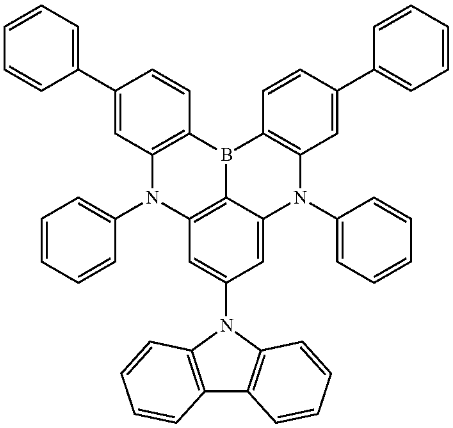

-continued
D-11
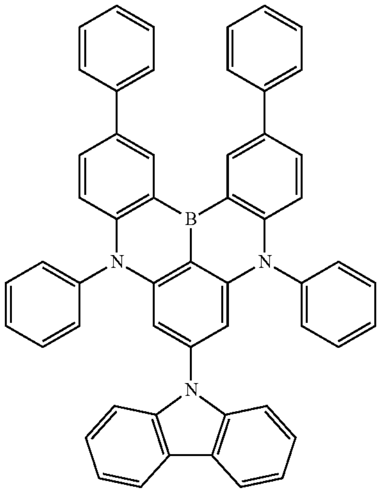
D-12
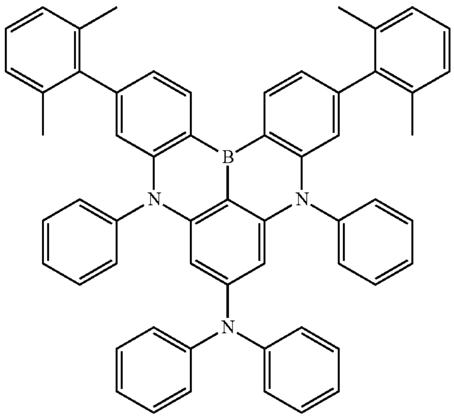
D-13
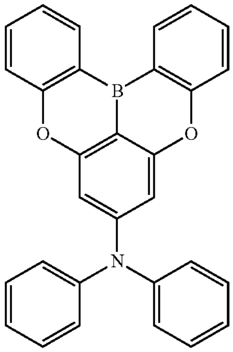
D-14
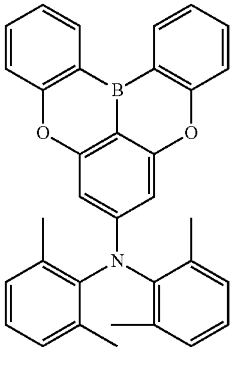
-continued
D-15
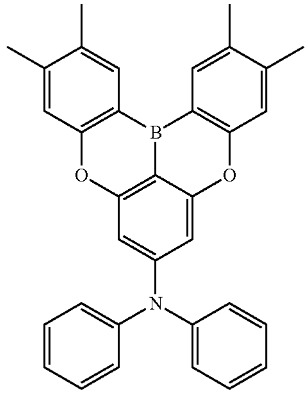
D-16
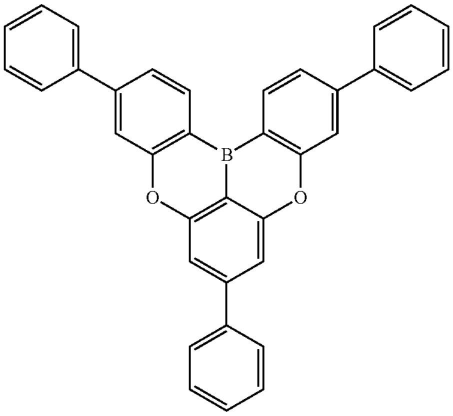
D-17
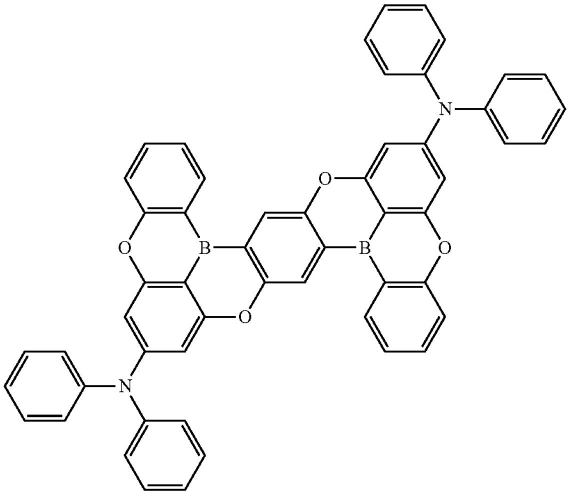

-continued

D-18

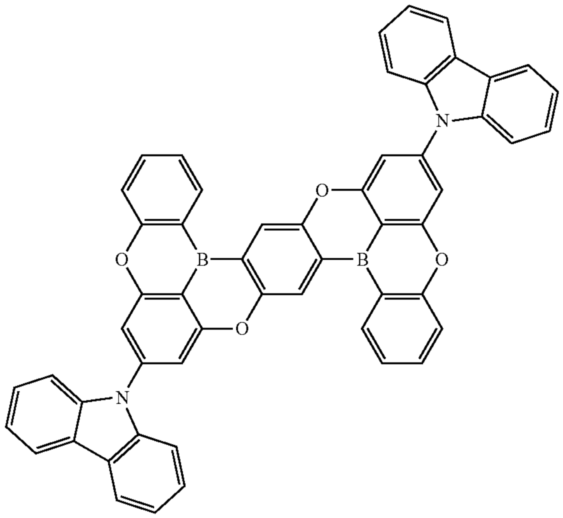

D-19

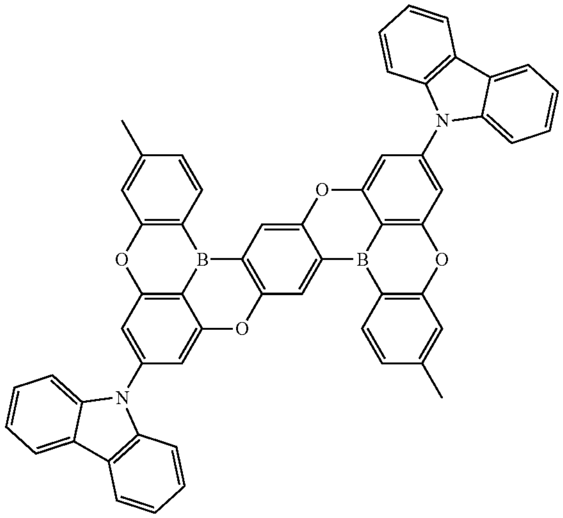

D-20

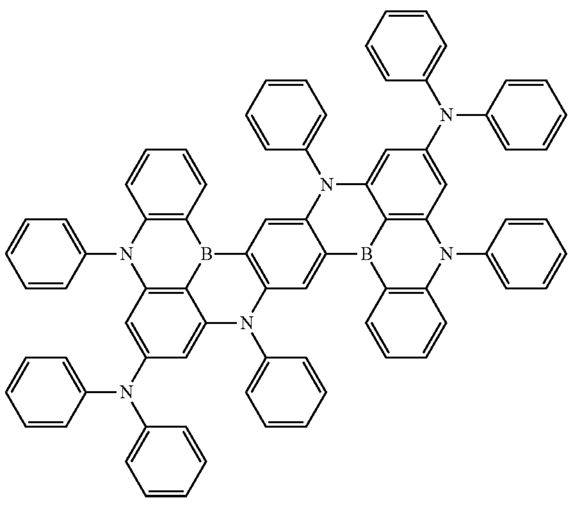

-continued

D-21

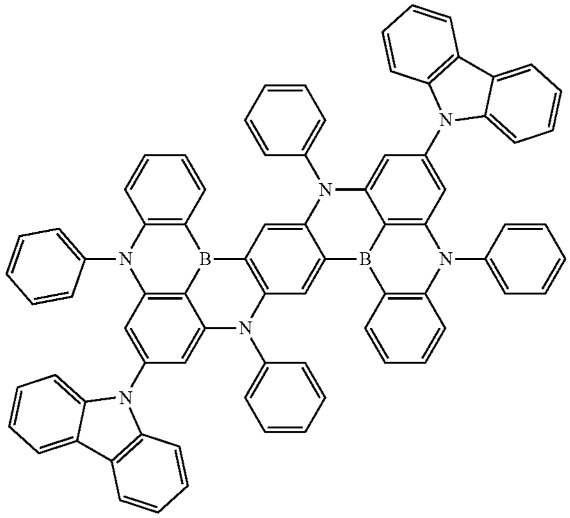

D-22

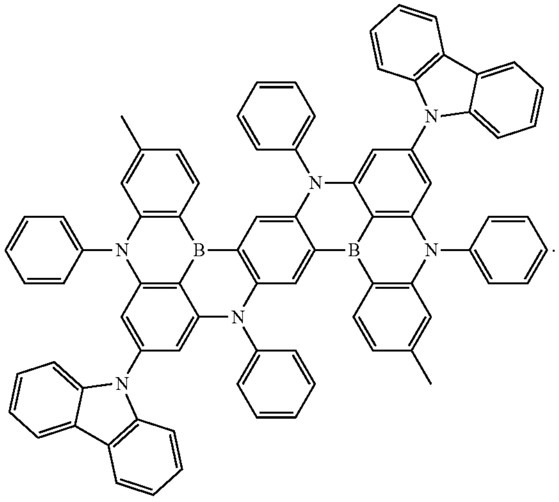

The first compound, the second compound, and the third compound may substantially not emit light (e.g., the third compound is not provided to emit light).

In some embodiments, the third compound does not emit light, instead the third compound satisfies Conditions 1-1 and 1-2. Accordingly, intersystem crossing (ISC) actively occurs, resulting in the transfer of the triplet exciton generated from the first compound and the second compound to the fourth compound.

Accordingly, by transferring the singlet excitons and triplet excitons generated in the emission layer to the fourth compound, an organic light-emitting device having improved efficiency may be obtained. In addition, because an organic light-emitting device having a significantly reduced energy loss is obtained, the lifespan characteristics of the organic light-emitting device may be improved.

Furthermore, when the exciton is transitioned in the third compound and then transitioned in the fourth compound, the degradation of the fourth compound due to the exciton's energy can be suppressed (or reduced), thereby improving the lifespan characteristics.

The lowest excitation triplet energy level of the third compound may be from about 2.5 eV to about 3.5 eV.

Therefore, the lowest excitation triplet energy level of the third compound may be higher than the lowest excitation singlet energy level of the fourth compound, so that the lowest excitation triplet of the third compound may well (suitably) be delivered to the lowest excitation singlet level of the fourth compound.

The fourth compound emits light, and the fourth compound may be a delayed fluorescence emitter.

In one or more embodiments, the fourth compound may be a thermally activated delayed fluorescence (TADF) emitter.

The fourth compound may improve luminescent efficiency by forming dipoles in a compound. Also, because the fourth compound satisfies Conditions 2 or 3, triplet-state of excitons can be delivered to a single state without substantial loss by reverse Intersystem crossing (RISC), and thus, luminescent efficiency may be improved.

Regarding the third compound and the fourth compound, $T_1(C3)_{onset}-S_1(C4)_{onsetm}$ may be about 3.0 eV or less, and $T_1(C3)_{max}-S_1(C4)_{max}$ may be about 3.0 eV or less. In one or more embodiments, regarding the third compound and the fourth compound, $T_1(C3)_{onset}-S_1(C4)_{onset}$ may be about 2.8 eV to about 3.0 eV, and $T_1(C3)_{max}-S_1(C4)_{max}$ may be about 2.8 eV to about 3.0 eV. In one or more embodiments, when such ranges are satisfied, the ratio of a luminescent component emitted from the fourth compound with respect to the total luminescent components emitted from the emission layer may be 80% or more. The fourth compound may have a maximum emission wavelength in the range of about 420 nm to about 490 nm, but embodiments of the present disclosure are not limited.

In some embodiments, the fourth compound in the emission layer may emit blue delayed fluorescence light by receiving energy from the formed exciton without directly participating in the formation of the exciton.

The fourth compound may satisfy Condition A:

$$\Delta E_{ST}(C4) \leq 0.3 \text{ eV.} \qquad \text{Condition A}$$

In Condition A, $\Delta E_{ST}(C4)$ is a difference between the lowest excitation singlet energy level ($S_1(C4)$) and the lowest excitation triplet energy level ($T_1(C4)$) of the fourth compound.

Here, $S_1(C4)$ and $T_1(C4)$ may each be evaluated using the Density Functional Theory (DFT) method of Gaussian program which is structure-optimized at a B3LYP/6-31G(d, p) level.

When Condition A is satisfied, RISC efficiency may be sufficiently (suitably) high, even at room temperature.

The $T_1$ level of the fourth compound is relatively higher than the $T_1$ level of a comparable fluorescent dopant, which allows for smooth RISC.

In the case of the comparable fluorescent dopant (for example, DCJTB), the $T_1$ level of the dopant is substantially lower than the $T_1$ level of third compound, and thus, the exciton at the $T_1$ level produced by the third compound is likely to transition to the $T_1$ level of the fluorescent dopant, and after the transition, is likely to fail to participate in luminescence and to be quenched. In addition, due to the low $T_1$ of the fluorescent dopant, the triplet exciton generated in the first compound and the second compound is likely to be quenched, without participating in light-emission, while transferring to $T_1$ of the fluorescent dopant, not to $T_1$ of the third compound. Thus, the replacing of the fourth compound with comparable fluorescent dopants may be inappropriate.

Because the fourth compound of the present embodiments has a sufficiently (suitably) high RISC efficiency even at room temperature, even when the excitons in the $T_1$ level of the third compound move to the $T_1$ level of the fourth compound, the exciton at the $T_1$ level of the fourth compound is reverse-intersystem transitioned to the $S_1$ level of the fourth compound, and then is emitted as fluorescence. In other words, the exciton is not quenched. Accordingly, the exciton-quenching probability may be greatly reduced, and thus, the luminescent efficiency may be improved. In addition, when the exciton is transitioned in the third compound and then transitioned in the fourth compound, the degradation of the fourth compound due to the exciton's energy can be suppressed or reduced, thereby improving the lifespan characteristics.

When electrons are not efficiently injected from the electron transport region to the emission layer, charges are accumulated at the interface between the emission layer and the electron transport region, thus deteriorating the interface. Similarly, when holes are not efficiently injected from the hole transport region to the emission layer, charges are accumulated at the interface between the emission layer and the hole transport region, thus deteriorating the interface. Thus, the lifespan of the organic light-emitting device is lowered.

Because the second compound is a compound essentially including an electron transport moiety, the second compound may be used to adjust the electron transporting characteristics of the organic light-emitting device. Because the first compound is a compound not including an electron transport moiety, the first compound may be used to adjust the hole transporting characteristics of the organic light-emitting device. In this manner, it is possible to optimize (or improve) the charge balance in the emission layer of the organic light-emitting device.

An amount of the first compound in the emission layer may be in a range of about 10 wt % to about 90 wt % based on the total weight of the emission layer.

An amount of the second compound in the emission layer may be in a range of about 10 wt % to about 90 wt % based on the total weight of the emission layer.

The amount of the third compound in the emission layer may be greater than or equal to the amount of the fourth compound.

The amount of the fourth compound in the emission layer may be in a range of about 0.25 wt % to about 5 wt % based on the total weight of the emission layer.

The amount of the fourth compound may be in a range of about 0.01 parts by weight to about 20 parts by weight based on 100 parts by weight of the sum of the amount of the first compound and the amount of the second compound.

When the amounts of the first compound, the second compound, and the third compound are within any of these ranges, the organic light-emitting device having both improved efficiency and improved lifespan may be provided.

In one or more embodiments, the emission layer may consist of the first compound, the second compound, the third compound, and the fourth compound, but embodiments of the present disclosure are not limited thereto.

In one embodiment, the first electrode may be an anode, the second electrode may be a cathode, and the organic layer may further include a hole transport region between the first electrode and the emission layer, and/or an electron transport region between the emission layer and the second electrode, wherein the hole transport region may include a hole injection layer, a hole transport layer, an emission auxiliary layer, an electron blocking layer, or any combination thereof, and the electron transport region may include a hole blocking layer, an electron transport layer, an electron injection layer, or any combination thereof, but embodiments of the present disclosure are not limited thereto.

For example, the hole blocking layer may include a hole blocking material.

The hole blocking material may be identical to or different from the second compound. In some embodiments, the hole blocking material may be different from the second compound.

For example, the first compound, the second compound, and the hole blocking material may each satisfy Conditions 4 and 5 below:

$$T_1(HB) \geq T_1(C1) \quad \text{Condition 4}$$

$$T_1(HB) \geq T_1(C2). \quad \text{Condition 5}$$

In Conditions 4 and 5, $T_1(C1)$ is a lowest excitation triplet energy level of the first compound;

$T_1(C2)$ is a lowest excitation triplet energy level of the second compound;

$T_1(HB)$ is a lowest excitation triplet energy level of the hole blocking material;

Each of $T_1(C1)$, $T_1(C2)$, and $T_1(HB)$ is an onset value and a measured value. Methods for measuring $T_1(C1)$, $T_1(C2)$, and $T_1(HB)$ may be understood by referring to the description of $T_1(C3)_{onset}$.

When Conditions 4 and 5 are satisfied, the transfer of the triplet exciton generated in the first compound and the second compound from the emission layer to the electron transport layer may be prevented or reduced.

In some embodiments, the first compound, the second compound and the hole blocking material may satisfy Conditions 4-1 and 5-1:

$$0.3\text{ eV} > T_1(HB) - T_1(C1) \geq 0\text{ eV} \quad \text{Condition 4-1}$$

$$0.3\text{ eV} > T_1(HB) - T_1(C2) \geq 0\text{ eV}. \quad \text{Condition 5-1}$$

The hole blocking material may be represented by Formula 10. Formula 10 may be understood by referring to the corresponding description thereof provided herein.

In one embodiment, the hole blocking material may be selected from compounds of Group V:

Group V

HBL01

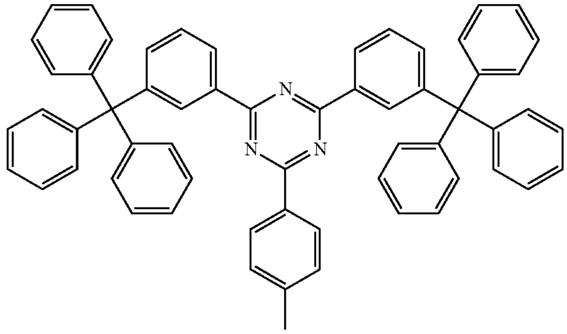

-continued

HBL02

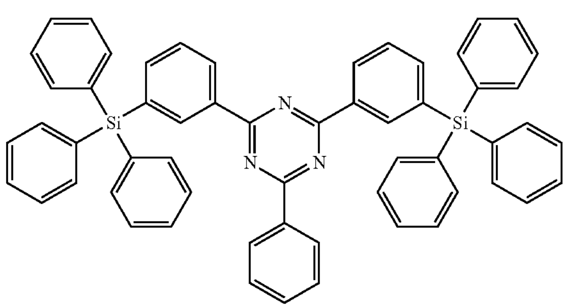

HBL03

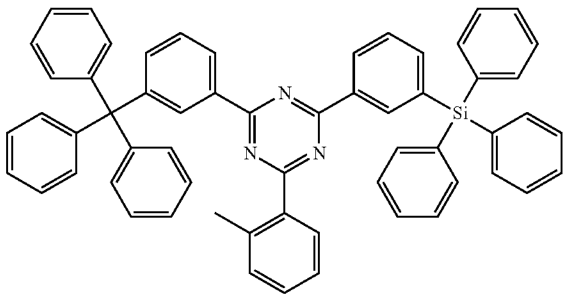

HBL04

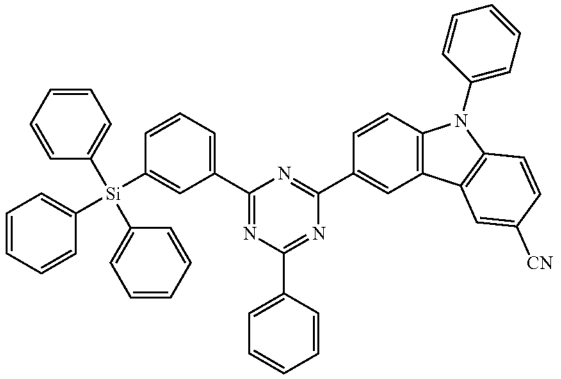

HBL05

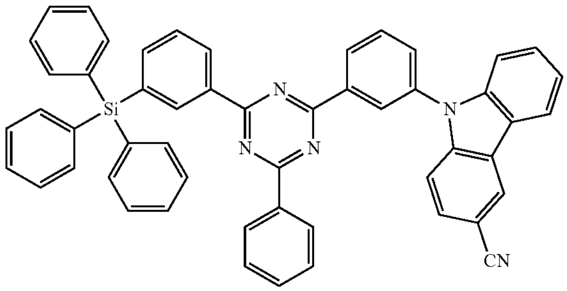

-continued
HBL06
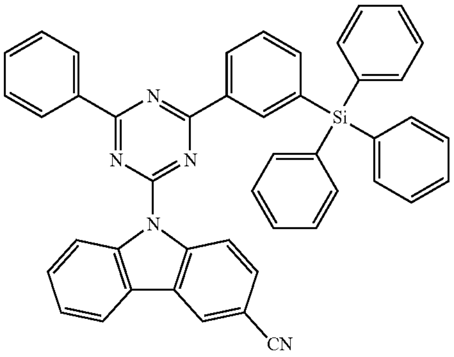
HBL07
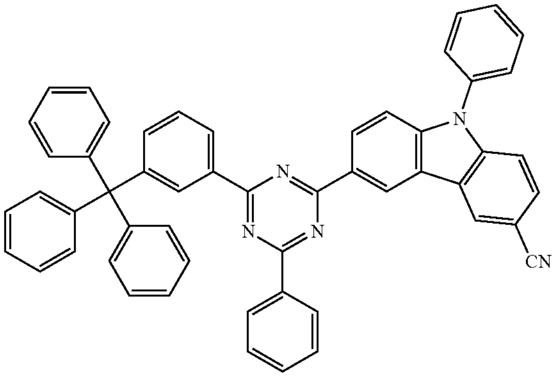
HBL08
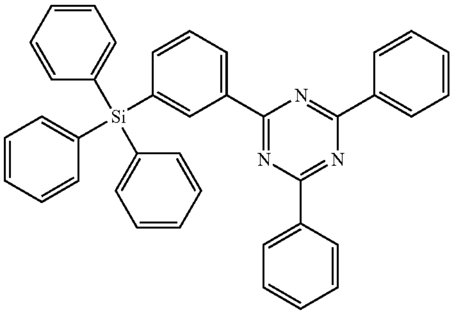
HBL09
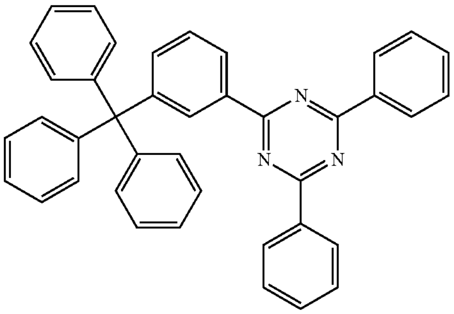
-continued
HBL010
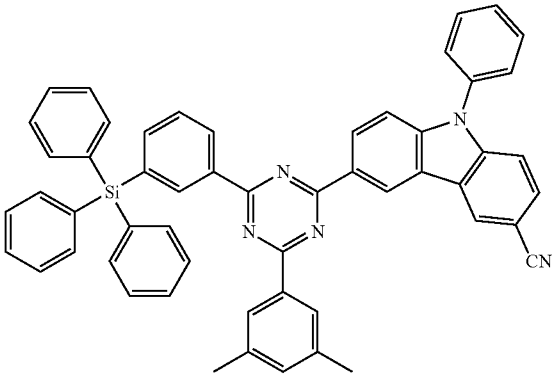
HBL011
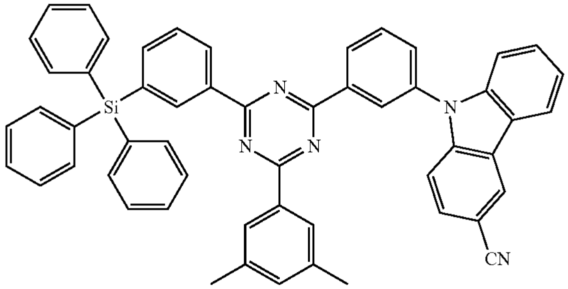
HBL012
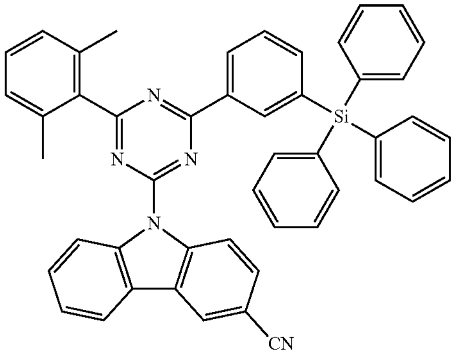
HBL013
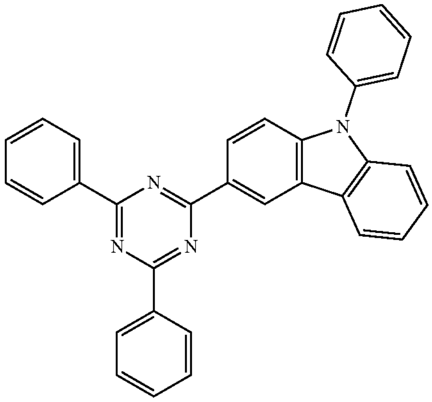

-continued

HBL014

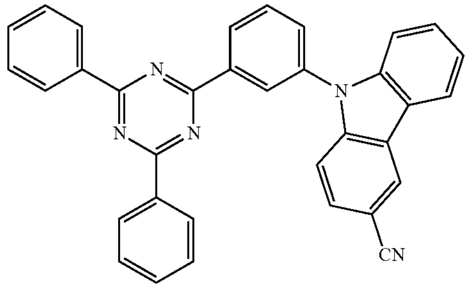

HBL015

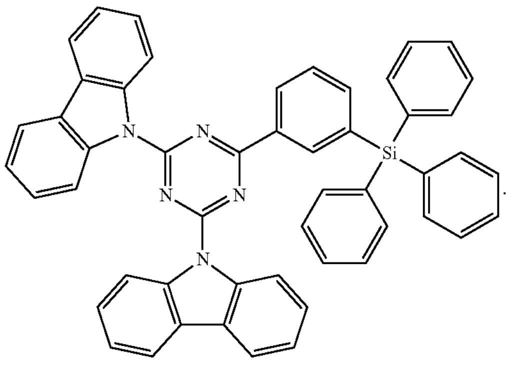

Description of FIG. 1

FIG. 1 is a schematic view of an organic light-emitting device 10 according to an embodiment. The organic light-emitting device 10 includes a first electrode 110, an organic layer 150, and a second electrode 190.

Hereinafter, the structure of the organic light-emitting device 10 according to an embodiment and a method of manufacturing the organic light-emitting device 10 will be described in connection with FIG. 1.

First Electrode 110

In FIG. 1, a substrate may be additionally positioned under the first electrode 110 or above the second electrode 190. The substrate may be a glass substrate and/or a plastic substrate, each having excellent mechanical strength, thermal stability, transparency, surface smoothness, ease of handling, and/or water resistance.

The first electrode 110 may be formed by depositing or sputtering a material for forming the first electrode 110 on the substrate. When the first electrode 110 is an anode, the material for forming the first electrode 110 may be selected from materials with a high work function to facilitate hole injection.

The first electrode 110 may be a reflective electrode, a semi-transmissive electrode, or a transmissive electrode. When the first electrode 110 is a transmissive electrode, a material for forming a first electrode may be selected from indium tin oxide (ITO), indium zinc oxide (IZO), tin oxide ($SnO_2$), zinc oxide (ZnO), and any combinations thereof, but embodiments of the present disclosure are not limited thereto. In one or more embodiments, when the first electrode 110 is a semi-transmissive electrode or a reflective electrode, a material for forming the first electrode 110 may be selected from magnesium (Mg), silver (Ag), aluminum (Al), aluminum-lithium (Al—Li), calcium (Ca), magnesium-indium (Mg—In), magnesium-silver (Mg—Ag), and any combinations thereof, but embodiments of the present disclosure are not limited thereto.

The first electrode 110 may have a single-layered structure, or a multi-layered structure including two or more layers. For example, the first electrode 110 may have a three-layered structure of ITO/Ag/ITO, but the structure of the first electrode 110 is not limited thereto.

Organic Layer 150

The organic layer 150 is located on the first electrode 110. The organic layer 150 may include an emission layer.

The organic layer 150 may further include a hole transport region between the first electrode 110 and the emission layer, and an electron transport region between the emission layer and the second electrode 190.

Hole Transport Region in Organic Layer 150

The hole transport region may have i) a single-layered structure including a single layer including a single material, ii) a single-layered structure including a single layer including a plurality of different materials, or iii) a multi-layered structure having a plurality of layers including a plurality of different materials.

The hole transport region may include at least one layer selected from a hole injection layer, a hole transport layer, an emission auxiliary layer, and an electron blocking layer.

For example, the hole transport region may have a single-layered structure including a single layer including a plurality of different materials, or a multi-layered structure having a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein for each structure, constituting layers are sequentially stacked from the first electrode 110 in this stated order, but the structure of the hole transport region is not limited thereto.

The hole transport region may include at least one selected from m-MTDATA, TDATA, 2-TNATA, NPB (NPD), β-NPB, TPD, spiro-TPD, spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201 below, and a compound represented by Formula 202 below:

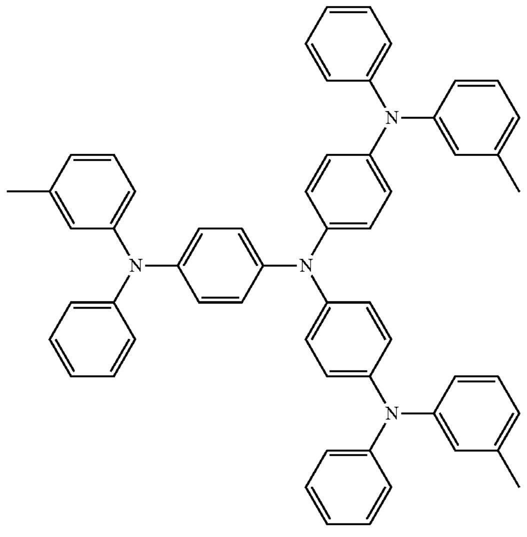

m-MTDATA

-continued
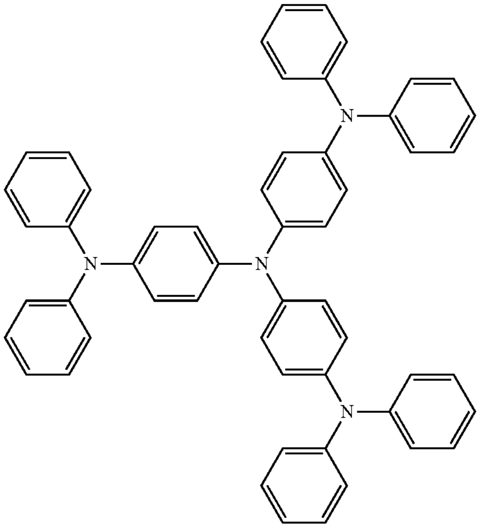
TDATA
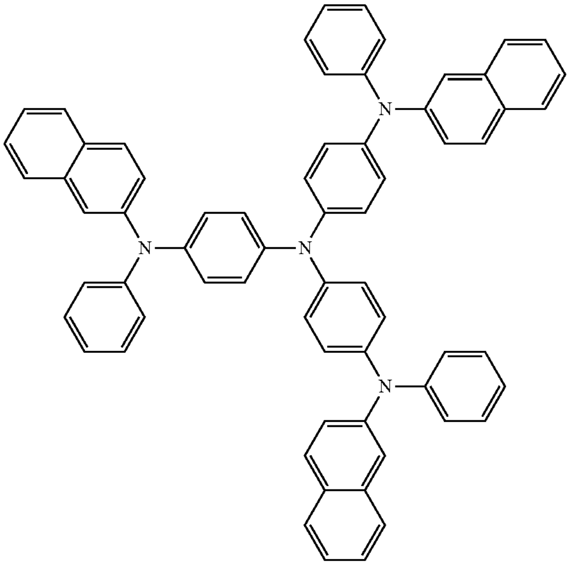
2-TNATA
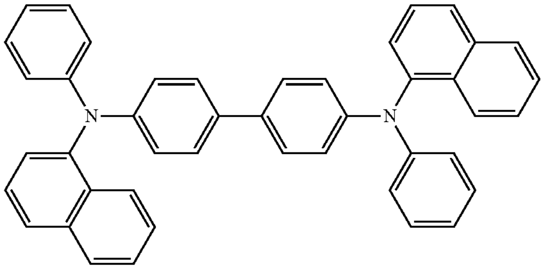
NPB
-continued
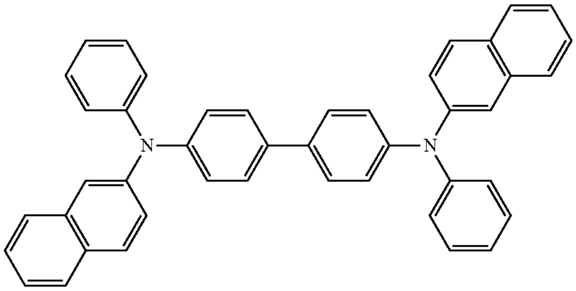
β-NPB
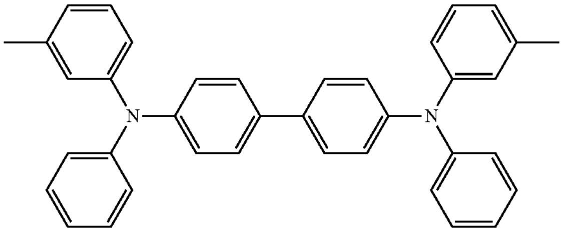
TPD
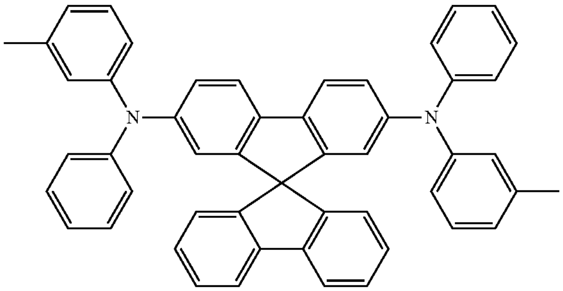
Spiro-TPD
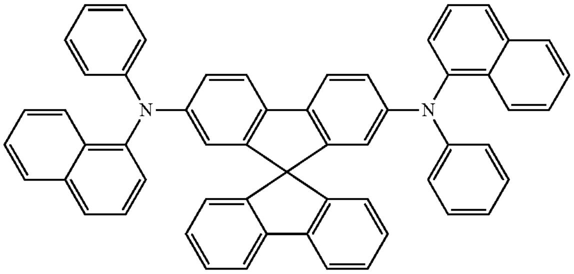
Spiro-NPB
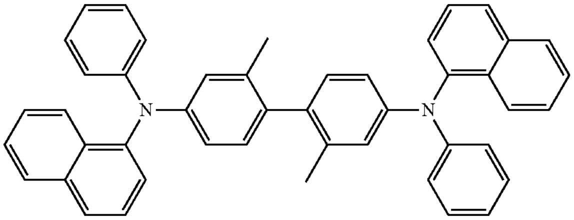
methylated NPB -continued

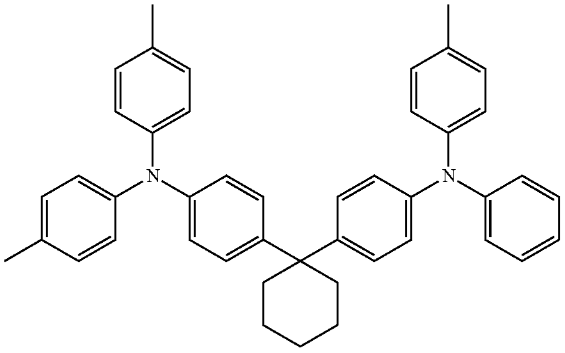

TAPC

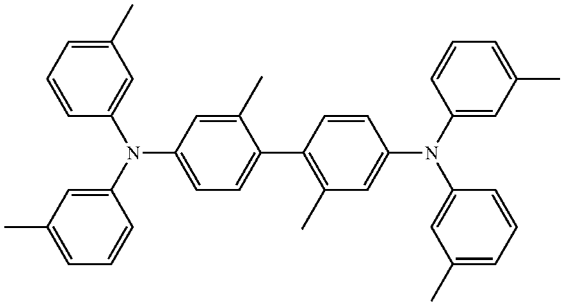

HMTPD

Formula 201

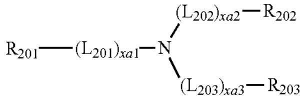

Formula 202

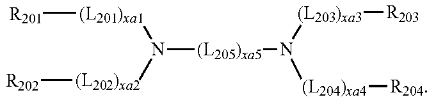

In Formulae 201 and 202, $L_{201}$ to $L_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ may be selected from *—O—*', *—S—*', *—N($Q_{201}$)-*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer from 0 to 3, xa5 may be an integer from 1 to 10, and $R_{201}$ to $R_{204}$ and $Q_{201}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In one embodiment, in Formula 202, $R_{201}$ and $R_{202}$ may optionally be linked to each other via a single bond, a dimethyl-methylene group, and/or a diphenyl-methylene group, and $R_{203}$ and $R_{204}$ may optionally be linked to each other via a single bond, a dimethyl-methylene group, and/or a diphenyl-methylene group.

In one embodiment, in Formulae 201 and 202, $L_{201}$ to $L_{205}$ may each independently be selected from:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —$Si(Q_{31})(Q_{32})(Q_{33})$, and —$N(Q_{31})(Q_{32})$, and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In one or more embodiments, xa1 to xa4 may each independently be 0, 1, or 2.

In one or more embodiments, xa5 may be 1, 2, 3, or 4.

In one or more embodiments, $R_{201}$ to $R_{204}$ and $Q_{201}$ may each independently be selected from:

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —$Si(Q_{31})(Q_{32})(Q_{33})$, and —$N(Q_{31})(Q_{32})$, and $Q_{31}$ to $Q_{33}$ are the same as described above.

In one or more embodiments, at least one selected from $R_{201}$ to $R_{203}$ in Formula 201 may each independently be selected from:

a fluorenyl group, a spiro-bifluorenyl group, a carbazolyl group, a dibenzofuranyl group, and a dibenzothiophenyl group; and a fluorenyl group, a spiro-bifluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

In one or more embodiments, in Formula 202, i) $R_{201}$ and $R_{202}$ may be linked to each other via a single bond, and/or ii) $R_{203}$ and $R_{204}$ may be linked to each other via a single bond.

In one or more embodiments, $R_{201}$ to $R_{204}$ in Formula 202 may each independently be selected from:

a carbazolyl group; and a carbazolyl group substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

The compound represented by Formula 201 may be represented by Formula 201A below:

Formula 201A

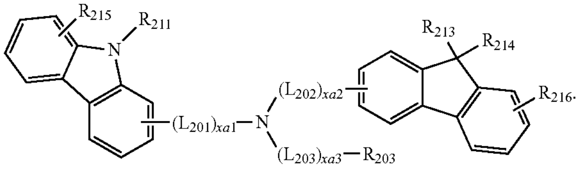

In one embodiment, the compound represented by Formula 201 may be represented by Formula 201A(1) below, but embodiments of the present disclosure are not limited thereto:

Formula 201A(1)

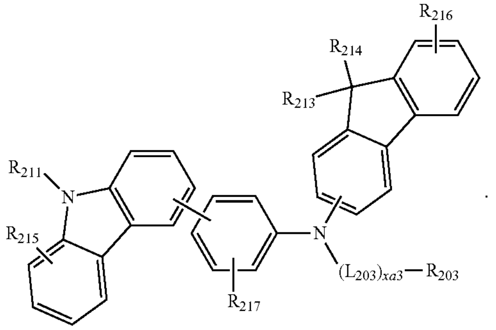

In one or more embodiments, the compound represented by Formula 201 may be represented by Formula 201A-1 below, but embodiments of the present disclosure are not limited thereto:

Formula 201A-1

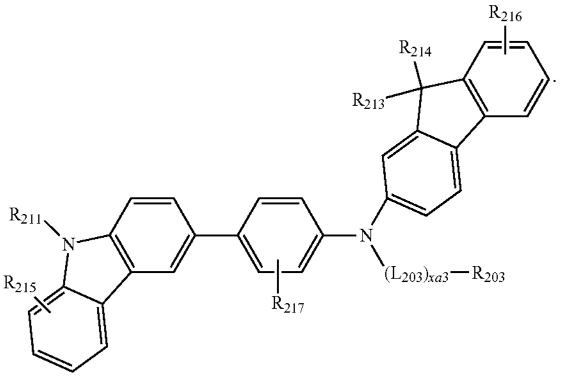

In one embodiment, the compound represented by Formula 202 may be represented by Formula 202A below:

Formula 202A

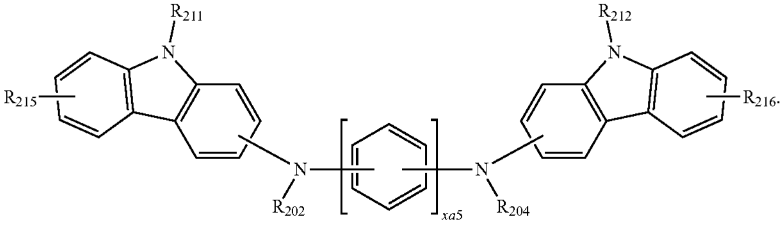

In one or more embodiments, the compound represented by Formula 202 may be represented by Formula 202A-1 below:

Formula 202A-1

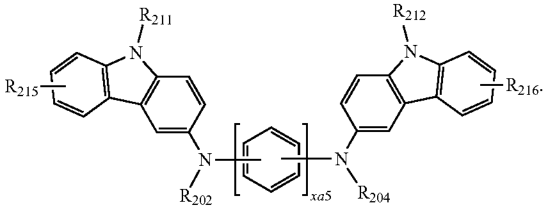

In Formulae 201A, 201A(1), 201A-1, 202A, and 202A-1, $L_{201}$ to $L_{203}$, xa1 to xa3, xa5, and $R_{202}$ to $R_{204}$ may each be understood by referring to the corresponding descriptions thereof presented herein, $R_{211}$ and $R_{212}$ may each be understood by referring to the description provided in connection with $R_{203}$, and $R_{213}$ to $R_{217}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

The hole transport region may include at least one compound selected from Compounds HT1 to HT39 below, but embodiments of the present disclosure are not limited thereto:

HT1
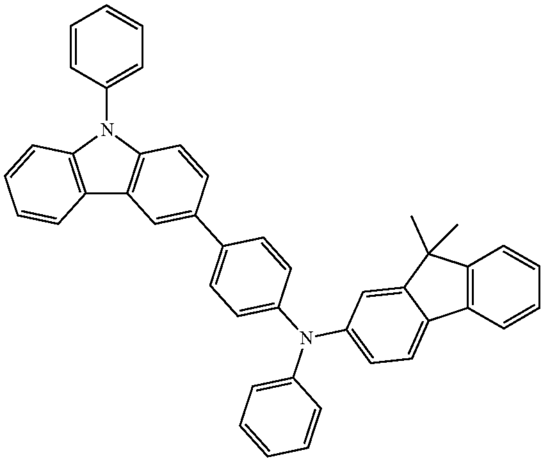
HT2
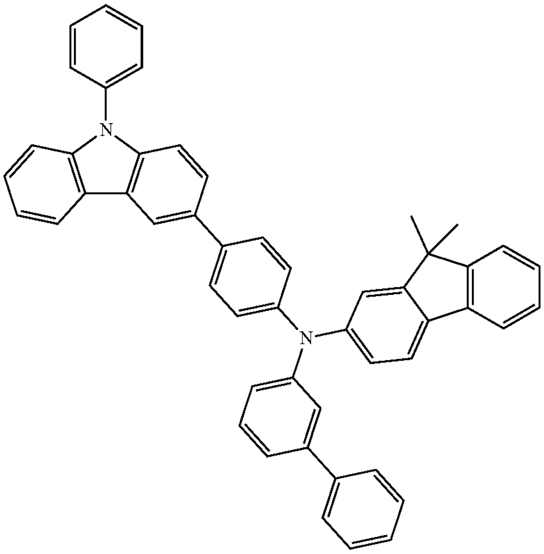
HT3
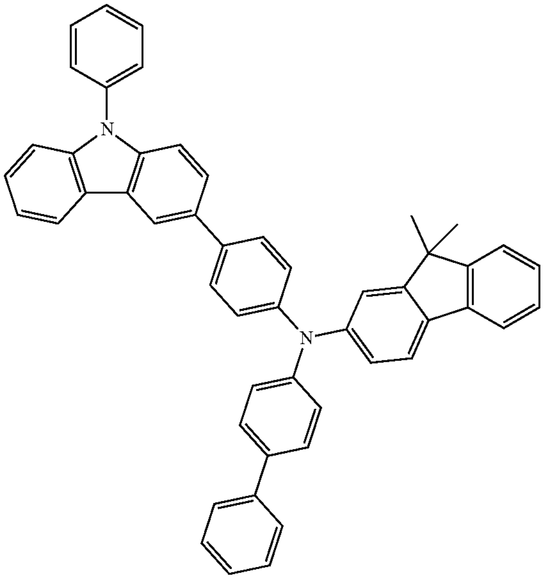
HT4
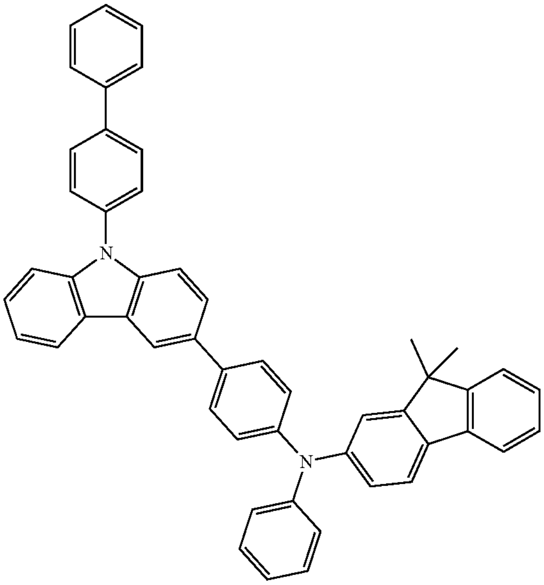

-continued
HT5
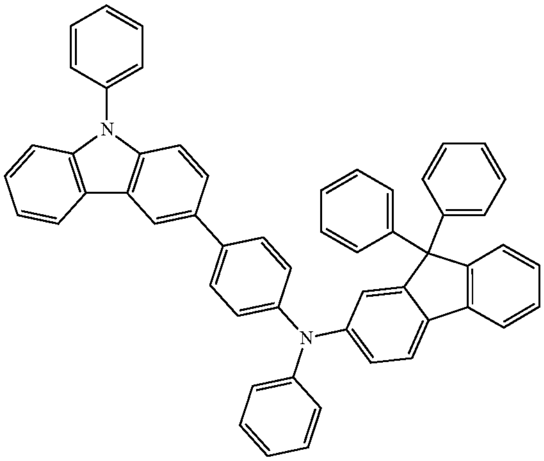
HT6
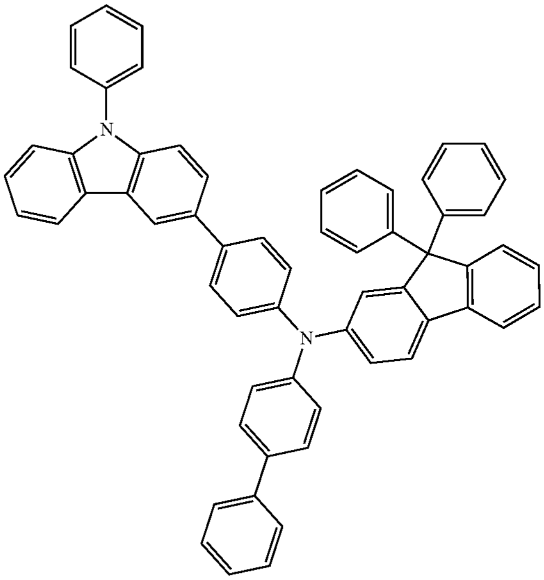
HT7
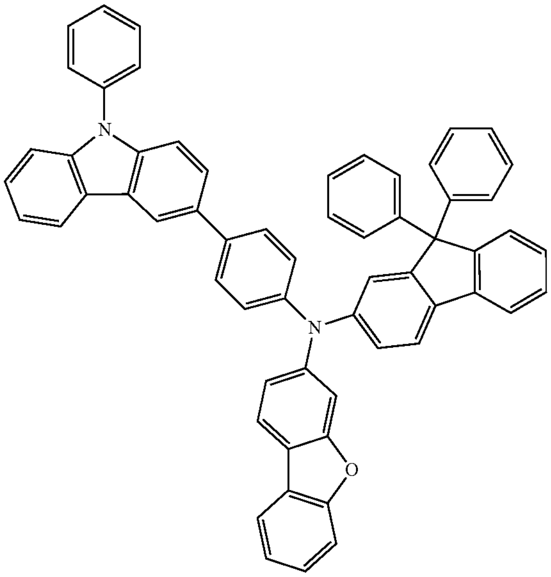
HT8
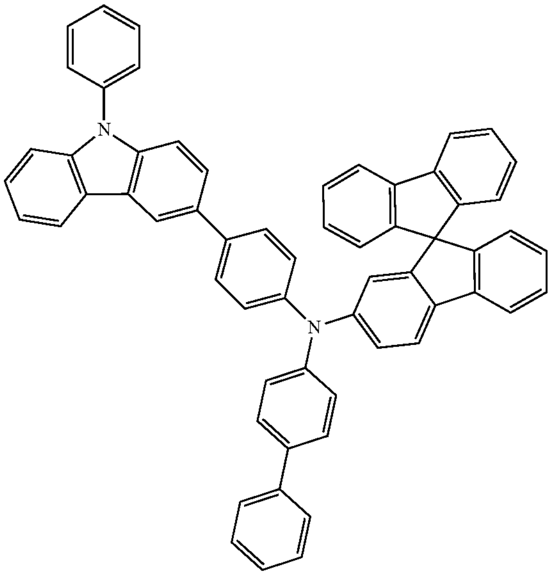

-continued
HT9
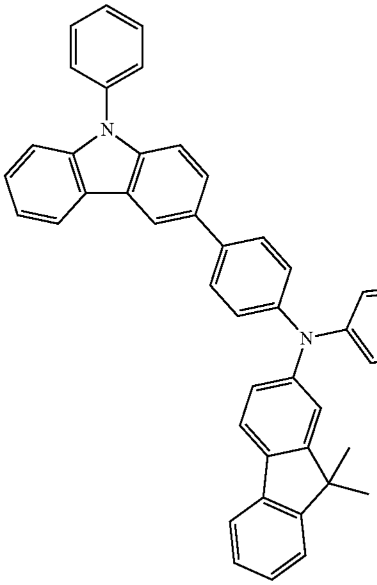
HT10
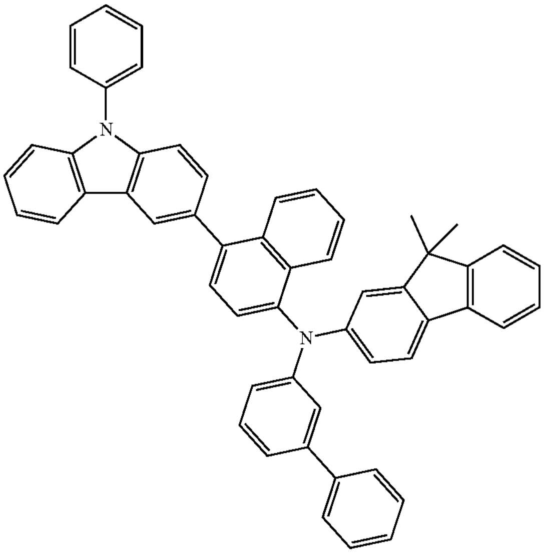
HT11
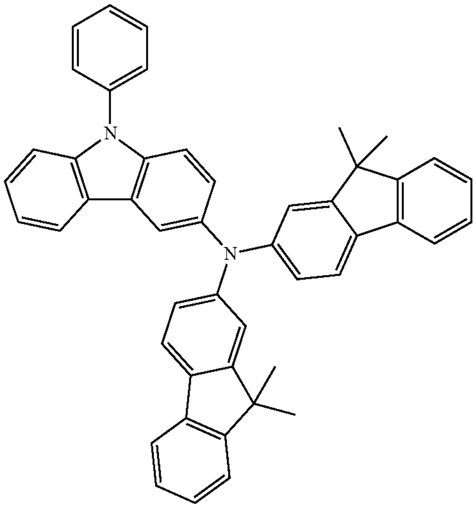
HT12
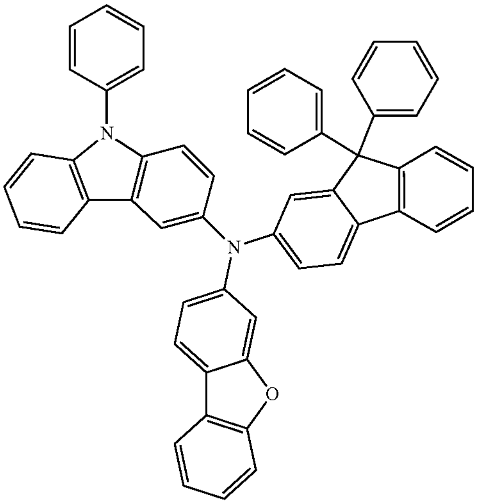

-continued
HT13
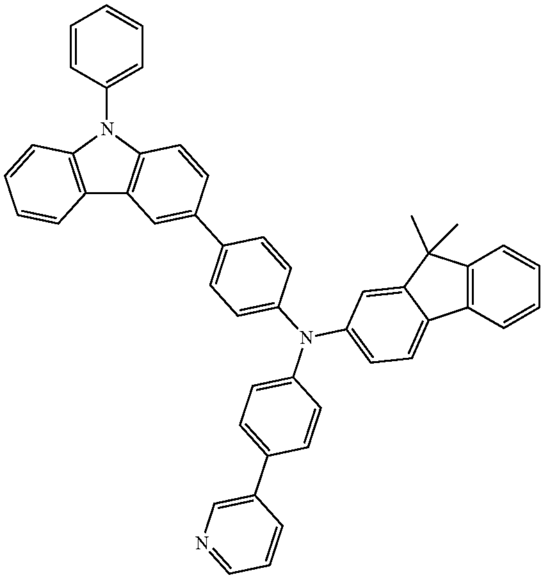
HT14
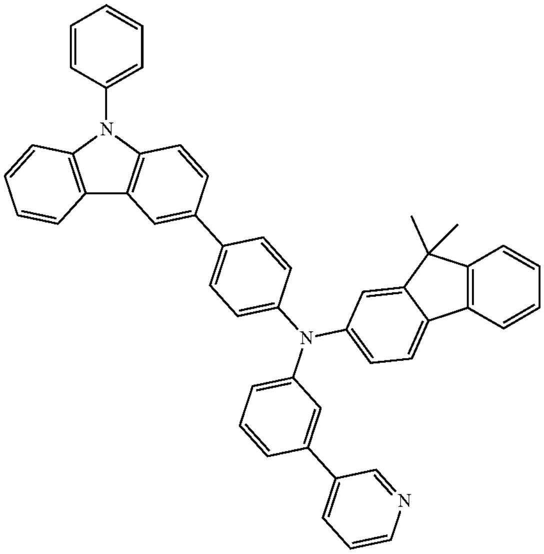
HT15
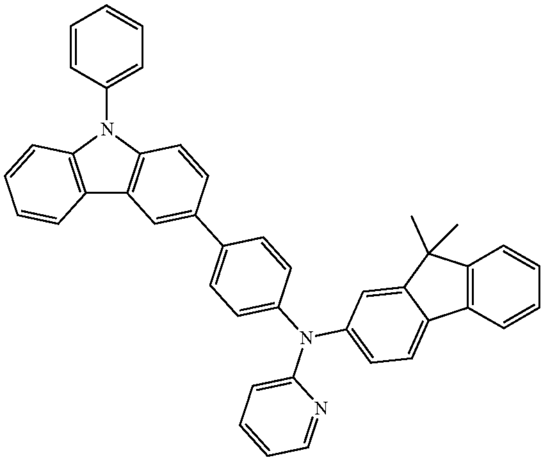
HT16
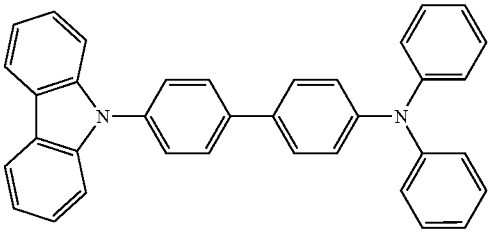
HT17
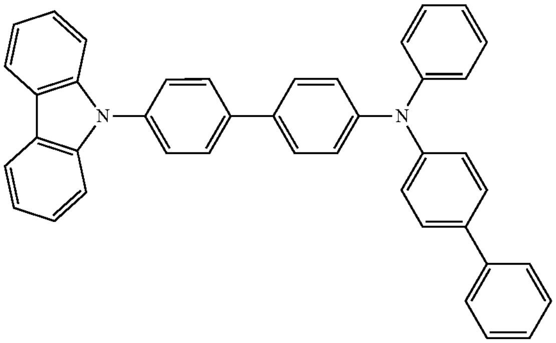
HT18
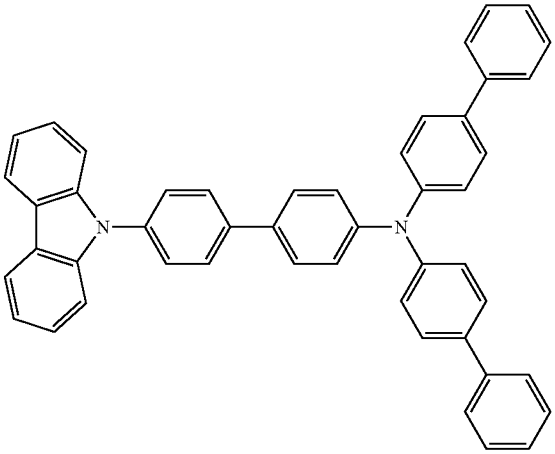

-continued
HT19
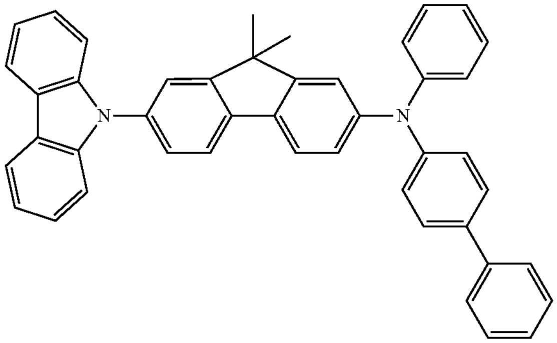
HT20
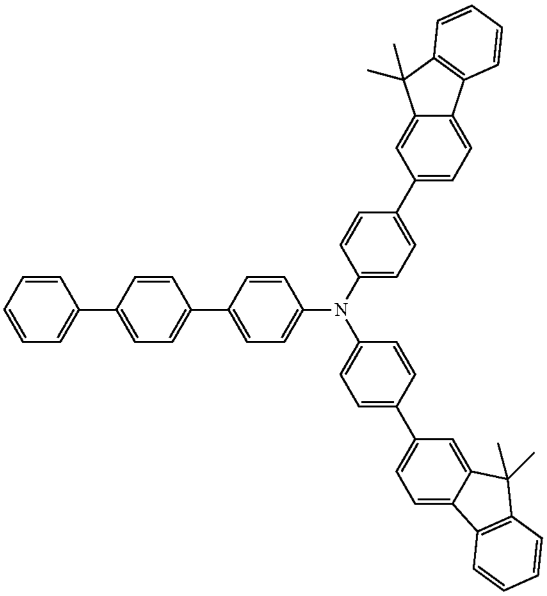
HT21
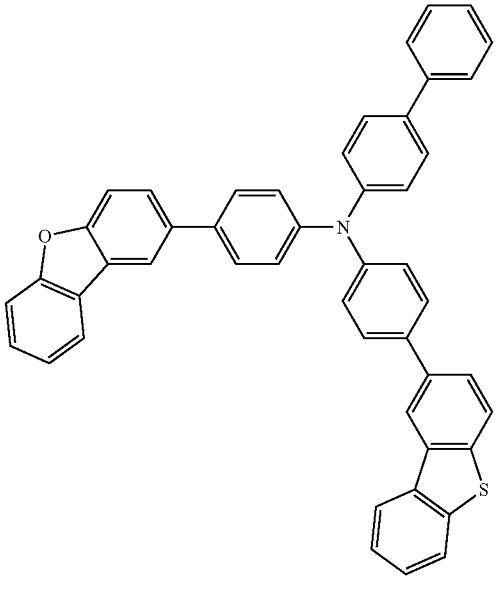
HT22
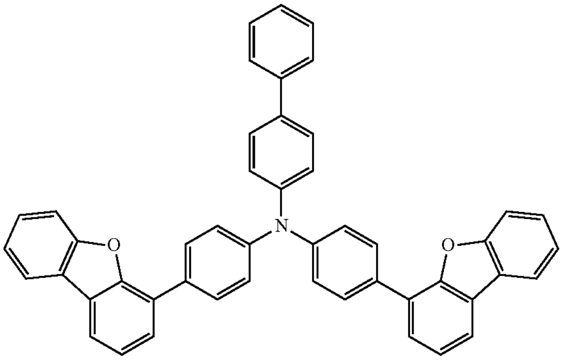

-continued
HT23
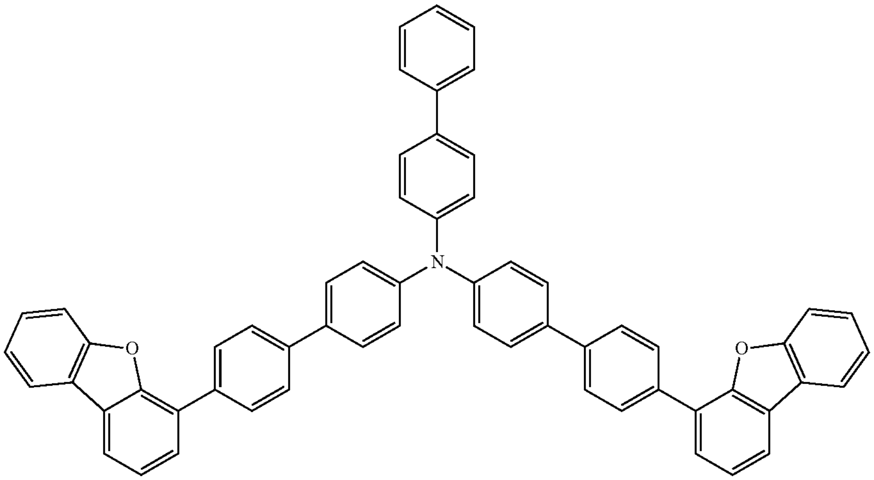
HT24
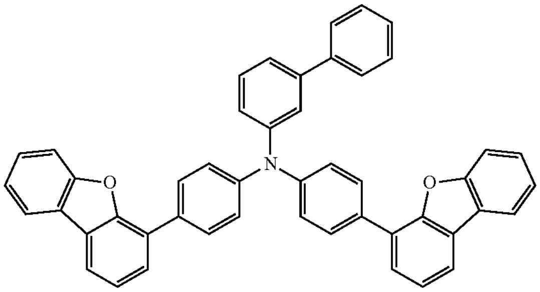
HT25
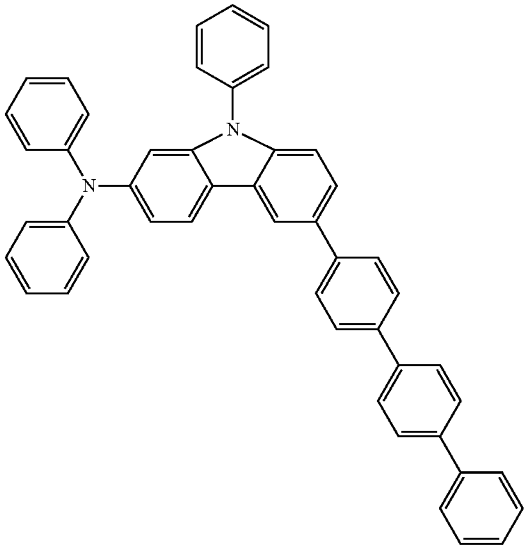
HT26
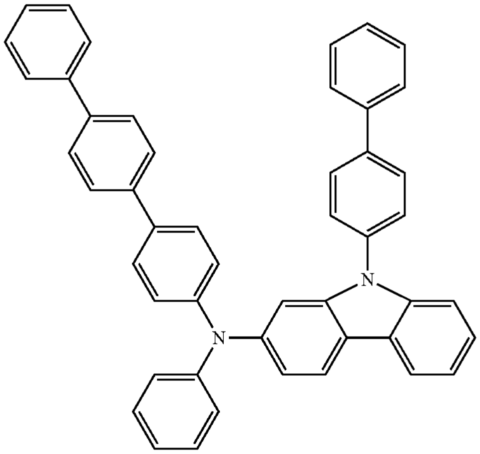
HT27
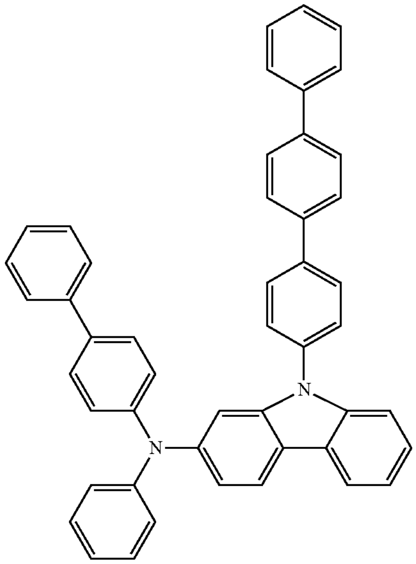

-continued
HT28
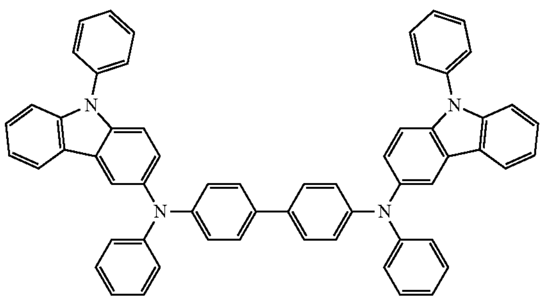
HT29
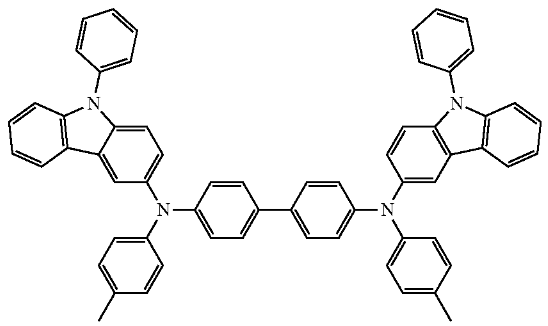
HT30
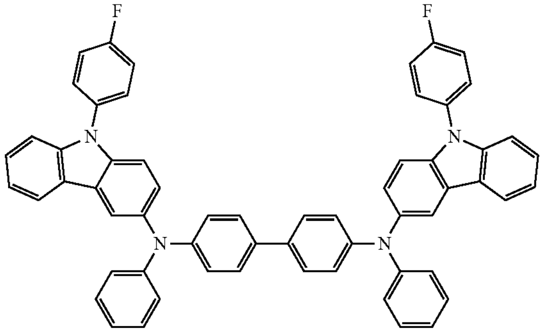
HT31
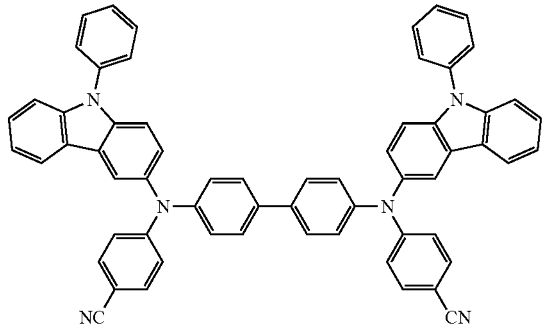
HT32
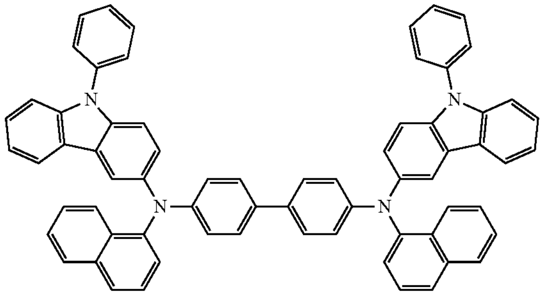
HT33
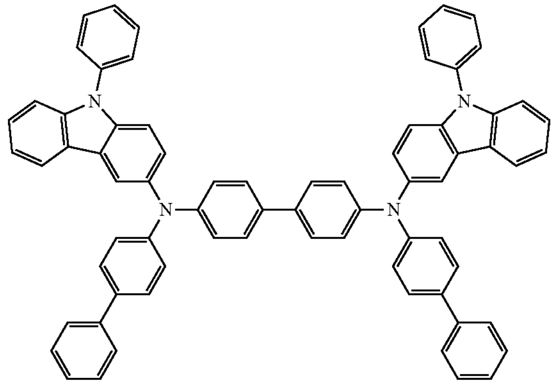
HT34
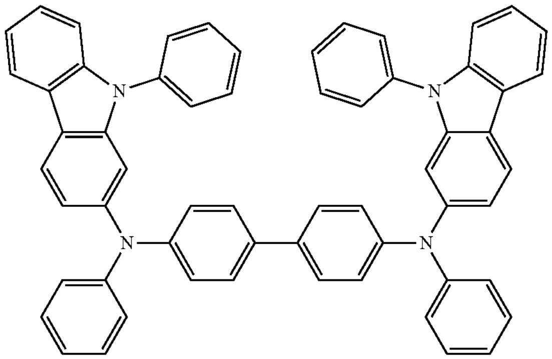
HT35
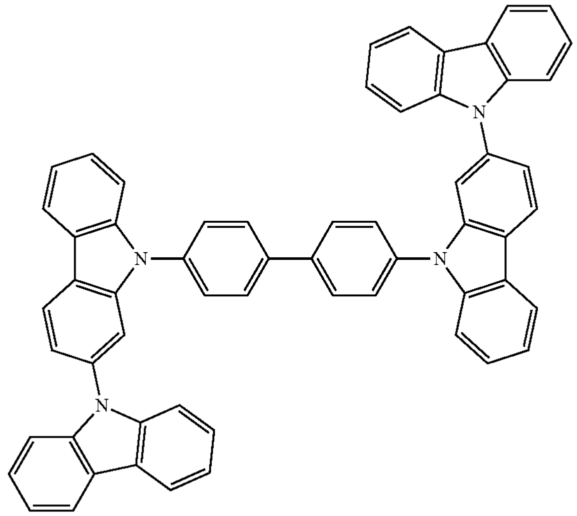

-continued

HT36

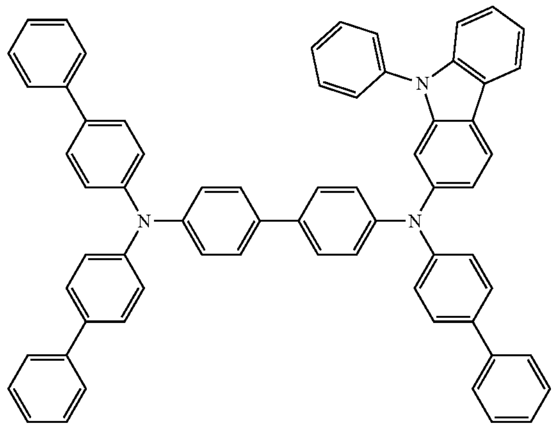

HT37

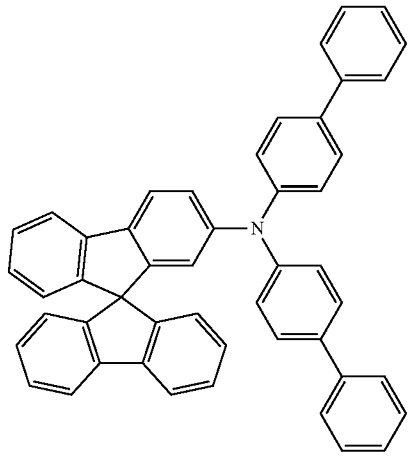

HT38

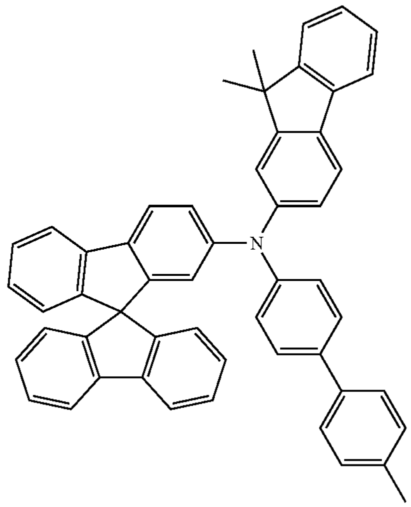

HT39

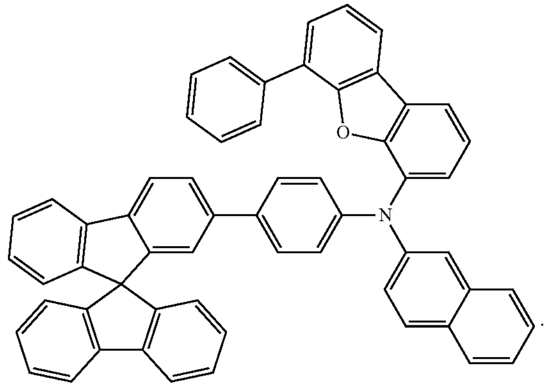

A thickness of the hole transport region may be from about 100 Å to about 10,000 Å, for example, about 100 Å to about 3,000 Å. When the hole transport region includes at least one selected from a hole injection layer and a hole transport layer, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example about 100 Å to about 1,500 Å. When the thicknesses of the hole transport region, the hole injection layer, and the hole transport layer are within any of these ranges, satisfactory (or suitable) hole transporting characteristics may be obtained without a substantial increase in driving voltage.

The emission auxiliary layer may increase light-emission efficiency by compensating for an optical resonance distance according to the wavelength of light emitted by an emission layer, and the electron blocking layer may block or reduce the flow of electrons from an electron transport region. The emission auxiliary layer and the electron blocking layer may include the materials as described above.

p-Dopant

The hole transport region may further include, in addition to the materials described above, a charge-generation material for the improvement of conductive properties. The charge-generation material may be homogeneously or non-homogeneously dispersed in the hole transport region.

The charge-generation material may be, for example, a p-dopant.

In one embodiment, the p-dopant may have a lowest unoccupied molecular orbital (LUMO) energy level of −3.5 eV or less.

The p-dopant may include at least one selected from a quinone derivative, a metal oxide, and a cyano group-containing compound, but embodiments of the present disclosure are not limited thereto.

For example, the p-dopant may include at least one selected from: a quinone derivative, such as tetracyanoquinodimethane (TCNQ) and/or 2,3,5,6-tetrafluoro-7,7,8,8-tetracyanoquinodimethane (F4-TCNQ);

a metal oxide, such as tungsten oxide and/or molybdenum oxide;

1,4,5,8,9,11-hexaazatriphenylene-hexacarbonitrile (HAT-CN); and a compound represented by Formula 221 below:

but embodiments of the present disclosure are not limited thereto:

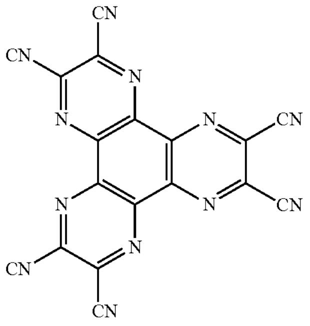

HAT-CN

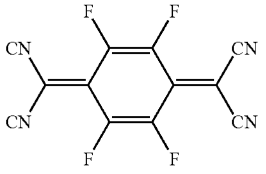

F4-TCNQ

Formula 221

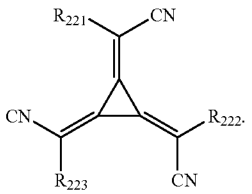

In Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one selected from $R_{221}$ to $R_{223}$ may have at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

Emission Layer in Organic Layer 150

When the organic light-emitting device 10 is a full-color organic light-emitting device, the emission layer may be patterned into a red emission layer, a green emission layer, or a blue emission layer, according to a sub-pixel. In one or more embodiments, the emission layer may have a stacked structure of two or more layers selected from a red emission layer, a green emission layer, and a blue emission layer, in which the two or more layers contact each other or are separated from each other. In one or more embodiments, the emission layer may include two or more materials selected from a red light-emitting material, a green light-emitting material, and a blue light-emitting material, in which the two or more materials are mixed with each other in a single layer to emit white light.

A thickness of the emission layer may be in a range of about 100 Å to about 1,000 Å, for example, about 200 Å to about 600 Å. When the thickness of the emission layer is within this range, excellent (or suitable) light-emission characteristics may be obtained without a substantial increase in driving voltage.

Electron Transport Region in Organic Layer 150

The electron transport region may have i) a single-layered structure including a single layer including a single material, ii) a single-layered structure including a single layer including a plurality of different materials, or iii) a multi-layered structure having a plurality of layers including a plurality of different materials.

The electron transport region may include at least one selected from a buffer layer, a hole blocking layer, an electron control layer, an electron transport layer, and an electron injection layer, but embodiments of the present disclosure are not limited thereto.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein for each structure, constituting layers are sequentially stacked from an emission layer. However, embodiments of the structure of the electron transport region are not limited thereto.

The electron transport region (for example, a buffer layer, a hole blocking layer, an electron control layer, and/or an electron transport layer in the electron transport region) may include a metal-free compound containing at least one π electron-depleted nitrogen-containing ring.

The "π electron-depleted nitrogen-containing ring" refers to a $C_1$-$C_{60}$ heterocyclic group having at least one *—N=*' moiety as a ring-forming moiety.

For example, the "π electron-depleted nitrogen-containing ring" may be i) a 5-membered to 7-membered heteromonocyclic group having at least one *—N=*' moiety, ii) a heteropolycyclic group in which two or more 5-membered to 7-membered heteromonocyclic groups, each having at least one *—N=*' moiety, are condensed with each other, or iii) a heteropolycyclic group in which at least one of 5-membered to 7-membered heteromonocyclic groups, each having at least one *—N=*' moiety, is condensed with at least one $C_5$-$C_{60}$ carbocyclic group.

Examples of the π electron-depleted nitrogen-containing ring include an imidazole, a pyrazole, a thiazole, an isothiazole, an oxazole, an isoxazole, a pyridine, a pyrazine, a pyrimidine, a pyridazine, an indazole, a purine, a quinoline, an isoquinoline, a benzoquinoline, a phthalazine, a naphthyridine, a quinoxaline, a quinazoline, a cinnoline, a phenanthridine, an acridine, a phenanthroline, a phenazine, a benzimidazole, an isobenzothiazole, a benzoxazole, an isobenzoxazole, a triazole, a tetrazole, an oxadiazole, a triazine, a thiadiazole, an imidazopyridine, an imidazopyrimidine, and an azacarbazole, but are not limited thereto.

For example, the electron transport region may include a compound represented by Formula 601 below:

$$[Ar_{601}]_{xe11}\text{-}[(L_{601})_{xe1}\text{-}R_{601}]_{xe21}. \qquad \text{Formula 601}$$

In Formula 601, $Ar_{601}$ may be a substituted or unsubstituted $C_5$-$C_{60}$ carbocyclic group or a substituted or unsubstituted $C_1$-$C_{60}$ heterocyclic group, xe11 may be 1, 2, and/or 3, $L_{601}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xe1 may be an integer from 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_{601})(Q_{602})(Q_{603})$, —$C(=O)(Q_{601})$, —$S(=O)_2(Q_{601})$, and —$P(=O)(Q_{601})(Q_{602})$, $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer from 1 to 5.

In one embodiment, at least one of $Ar_{601}$(s) in the number of xe11 and $R_{601}$(s) in the number of xe21 may include the π electron-depleted nitrogen-containing ring.

In one embodiment, $Ar_{601}$ in Formula 601 may be selected from:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —$Si(Q_{31})(Q_{32})(Q_{33})$, —$S(=O)_2(Q_{31})$, and —$P(=O)(Q_{31})(Q_{32})$, and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is 2 or more, two or more $Ar_{601}$(s) may be linked to each other via a single bond.

In one or more embodiments, $Ar_{601}$ in Formula 601 may be an anthracene group.

In one or more embodiments, a compound represented by Formula 601 may be represented by Formula 601-1 below:

Formula 601-1

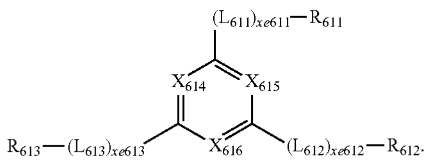

In Formula 601-1, $X_{614}$ may be N or $C(R_{614})$, $X_{615}$ may be N or $C(R_{615})$, $X_{616}$ may be N or $C(R_{616})$, and at least one selected from $X_{614}$ to $X_{616}$ may be N, $L_{611}$ to $L_{613}$ may each be understood by referring to the description provided in connection with $L_{601}$, xe611 to xe613 may each be understood by referring to the description presented in connection with xe1, $R_{611}$ to $R_{613}$ may each be understood by referring to the description provided in connection with $R_{601}$, and $R_{614}$ to $R_{616}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one embodiment, $L_{601}$ and $L_{611}$ to $L_{613}$ in Formulae 601 and 601-1 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, but embodiments of the present disclosure are not limited thereto.

In one or more embodiments, xe1 and xe611 to xe613 in Formulae 601 and 601-1 may each independently be 0, 1, or 2.

In one or more embodiments, $R_{601}$ and $R_{611}$ to $R_{613}$ in Formulae 601 and 601-1 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and —S(=O)$_2$($Q_{601}$), and —P(=O)($Q_{601}$)($Q_{602}$), and $Q_{601}$ and $Q_{602}$ are the same as described above.

The electron transport region may include at least one compound selected from Compounds ET1 to ET36 below, but embodiments of the present disclosure are not limited thereto:

ET1

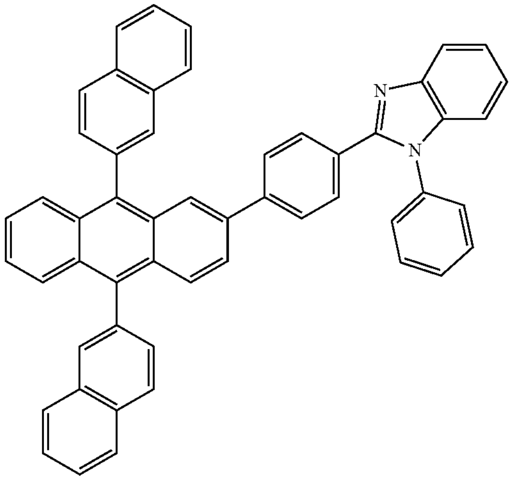

ET2

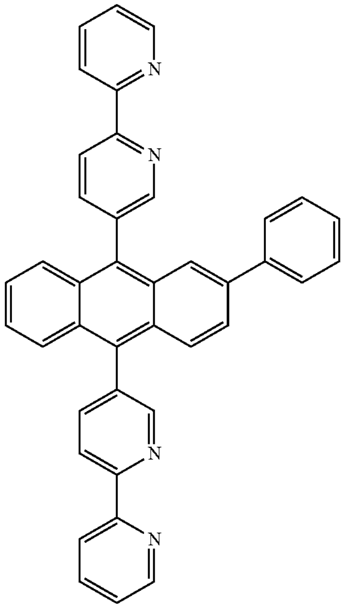

-continued

ET3

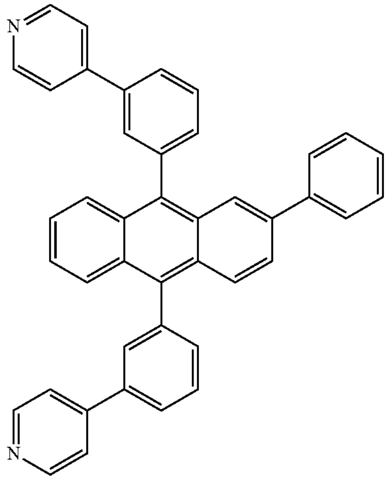

ET4

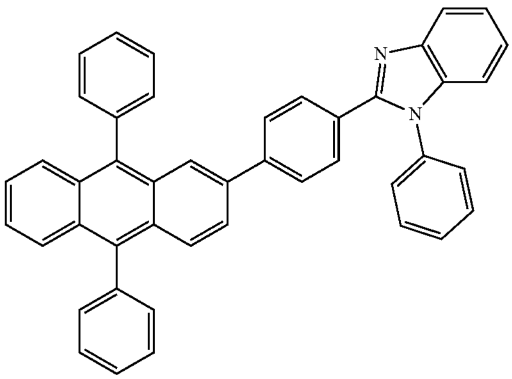

ET5

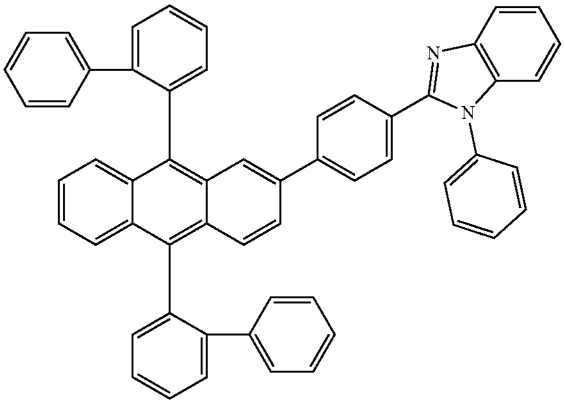

-continued
ET6
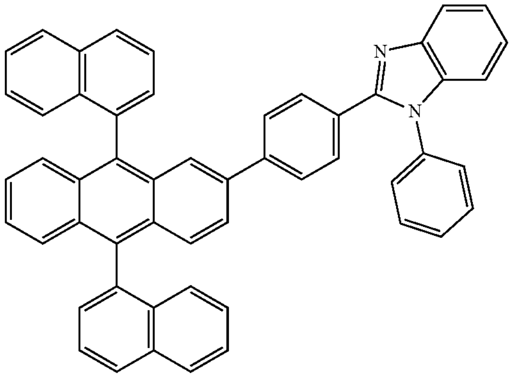
ET7
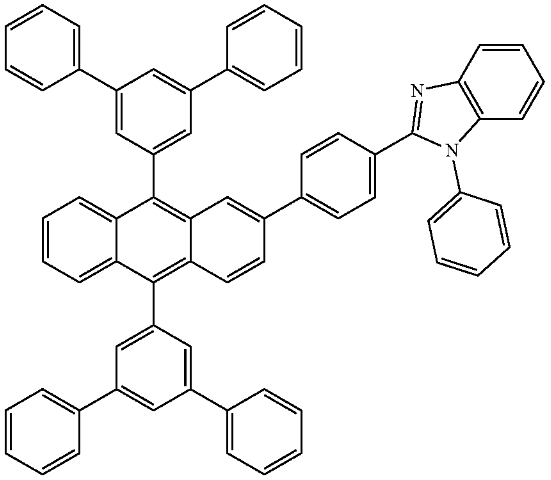
ET8
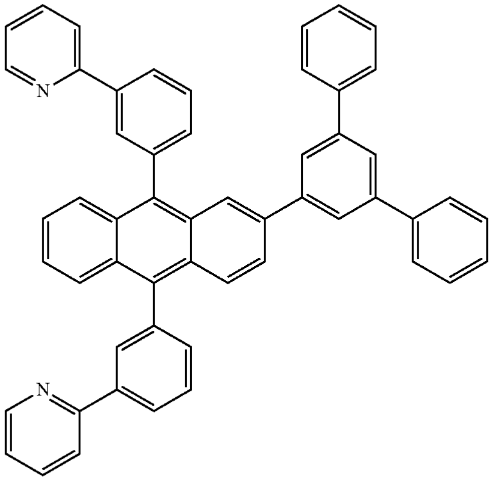
-continued
ET9
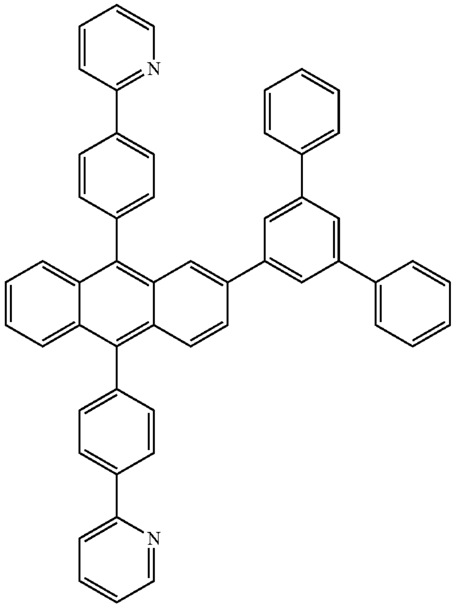
ET10
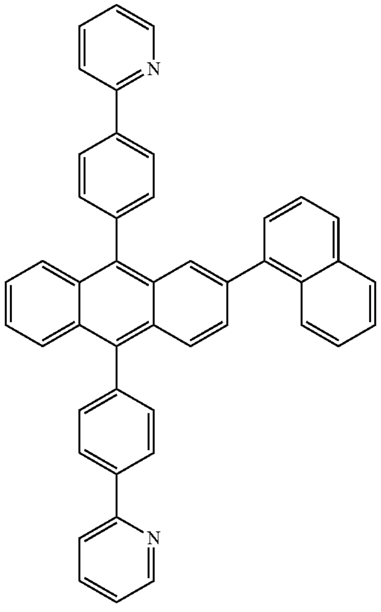

-continued
ET11
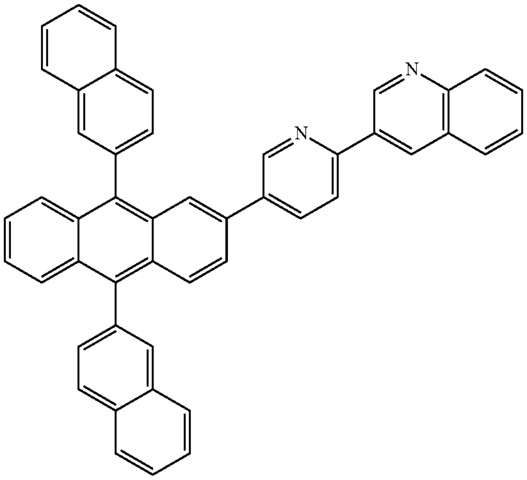
ET12
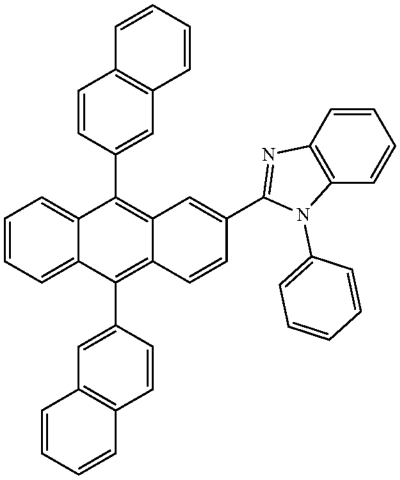
ET13
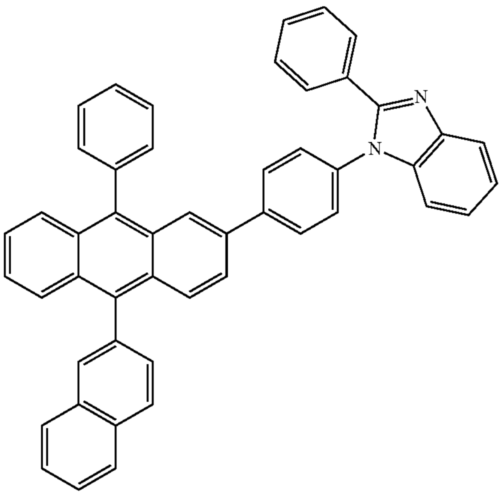
-continued
ET14
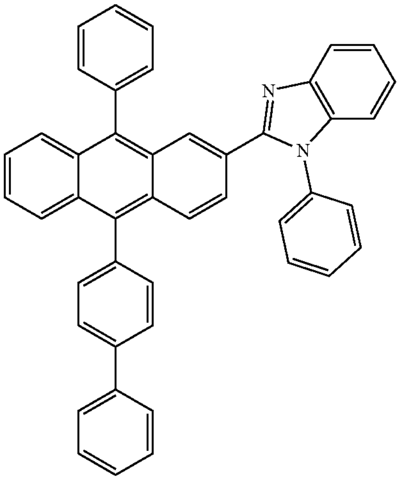
ET15
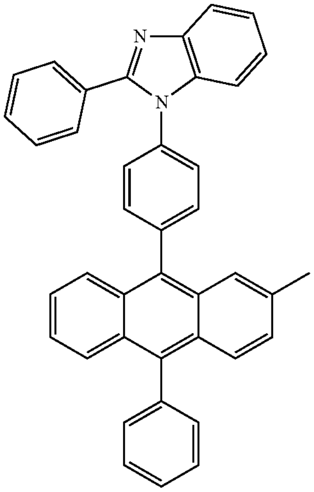
ET16
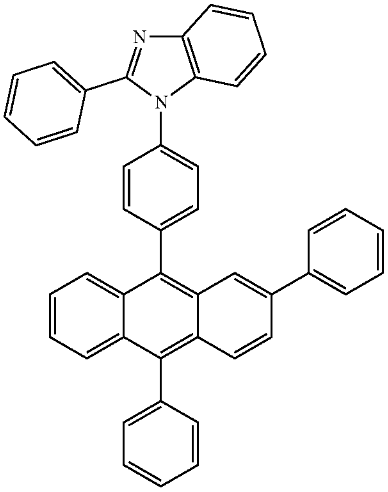

-continued
ET17
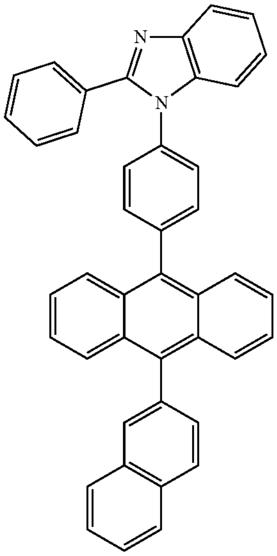
ET18
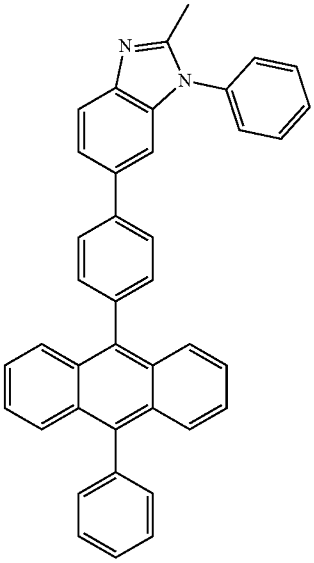
ET19
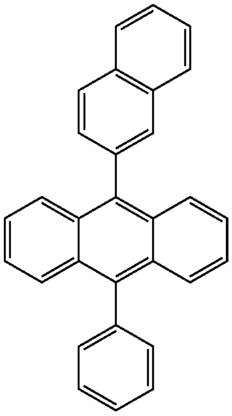
-continued
ET20
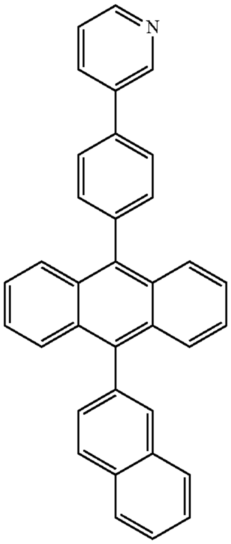
ET21
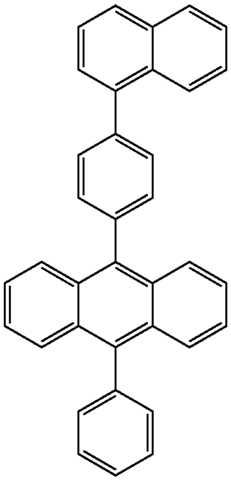
ET22
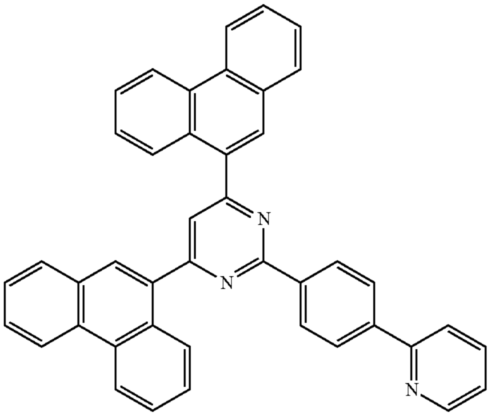

-continued
ET23
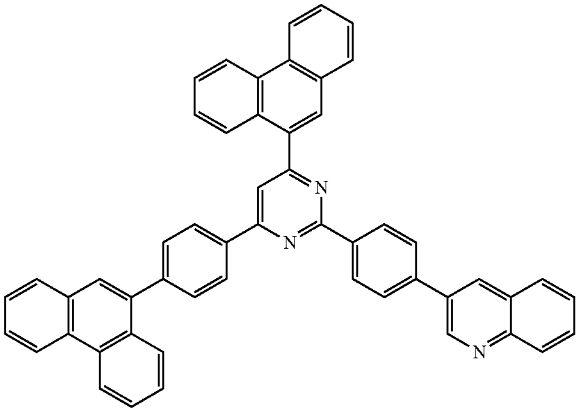
ET24
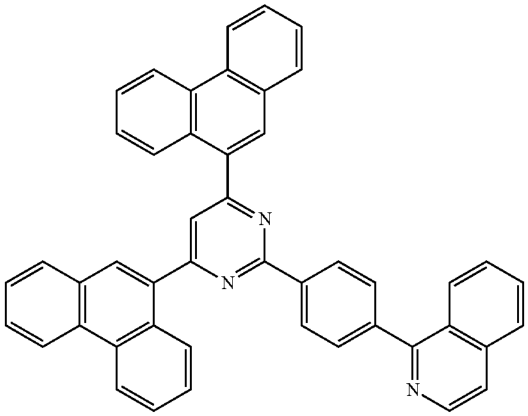
ET25
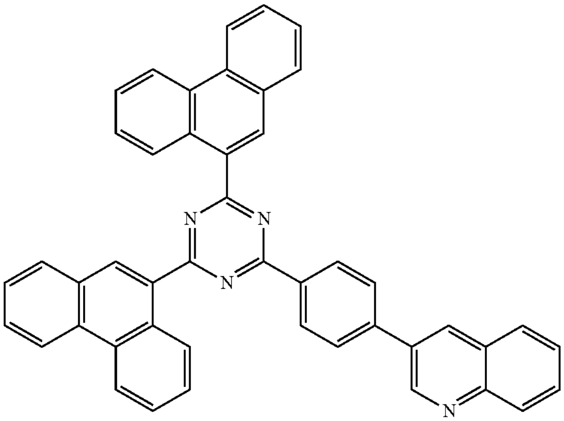
-continued
ET26
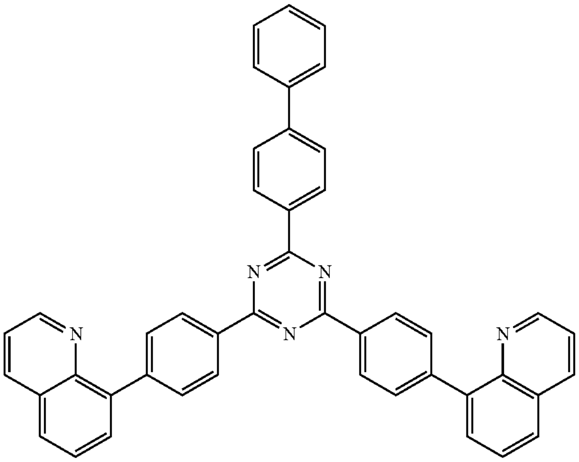
ET27
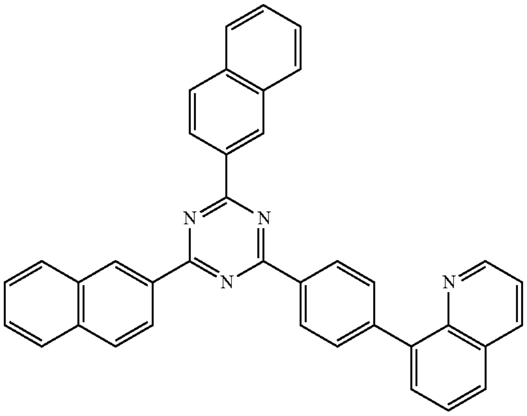
ET28
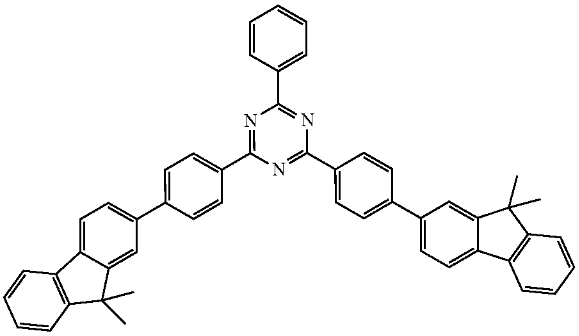

-continued
ET29
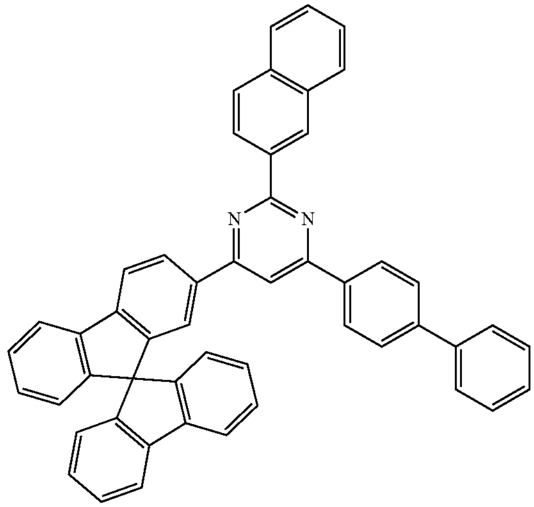
ET30
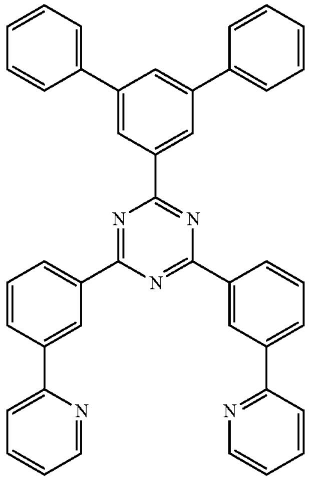
ET31
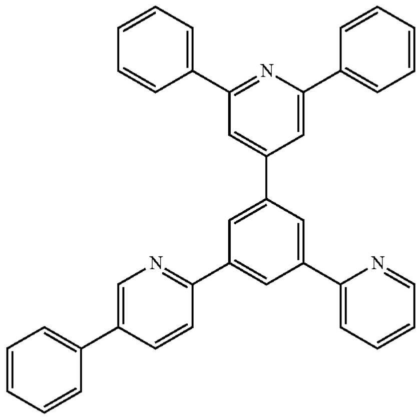
-continued
ET32
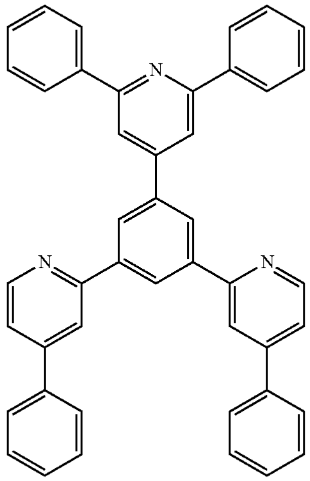
ET33
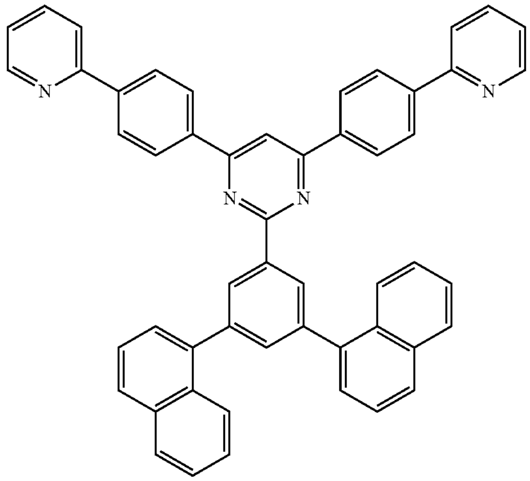
ET34
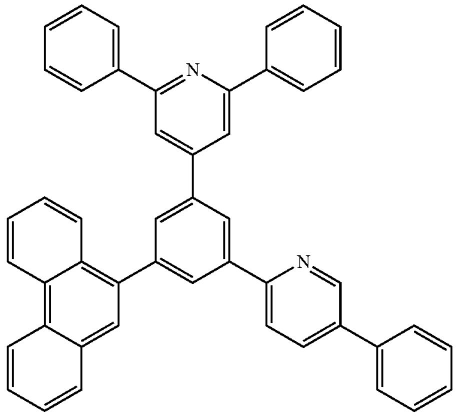

-continued

ET35

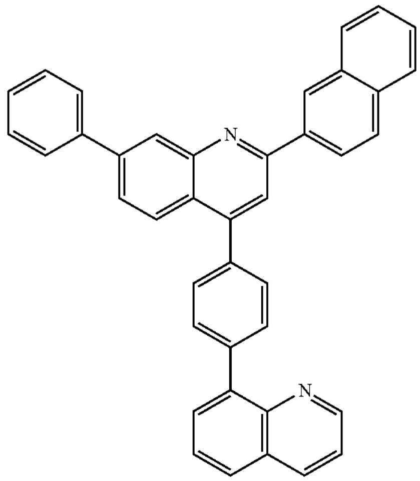

ET36

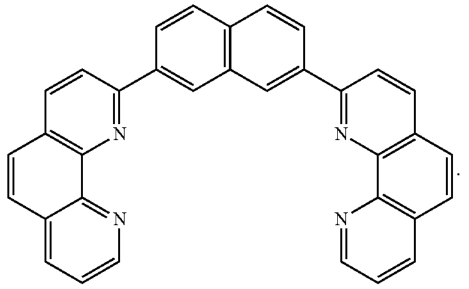

In one or more embodiments, the electron transport region may include at least one compound selected from 2,9-dimethyl-4,7-diphenyl-1,10-phenanthroline (BCP), 4,7-diphenyl-1,10-phenanthroline (Bphen), $Alq_3$, BAlq, 3-(biphenyl-4-yl)-5-(4-tert-butylphenyl)-4-phenyl-4H-1,2,4-triazole (TAZ), NTAZ, and diphenyl(4-(triphenylsilyl)phenyl)-phosphine oxide (TSPO1):

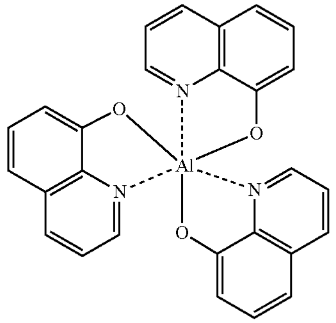

$Alq_3$

-continued

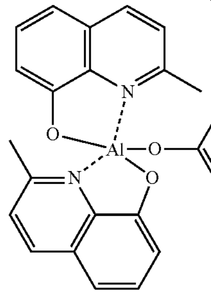

BAlq

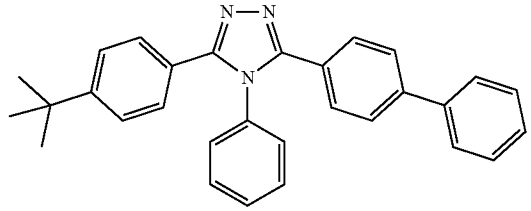

TAZ

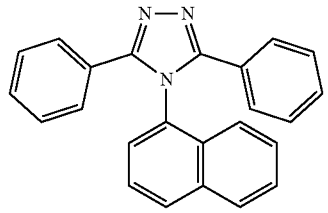

NTAZ

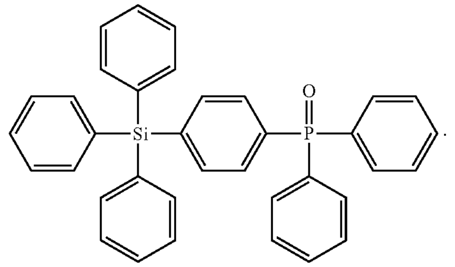

TSPO1

A thickness of the buffer layer, the hole blocking layer, and/or the electron control layer may each independently be in a range of about 20 Å to about 1,000 Å, for example, about 30 Å to about 300 Å. When the thicknesses of the buffer layer, the hole blocking layer, and the electron control layer are within any of these ranges, the electron transport region may have excellent (or suitable) hole blocking characteristics and/or electron control characteristics without a substantial increase in driving voltage.

A thickness of the electron transport layer may be from about 100 Å to about 1,000 Å, for example, about 150 Å to about 500 Å. When the thickness of the electron transport layer is within the range described above, the electron transport layer may have satisfactory (or suitable) electron transport characteristics without a substantial increase in driving voltage.

The electron transport region (for example, the electron transport layer in the electron transport region) may further include, in addition to the materials described above, a metal-containing material.

The metal-containing material may include at least one selected from alkali metal complex and alkaline earth-metal complex. The alkali metal complex may include a metal ion selected from a Li ion, a Na ion, a K ion, a Rb ion, and a Cs ion; and the alkaline earth-metal complex may include a metal ion selected from a Be ion, a Mg ion, a Ca ion, a Sr ion, and a Ba ion. A ligand coordinated with the metal ion of the alkali metal complex or the alkaline earth-metal complex may be selected from a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, and a cyclopentadiene, but embodiments of the present disclosure are not limited thereto.

For example, the metal-containing material may include a Li complex. The Li complex may include, for example, Compound ET-D1 (lithium quinolate, LiQ) and/or Compound ET-D2 below:

ET-D1

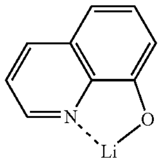

ET-D2

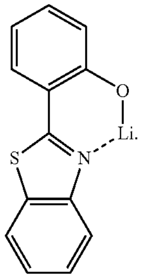

The electron transport region may include an electron injection layer that facilitates electron injection from the second electrode 190. The electron injection layer may be in direct contact with the second electrode 190.

The electron injection layer may have i) a single-layered structure including a single layer including a single material, ii) a single-layered structure including a single layer including a plurality of different materials, or iii) a multi-layered structure having a plurality of layers including a plurality of different materials.

The electron injection layer may include an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combination thereof.

The alkali metal may be selected from Li, Na, K, Rb, and Cs. In one embodiment, the alkali metal may be Li, Na, and/or Cs. In one or more embodiments, the alkali metal may be Li and/or Cs, but embodiments of the present disclosure are not limited thereto.

The alkaline earth metal may be selected from Mg, Ca, Sr, and Ba.

The rare earth metal may be selected from Sc, Y, Ce, Tb, Yb, and Gd.

The alkali metal compound, the alkaline earth-metal compound, and the rare earth metal compound may each independently be selected from oxides and halides (for example, fluorides, chlorides, bromides, and/or iodides) of the alkali metal, the alkaline earth-metal, and the rare earth metal, respectively.

The alkali metal compound may be selected from alkali metal oxides (such as $Li_2O$, $Cs_2O$, and/or $K_2O$), and alkali metal halides (such as LiF, NaF, CsF, KF, LiI, NaI, CsI, and/or KI). In one embodiment, the alkali metal compound may be selected from LiF, $Li_2O$, NaF, LiI, NaI, CsI, and KI, but embodiments of the present disclosure are not limited thereto.

The alkaline earth-metal compound may be selected from alkaline earth-metal oxides, such as BaO, SrO, CaO, $BaxSr_{1-x}O$ ($0<x<1$), and/or $Ba_xCa_{1-x}O$ ($0<x<1$). In one embodiment, the alkaline earth-metal compound may be selected from BaO, SrO, and CaO, but embodiments of the present disclosure are not limited thereto.

The rare earth metal compound may be selected from $YbF_3$, $ScF_3$, $ScO_3$, $Y_2O_3$, $Ce_2O_3$, $GdF_3$ and $TbF_3$. In one embodiment, the rare earth metal compound may be selected from $YbF_3$, $ScF_3$, $TbF_3$, $YbI_3$, $ScI_3$, and $TbI_3$, but embodiments of the present disclosure are not limited thereto.

The alkali metal complex, the alkaline earth-metal complex, and the rare earth metal complex may respectively include an ion of alkali metal, alkaline earth-metal, and rare earth metal as described above, and a ligand coordinated with a metal ion of the alkali metal complex, the alkaline earth-metal complex, or the rare earth metal complex may be selected from hydroxy quinoline, hydroxy isoquinoline, hydroxy benzoquinoline, hydroxy acridine, hydroxy phenanthridine, hydroxy phenyloxazole, hydroxy phenylthiazole, hydroxy diphenyloxadiazole, hydroxy diphenylthiadiazole, hydroxy phenylpyridine, hydroxy phenylbenzimidazole, hydroxy phenylbenzothiazole, bipyridine, phenanthroline, and cyclopentadiene, but embodiments of the present disclosure are not limited thereto.

The electron injection layer may include (e.g., may consist of) an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combination thereof, as described above. In one or more embodiments, the electron injection layer may further include an organic material. When the electron injection layer further includes an organic material, the alkali metal, the alkaline earth metal, the rare earth metal, the alkali metal compound, the alkaline earth-metal compound, the rare earth metal compound, the alkali metal complex, the alkaline earth-metal complex, the rare earth metal complex, or any combinations thereof may be homogeneously or non-homogeneously dispersed in a matrix including the organic material.

A thickness of the electron injection layer may be in a range of about 1 Å to about 100 Å, for example, about 3 Å to about 90 Å. When a thickness of the electron injection layer is within any of these ranges, satisfactory (or suitable) electron injection characteristics may be obtained without substantial increase in driving voltage.

Second Electrode 190

The second electrode 190 is located on the organic layer 150 having the structure according to embodiments of the present disclosure. The second electrode 190 may be a cathode, which is an electron injection electrode, and in this regard, a material for forming the second electrode 190 may be selected from a metal, an alloy, an electrically conductive compound, and a combination thereof, which have a relatively low work function.

The second electrode 190 may include at least one selected from lithium (Li), silver (Ag), magnesium (Mg), aluminum (Al), aluminum-lithium ($A_1$-Li), calcium (Ca), magnesium-indium (Mg—In), magnesium-silver (Mg—Ag), ITO, and IZO, but embodiments of the present disclosure are not limited thereto. The second electrode 190 may be a transmissive electrode, a semi-transmissive electrode, or a reflective electrode.

The second electrode 190 may have a single-layered structure, or a multi-layered structure including two or more layers.

Figure 2:
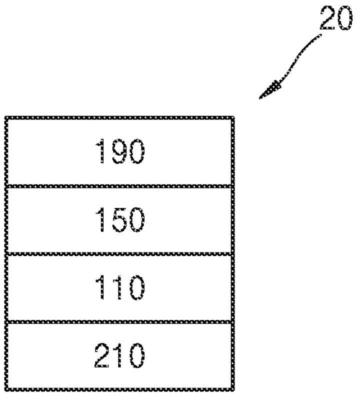
FIG. 2 is a schematic view of an organic light-emitting device according to another embodiment.
Figure 3:
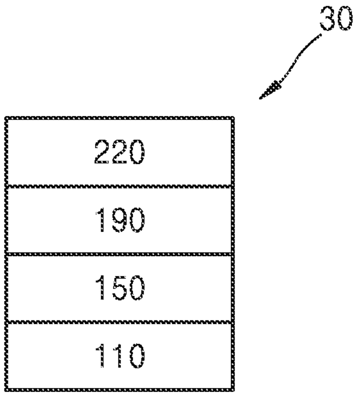
FIG. 3 is a schematic cross-sectional view of an organic light-emitting device according to another embodiment.
Figure 4:
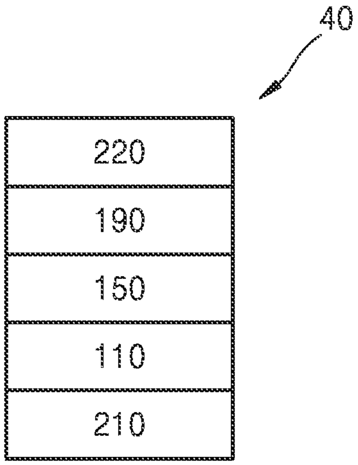
FIG. 4 is a schematic view of an organic light-emitting device according to another embodiment.

Description of FIGS. 2 to 4

An organic light-emitting device 20 of FIG. 2 has a structure in which a first capping layer 210, the first electrode 110, the organic layer 150, and the second electrode 190 are sequentially stacked in this stated order, an organic light-emitting device 30 of FIG. 3 has a structure in which the first electrode 110, the organic layer 150, the second electrode 190, and a second capping layer 220 are sequentially stacked in this stated order, and an organic light-emitting device 40 of FIG. 4 has a structure in which the first capping layer 210, the first electrode 110, the organic layer 150, the second electrode 190, and the second capping layer 220 are sequentially stacked in this stated order.

Regarding FIGS. 2 to 4, the first electrode 110, the organic layer 150, and the second electrode 190 may be understood by referring to the corresponding descriptions provided in connection with FIG. 1.

In the organic layer 150 of each of the organic light-emitting devices 20 and 40, light generated in an emission layer may pass through the first electrode 110 and the first capping layer 210 toward the outside, wherein the first electrode 110 may be a semi-transmissive electrode or a transmissive electrode. In the organic layer 150 of each of the organic light-emitting devices 30 and 40, light generated in an emission layer may pass through the second electrode 190 and the second capping layer 220 toward the outside, wherein the second electrode 190 may be a semi-transmissive electrode or a transmissive electrode.

The first capping layer 210 and the second capping layer 220 may increase external luminescence efficiency according to the principle of constructive interference.

The first capping layer 210 and the second capping layer 220 may each independently be an organic capping layer including an organic material, an inorganic capping layer including an inorganic material, or a composite capping layer including an organic material and an inorganic material.

At least one selected from the first capping layer 210 and the second capping layer 220 may each independently include at least one material selected from carbocyclic compounds, heterocyclic compounds, amine-based compounds, porphyrin derivatives, phthalocyanine derivatives, naphthalocyanine derivatives, alkali metal complexes, and alkaline earth-based complexes. The carbocyclic compound, the heterocyclic compound, and the amine-based compound may each independently be optionally substituted with a substituent containing at least one element selected from O, N, S, Se, Si, F, Cl, Br, and I. In one embodiment, at least one selected from the first capping layer 210 and the second capping layer 220 may each independently include an amine-based compound.

In one embodiment, at least one selected from the first capping layer 210 and the second capping layer 220 may each independently include the compound represented by Formula 201 and/or the compound represented by Formula 202.

In one or more embodiments, at least one selected from the first capping layer 210 and the second capping layer 220 may each independently include a compound selected from Compounds HT28 to HT33 and Compounds CP1 to CP5 below, but embodiments of the present disclosure are not limited thereto:

CP1

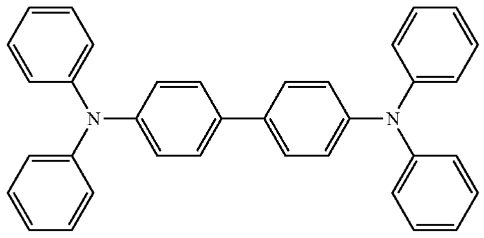

CP2

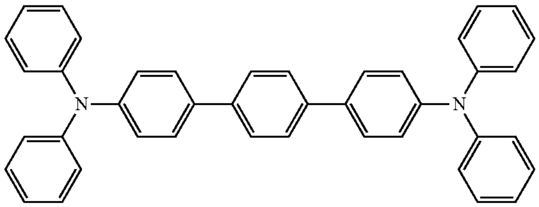

CP3

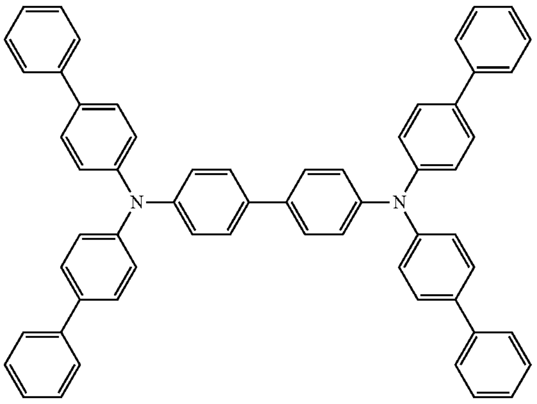

CP4

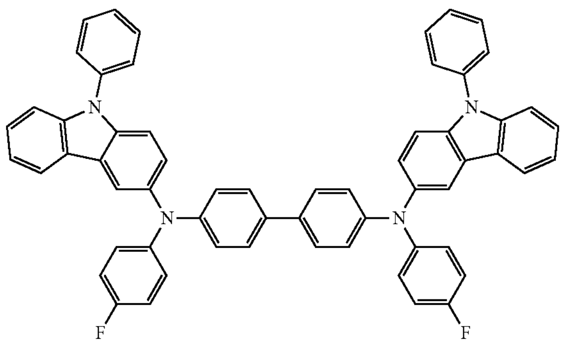

-continued

CP5

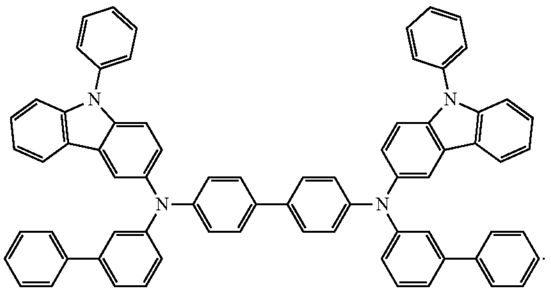

Hereinbefore, the organic light-emitting device according to an embodiment has been described in connection with FIGS. 1 to 4, but embodiments of the present disclosure are not limited thereto.

Layers constituting the hole transport region, an emission layer, and layers constituting the electron transport region may be formed in a certain region by using one or more suitable methods selected from vacuum deposition, spin coating, casting, Langmuir-Blodgett (LB) deposition, ink-jet printing, laser-printing, and laser-induced thermal imaging (LITI).

When layers constituting the hole transport region, the emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, by taking into account a material to be included in a layer to be formed, and the structure of a layer to be formed.

When layers constituting the hole transport region, the emission layer, and layers constituting the electron transport region are formed by spin coating, the spin coating may be performed at a coating speed of about 2,000 rpm to about 5,000 rpm and at a heat treatment temperature of about 80° C. to 200° C., by taking into account a material to be included in a layer to be formed, and the structure of a layer to be formed.

Apparatus

The organic light-emitting device may be included in various suitable apparatuses.

One example of such apparatuses may include: a thin-film transistor including a source electrode, a drain electrode, and an activation layer; and the organic light-emitting device. Here, the first electrode of the organic light-emitting device may be in electrical contact with the source electrode or the drain electrode of the thin-film transistor.

The thin-film transistor may further include a gate electrode, a gate insulation layer, and/or the like.

The active layer may include crystalline silicon, amorphous silicon, organic semiconductor, oxide semiconductor, and/or the like, but embodiments of the present disclosure are not limited thereto.

The apparatus may further include a sealing part for sealing (to seal) the organic light-emitting device. The sealing part may allow an image from the organic light-emitting device to be implemented and may block (or reduce) outside air and/or moisture from penetrating into the organic light-emitting device. The sealing part may be a sealing substrate including a transparent glass and/or a plastic substrate. The sealing part may be a thin film encapsulation layer including a plurality of organic layers and/or a plurality of inorganic layers. When the sealing part is a thin film encapsulation layer, the entire apparatus may be flexible.

For example, the apparatus may be a light-emitting apparatus, an authentication apparatus, and/or an electronic apparatus.

The light-emitting apparatus may be used as various suitable displays, light sources, and/or the like.

The authentication apparatus may be, for example, a biometric authentication apparatus for authenticating (to authenticate) an individual by using biometric information of a biometric body (for example, a fingertip, a pupil, and/or the like). The authentication apparatus may further include, in addition to the organic light-emitting device, a biometric information collector.

The electronic apparatus may be applied to personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram (ECG) displays, ultrasonic diagnostic devices, and/or endoscope displays), fish finders, various measuring instruments, meters (for example, meters for a vehicle, an aircraft, and/or a vessel), projectors, and/or the like, but embodiments of the present disclosure are not limited thereto.

General Definition of Substituents

The term "π electron-depleted nitrogen-containing cyclic group" as used herein refers to a cyclic group having at least one *—N=*' moiety, and non-limiting examples thereof include an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group.

The π electron-depleted nitrogen-free cyclic group may be selected from a benzene group, a heptalene group, an indene group, a naphthalene group, an azulene group, a heptalene group, an indacene group, acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentacene group, a rubicene group, a coronene group, an ovalene group, a pyrrole group, an isoindole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group and a triindolobenzene group, but embodiments of the present disclosure are not limited thereto.

The term "transition metal of Period 4 of the Periodic Table of Elements" as used herein refers to an element of Period 4 and the d-block of the Periodic Table of Elements, and non-limiting examples thereof include scandium (Sc), titanium (Ti), vanadium (V), chromium (Cr), manganese (Mn), iron (Fe), cobalt (Co), nickel (Ni), copper (Cu), and zinc (Zn).

The term "transition metal of Period 5 of the Periodic Table of Elements" as used herein refers to an element of Period 5 and the d-block of the Periodic Table of Elements, and non-limiting examples thereof include yttrium (Y), zirconium (Zr), niobium (Nb), molybdenum (Mo), technetium (Tc), ruthenium (Ru), rhodium (Rh), palladium (Pd), silver (Ag), and cadmium (Cd).

The term "transition metal of Period 6 of the Periodic Table of Elements" as used herein refers to an element of Period 6 and the d-block and the f-block of the Periodic Table of Elements, and non-limiting examples thereof include lanthanum (La), samarium (Sm), europium (Eu), terbium (Tb), thulium (Tm), ytterbium (Yb), lutetium (Lu), hafnium (Hf), tantalum (Ta), tungsten (W), rhenium (Re), osmium (Os), iridium (Ir), platinum (Pr), gold (Au), and mercury (Hg).

The term "$C_1$-$C_{60}$ alkyl group" as used herein refers to a linear or branched aliphatic saturated hydrocarbon monovalent group having 1 to 60 carbon atoms, and non-limiting examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as that of the $C_1$-$C_{60}$ alkyl group.

The term "$C_2$-$C_{60}$ alkenyl group" as used herein refers to a hydrocarbon group having at least one carbon-carbon double bond in, for example, the middle and/or at the terminus of the $C_2$-$C_{60}$ alkyl group, and non-limiting examples thereof include an ethenyl group, a propenyl group, and a butenyl group. The term "$C_2$-$C_{60}$ alkenylene group" as used herein refers to a divalent group having the same structure as that of the $C_2$-$C_{60}$ alkenyl group.

The term "$C_2$-$C_{60}$ alkynyl group" as used herein refers to a hydrocarbon group having at least one carbon-carbon triple bond in the middle or at the terminus of the $C_2$-$C_{60}$ alkyl group, and non-limiting examples thereof include an ethynyl group, and a propynyl group. The term "$C_2$-$C_6$ alkynylene group" as used herein refers to a divalent group having the same structure as that of the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and non-limiting examples thereof include a methoxy group, an ethoxy group, and an isopropyloxy group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as that of the $C_3$-$C_{10}$ cycloalkyl group.

The term "$C_1$-$C_{10}$ heterocycloalkyl group" as used herein refers to a monovalent monocyclic group having at least one heteroatom selected from N, O, Si, P, and S as a ring-forming atom and 1 to 10 carbon atoms as the remaining ring-forming atoms, and non-limiting examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as that of the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, Si, P, and S as a ring-forming atom, 1 to 10 carbon atoms as the remaining ring-forming atoms, and at least one carbon-carbon double bond in its ring. Non-limiting examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having the same structure as that of the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. The term "$C_6$-$C_{60}$ arylene group" used herein refers to a divalent group having the same structure as the $C_6$-$C_{60}$ aryl group. When the $C_6$-$C_{60}$ aryl group and the $C_6$-$C_{60}$ arylene group each independently include two or more rings, the respective rings may be fused to each other.

The term "$C_1$-$C_{60}$ heteroaryl group" as used herein refers to a monovalent group having a carbocyclic aromatic system that has at least one heteroatom selected from N, O, Si, P, and S as a ring-forming atom, in addition to 1 to 60 carbon atoms. Non-limiting examples of the $C_1$-$C_6$ heteroaryl group include a pyridinyl group, a pyrimidinyl group, a pyrazinyl group, a pyridazinyl group, a triazinyl group, a quinolinyl group, and an isoquinolinyl group. The term "$C_1$-$C_{60}$ heteroarylene group" as used herein refers to a divalent group having the same structure as the $C_1$-$C_{60}$ heteroaryl group. When the $C_1$-$C_{60}$ heteroaryl group and the $C_1$-$C_{60}$ heteroarylene group each independently include two or more rings, the respective rings may be condensed (fused) with each other.

The term "$C_6$-$C_{60}$ aryloxy group" as used herein refers to a group represented by —$OA_{102}$ (wherein $A_{102}$ is the $C_6$-$C_{60}$ aryl group), and the term "$C_6$-$C_{60}$ arylthio group" as used herein refers to a group represented by —$SA_{103}$ (wherein $A_{103}$ is the $C_6$-$C_{60}$ aryl group).

The term "$C_1$-$C_{60}$ heteroaryloxy group" as used herein refers to a monovalent group represented by —$OA_{104}$ (wherein $A_{104}$ is the $C_1$-$C_{60}$ heteroaryl group), and the term "$C_1$-$C_{60}$ heteroarylthio group" as used herein refers to —$SA_{105}$ (wherein $A_{105}$ is the $C_1$-$C_6$ heteroaryl group).

The term "monovalent non-aromatic condensed polycyclic group" as used herein refers to a monovalent group having two or more rings condensed with each other, only carbon atoms as ring-forming atoms (for example, 8 to 60 carbon atoms), and no aromaticity in its entire molecular structure (e.g., the molecular structure as a whole is non-aromatic). A non-limiting example of the monovalent non-aromatic condensed polycyclic group is a fluorenyl group. The term "divalent non-aromatic condensed polycyclic group" as used herein refers to a divalent group having the same structure as that of the monovalent non-aromatic condensed polycyclic group.

The term "monovalent non-aromatic condensed heteropolycyclic group" as used herein refers to a monovalent group having two or more rings condensed to each other, at least one heteroatom selected from N, O, Si, P, and S, other than carbon atoms (for example, 1 to 60 carbon atoms), as a ring-forming atom, and no aromaticity in its entire molecular structure (e.g., the molecular structure as a whole is non-aromatic). A non-limiting example of the monovalent non-aromatic condensed heteropolycyclic group is a carbazolyl group. The term "divalent non-aromatic condensed heteropolycyclic group" as used herein refers to a divalent group having the same structure as that of the monovalent non-aromatic condensed heteropolycyclic group.

The term "$C_5$-$C_{60}$ carbocyclic group" as used herein refers to a monocyclic or polycyclic group having 5 to 60 carbon atoms in which ring-forming atoms are carbon atoms only. The term "$C_5$-$C_{60}$ carbocyclic group" as used herein refers to an aromatic carbocyclic group or a non-aromatic carbocyclic group. The $C_5$-$C_{60}$ carbocyclic group may be a ring (such as benzene), a monovalent group (such as a phenyl group), or a divalent group (such as a phenylene group). In one or more embodiments, depending on the number of substituents connected to the $C_5$-$C_{60}$ carbocyclic group, the $C_5$-$C_{60}$ carbocyclic group may be a trivalent group or a quadrivalent group.

The term "$C_1$-$C_{60}$ heterocyclic group" as used herein refers to a group having the same structure as the $C_5$-$C_{60}$ carbocyclic group, except that as a ring-forming atom, at least one heteroatom selected from N, O, Si, P, and S is used in addition to carbon atoms (the number of carbon atoms may be in a range of 1 to 60).

In the present specification, at least one substituent of the substituted $C_5$-$C_{60}$ carbocyclic group, the substituted $C_1$-$C_6$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_6$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_6$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted $C_1$-$C_{60}$ heteroaryloxy group, the substituted $C_1$-$C_6$ heteroarylthio group, the substituted monovalent non-aromatic condensed polycyclic group, and the substituted monovalent non-aromatic condensed heteropolycyclic group may be selected from:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_6$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, and —$P(=O)(Q_{11})(Q_{12})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazine group, a hydrazone group, a $C_1$-$C_6$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, and —$P(=O)(Q_{21})(Q_{22})$; and —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, and $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group substituted with at least one selected from deuterium, —F, and a cyano group, a $C_6$-$C_{60}$ aryl group substituted with at least one selected from deuterium, —F, and a cyano group, a biphenyl group, and a terphenyl group.

The term "Ph" as used herein refers to a phenyl group, the term "Me" as used herein refers to a methyl group, the term "Et" as used herein refers to an ethyl group, the term "ter-Bu" or "$Bu^t$" as used herein refers to a tert-butyl group, the term "OMe" as used herein refers to a methoxy group, and "D" refers to deuterium.

The term "biphenyl group" as used herein refers to "a phenyl group substituted with a phenyl group". For example, the "biphenyl group" may be a substituted phenyl group having a $C_6$-$C_{60}$ aryl group as a substituent.

The term "terphenyl group" as used herein refers to "a phenyl group substituted with a biphenyl group". For example, the "terphenyl group" may be a phenyl group having, as a substituent, a $C_6$-$C_{60}$ aryl group substituted with a $C_6$-$C_{60}$ aryl group.

* and *' as used herein, unless defined otherwise, each refer to a binding site to a neighboring atom in a corresponding formula.

Hereinafter, a compound according to embodiments and an organic light-emitting device according to embodiments will be described in more detail with reference to Synthesis Examples and Examples. The phrase "B was used instead of A" used in describing Synthesis Examples may refer to a case where an identical molar equivalent of B was used in place of A.

EXAMPLE

Evaluation Example 1: Evaluation of $T_1$, $S_1$, $K_{RISC}$, f, and HOMO Energy Level By using the above methods, the $T_{1onset}$, $T_{1max}$, $S_{1onset}$, $S_{1max}$, $K_{RISC}$ and/or f of the following compounds were evaluated. The results are shown in Tables 1 to 5.

TABLE 1

| First compound | $T_{1onset}$ (eV) of first compound | $T_{1max}$ (eV) of first compound |
|---|---|---|
| HT-07 | 2.93 | 2.85 |
| HT-09 | 3.01 | 2.85 |
| HT-11 | 2.99 | 2.88 |
| HT-12 | 3.06 | 2.90 |
| HT-13 | 2.89 | 2.81 |
| HT-14 | 3.00 | 2.91 |
| HT-15 | 2.99 | 2.91 |

TABLE 2

| Second compound | $T_{1onset}$ (eV) of second compound | $T_{1max}$ (eV) of second compound |
|---|---|---|
| ET06 | 3.07 | 2.87 |
| ET08 | 3.06 | 2.85 |
| ET09 | 2.99 | 2.81 |
| ET11 | 2.95 | 2.83 |
| ET13 | 3.02 | 2.85 |
| ET14 | 2.93 | 2.79 |
| ET15 | 2.98 | 2.85 |

TABLE 3

| Third compound | $T_{1onset}$ (eV) of third compound | $T_{1max}$ (eV) of third compound |
|---|---|---|
| 9 | 2.86 | 2.75 |
| 19 | 2.88 | 2.78 |
| 23 | 2.90 | 2.78 |
| 25 | 2.79 | 2.69 |
| 28 | 2.81 | 2.70 |
| 33 | 2.83 | 2.71 |
| 36 | 2.78 | 2.73 |

TABLE 4

| Fourth compound | $S_{1onset}$ (eV) of fourth compound | $S_{1max}$ (eV) of fourth compound | $k_{RISC}$ ($10^3 S^{-1}$) of fourth compound | f of fourth compound |
|---|---|---|---|---|
| D-03 | 2.79 | 2.66 | 15 | 0.32 |
| D-07 | 2.69 | 2.65 | 27 | 0.55 |
| D-10 | 2.71 | 2.65 | 34 | 0.6 |
| D-15 | 2.71 | 2.66 | 16 | 0.35 |
| D-19 | 2.72 | 2.67 | 11 | 0.28 |
| D-20 | 2.73 | 2.65 | 32 | 0.52 |
| D-22 | 2.77 | 2.68 | 22 | 0.39 |
| DCJTB | 2.25 | 1.90 | ~0 | 0.80 |

TABLE 5

| Hole Blocking Material | $T_{1onset}$ (eV) of hole blocking material | $T_{1max}$ (eV) of hole blocking material |
|---|---|---|
| HBL03 | 3.07 | 2.95 |
| HBL05 | 3.06 | 2.92 |
| HBL07 | 2.99 | 2.88 |
| HBL09 | 2.99 | 2.80 |
| HBL011 | 3.02 | 2.95 |
| HBL014 | 2.93 | 2.81 |
| HBL015 | 2.98 | 2.83 |

Example 1-1

As an anode, an indium tin oxide (ITO)-deposited substrate was cut to a size of 50 mm×50 mm×0.5 mm and sonicated for 5 minutes using isopropyl alcohol and pure water, and then, cleaned by irradiation of ultraviolet rays for 30 minutes and exposure to ozone. The resultant ITO substrate was mounted on a vacuum deposition apparatus.

m-MTDATA was deposited on the ITO substrate to form a hole injection layer having a thickness of 40 Å, followed by vacuum deposition of NPB on the hole injection layer to form a hole transport layer having a thickness of 10 Å, and compounds HT-07, ET-06, PT9, and D-10 were co-deposited on the hole transport layer at a weight ratio of 30:70:15:1 to form an emission layer having a thickness of 200 Å. Compound ET-1 was deposited on the emission layer to form an electron transport layer having a thickness of 300 Å. $A_1$ was deposited on the electron transport layer to form a cathode having a thickness of 1200 Å, thereby completing the manufacture of an organic light-emitting device.

Examples 1-2 to 1-10 and Comparative Examples 1-1 to 1-20

Organic light-emitting devices were manufactured in substantially the same manner as in Example 1-1, except that emission layers were respectively formed using compounds shown in Table 6. The third compound is selected from Group III-II.

Evaluation Example 2

The efficiency, emission wavelength, and lifespan of the organic light-emitting devices manufactured according to Examples 1-1 to 1-10 and Comparative Examples 1-1 to 1-20 were measured using a Keithley SMU 236 and luminance meter PR650 at a current density of 10 mA/cm$^2$. The results are shown in Table 6. The lifespan is a measure of how long it took for luminance to reach 90% of initial luminance.

TABLE 6

| | Emission layer | | | | | | |
|---|---|---|---|---|---|---|---|
| | First compound | Second compound | Third compound | Fourth compound | Weight ratio (C1:C2:C3:C4) | Efficiency (cd/A) | Lifespan (hr) |
| Example 1-1 | HT-07 | ET-06 | PT9 | D-10 | 30:70:15:1 | 25.0 | 21 |
| Example 1-2 | HT-07 | ET-08 | PT9 | D-07 | 50:50:15:1 | 26.9 | 23 |
| Example 1-3 | HT-09 | ET-09 | PT19 | D-20 | 30:70:15:1 | 20.9 | 29 |
| Example 1-4 | HT-09 | ET-11 | PT23 | D-20 | 70:30:15:1 | 24.8 | 21 |
| Example 1-5 | HT-11 | ET-13 | PT23 | D-07 | 50:50:15:1 | 26.7 | 24 |
| Example 1-6 | HT-11 | ET-14 | PT25 | D-10 | 50:50:15:1 | 26.9 | 31 |
| Example 1-7 | HT-13 | ET-15 | PT25 | D-10 | 70:30:15:1 | 34.2 | 28 |
| Example 1-8 | HT-13 | ET-06 | PT28 | D-10 | 50:50:15:1 | 29.8 | 23 |
| Example 1-9 | HT-14 | ET-15 | PT33 | D-07 | 30:70:15:1 | 33.7 | 32 |
| Example 1-10 | HT-15 | ET-09 | PT36 | D-20 | 60:40:15:1 | 30.5 | 27 |
| Comparative Example 1-1 | HT-07 | — | PT9 | D-10 | 100:0:15:1 | 20.7 | 15 |
| Comparative Example 1-2 | — | ET-08 | PT9 | D-07 | 0:100:15:1 | 15.1 | 10 |
| Comparative Example 1-3 | HT-09 | ET-09 | — | D-20 | 30:70:0:1 | 15.1 | 14 |
| Comparative Example 1-4 | HT-09 | ET-11 | — | D-20 | 30:70:0:1 | 15.3 | 13 |
| Comparative Example 1-5 | HT-11 | ET-13 | — | D-07 | 70:30:0:1 | 14.7 | 10 |
| Comparative Example 1-6 | HT-11 | ET-14 | PT25 | — | 50:50:15:0 | 20.9 | 15 |
| Comparative Example 1-7 | HT-13 | ET-15 | — | D-10 | 70:30:0:1 | 16.5 | 13 |
| Comparative Example 1-8 | HT-13 | ET-06 | PT28 | — | 50:50:15:0 | 19.0 | 19 |
| Comparative Example 1-9 | HT-14 | ET-15 | PT33 | — | 30:70:15:0 | 22.1 | 15 |
| Comparative Example 1-10 | CBP | | PT33 | — | 100:15:0 | 13.5 | 17 |
| Comparative Example 1-11 | HT-07 | ET-06 | PT9 | DCJTB | 30:70:15:1 | 8.7 | 21 |
| Comparative Example 1-12 | HT-07 | ET-08 | PT9 | DCJTB | 50:50:15:1 | 13.5 | 21 |
| Comparative Example 1-13 | HT-09 | ET-09 | PT19 | DCJTB | 30:70:15:1 | 14.3 | 17 |
| Comparative Example 1-14 | HT-09 | ET-11 | PT23 | DCJTB | 70:30:15:1 | 13.8 | 17 |
| Comparative Example 1-15 | HT-11 | ET-13 | PT23 | DCJTB | 50:50:15:1 | 13.0 | 20 |
| Comparative Example 1-16 | HT-11 | ET-14 | PT25 | DCJTB | 50:50:15:1 | 13.4 | 16 |
| Comparative Example 1-17 | HT-13 | ET-15 | PT25 | DCJTB | 70:30:15:1 | 14.8 | 18 |
| Comparative Example 1-18 | HT-13 | ET-06 | PT28 | DCJTB | 50:50:15:1 | 14.4 | 19 |
| Comparative Example 1-19 | HT-14 | ET-15 | PT33 | DCJTB | 30:70:15:1 | 14.1 | 20 |
| Comparative Example 1-20 | HT-15 | ET-09 | PT36 | DCJTB | 60:40:15:1 | 14.1 | 15 |

Table 6 shows that the organic light-emitting devices of Examples 1-1 to 1-10 have improved current efficiency and lifespan as compared with the organic light-emitting devices of Comparative Examples 1-1 to 1-20.

Example 2-1

As an anode, an indium tin oxide (ITO)-deposited substrate was cut to a size of 50 mm×50 mm×0.5 mm and sonicated for 5 minutes using isopropyl alcohol and pure water, and then, cleaned by irradiation of ultraviolet rays for 30 minutes and exposure to ozone. The resultant ITO substrate was mounted on a vacuum deposition apparatus.

m-MTDATA was deposited on the ITO substrate to form a hole injection layer having a thickness of 40 Å, followed by vacuum deposition of NPB on the hole injection layer to form a hole transport layer having a thickness of 10 Å, and compounds HT-07, ET-06, PT9, and D-10 were co-deposited on the hole transport layer at a weight ratio of 30:70:15:1 to form an emission layer having a thickness of 200 Å. Compound HBL03 was deposited on the emission layer to form a hole blocking layer having a thickness of 50 Å, and ET-1 was deposited to form an electron transport layer having a thickness of 300 Å. $A_1$ was deposited on the electron transport layer to form a cathode having a thickness of 1200 Å, thereby completing the manufacture of an organic light-emitting device.

Examples 2-2 to 2-10 and Comparative Examples 2-1 to 2-20

Organic light-emitting devices were manufactured in substantially the same manner as in Example 2-1, except that emission layers were each formed using compounds shown in Table 7. The third compound is selected from Group III-II.

TABLE 7

| | Emission layer | | | | | Hole | | |
|---|---|---|---|---|---|---|---|---|
| | First compound | Second compound | Third compound | Fourth compound | Weight ratio (C1:C2:C3:C4) | blocking layer | Efficiency (cd/A) | Lifespan (hr) |
| Example 2-1 | HT-07 | ET-06 | PT9 | D-10 | 30:70:15:1 | HBL03 | 26.0 | 23 |
| Example 2-2 | HT-07 | ET-08 | PT9 | D-07 | 50:50:15:1 | HBL03 | 27.2 | 24 |
| Example 2-3 | HT-09 | ET-09 | PT19 | D-20 | 30:70:15:1 | HBL03 | 21.9 | 31 |
| Example 2-4 | HT-09 | ET-11 | PT23 | D-20 | 70:30:15:1 | HBL03 | 25.3 | 22 |
| Example 2-5 | HT-11 | ET-13 | PT23 | D-07 | 50:50:15:1 | HBL03 | 27.5 | 25 |
| Example 2-6 | HT-11 | ET-14 | PT25 | D-10 | 50:50:15:1 | HBL03 | 27.8 | 33 |
| Example 2-7 | HT-13 | ET-15 | PT25 | D-10 | 70:30:15:1 | HBL011 | 35.2 | 29 |
| Example 2-8 | HT-13 | ET-06 | PT28 | D-10 | 50:50:15:1 | HBL03 | 31.4 | 25 |
| Example 2-9 | HT-14 | ET-18 | PT33 | D-07 | 30:70:15:1 | HBL014 | 34.7 | 34 |
| Example 2-10 | HT-15 | ET-09 | PT36 | D-20 | 60:40:15:1 | HBL03 | 31.4 | 29 |
| Comparative Example 2-1 | HT-07 | — | PT9 | D-10 | 100:0:15:1 | HBL03 | 22.0 | 20 |
| Comparative Example 2-2 | — | ET-08 | PT9 | D-07 | 0:100:15:1 | HBL03 | 23.1 | 19 |
| Comparative Example 2-3 | HT-09 | ET-09 | — | D-20 | 30:70:0:1 | HBL03 | 16.5 | 15 |
| Comparative Example 2-4 | HT-09 | ET-11 | — | D-20 | 70:30:0:1 | HBL03 | 16.3 | 14 |
| Comparative Example 2-5 | HT-11 | ET-13 | — | D-07 | 50:50:0:1 | HBL03 | 17.1 | 11 |
| Comparative Example 2-6 | HT-11 | ET-14 | PT25 | — | 0:50:15:0 | HBL03 | 22.9 | 17 |
| Comparative Example 2-7 | HT-13 | ET-15 | — | D-10 | 70:30:0:1 | HBL03 | 17.5 | 15 |
| Comparative Example 2-8 | HT-13 | ET-06 | PT28 | — | 50:50:15:0 | HBL03 | 20.0 | 20 |
| Comparative Example 2-9 | HT-14 | ET-18 | PT33 | — | 30:70:15:0 | HBL03 | 23.1 | 18 |
| Comparative Example 2-10 | CBP | | PT33 | — | 100:15:0 | — | 13.5 | 17 |
| Comparative Example 2-11 | HT-07 | ET-06 | PT9 | DCJTB | 30:70:15:1 | HBL03 | 9.5 | 25 |
| Comparative Example 2-12 | HT-07 | ET-08 | PT9 | DCJTB | 50:50:15:1 | HBL03 | 13.9 | 23 |
| Comparative Example 2-13 | HT-09 | ET-09 | PT19 | DCJTB | 30:70:15:1 | HBL03 | 15.9 | 20 |
| Comparative Example 2-14 | HT-09 | ET-11 | PT23 | DCJTB | 70:30:15:1 | HBL03 | 14.2 | 19 |
| Comparative Example 2-15 | HT-11 | ET-13 | PT23 | DCJTB | 50:50:15:1 | HBL03 | 13.5 | 22 |
| Comparative Example 2-16 | HT-11 | ET-14 | PT25 | DCJTB | 50:50:15:1 | HBL03 | 14.4 | 18 |
| Comparative Example 2-17 | HT-13 | ET-15 | PT25 | DCJTB | 70:30:15:1 | HBL03 | 16.1 | 21 |
| Comparative Example 2-18 | HT-13 | ET-06 | PT28 | DCJTB | 50:50:15:1 | HBL03 | 15.4 | 20 |
| Comparative Example 2-19 | HT-14 | ET-18 | PT33 | DCJTB | 30:70:15:1 | HBL03 | 14.9 | 22 |
| Comparative Example 2-20 | HT-15 | ET-09 | PT36 | DCJTB | 60:40:15:1 | HBL03 | 15.1 | 19 |

Table 7 shows that the organic light-emitting devices of Examples 2-1 to 2-20 have improved current efficiency and longer lifespan as compared with the organic light-emitting devices of Comparative Examples 2-1 to 2-20.

The terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

As described above, the organic light-emitting devices according to embodiments of the present disclosure may have high efficiency and a long lifespan.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims and their equivalents.

What is claimed is:

1. An organic light-emitting device comprising:

a first electrode, a second electrode, and an organic layer between the first electrode and the second electrode, wherein the organic layer comprises an emission layer, the organic layer comprises an electron transport region between the emission layer and the second electrode, the electron transport region comprises a hole blocking layer, the emission layer comprises a first compound, a second compound, a third compound, and a fourth compound, the first compound, the second compound, the third compound, and the fourth compound are different from each other, the third compound comprises a metal element having an atomic number of 40 or more, the fourth compound comprises boron (B), the hole blocking layer comprises a hole blocking material, and each of the first compound, the second compound, and the hole blocking material satisfies Conditions 4 and 5:

$$T_1(HB) \geq T_1(C1) \qquad \text{Condition 4}$$

$$T_1(HB) \geq T_1(C2) \qquad \text{Condition 5}$$

wherein, in Conditions 4 and 5, $T_1(C1)$ is a lowest excitation triplet energy level of the first compound;

$T_1(C2)$ is a lowest excitation triplet energy level of the second compound;

$T_1(HB)$ is a lowest excitation triplet energy level of the hole blocking material; and each of $T_1(C1)$, $T_1(C2)$, and $T_1(HB)$ is an onset value which is a measured value.

2. The organic light-emitting device of claim 1, wherein each of the first compound, the second compound, and the hole blocking material satisfies Conditions 4-1 and 5-1:

$$0.3\ \text{eV} > T_1(HB) - T_1(C1) \geq 0\ \text{eV} \qquad \text{Condition 4-1}$$

$$0.3\ \text{eV} > T_1(HB) - T_1(C2) \geq 0\ \text{eV} \qquad \text{Condition 5-1.}$$

3. The organic light-emitting device of claim 1, wherein the hole blocking material is represented by Formula 10:

Formula 10

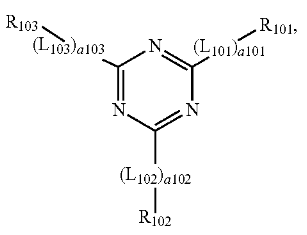

wherein, in Formula 10, $L_{101}$ to $L_{103}$ are each independently selected from a substituted or unsubstituted $C_5$-$C_{30}$ carbocyclic group and a substituted or unsubstituted $C_1$-$C_{30}$ heterocyclic group, a101 to a103 are each independently selected from 0, 1, and 2, and $R_{101}$ to $R_{103}$ are each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $-C(Q_1)(Q_2)(Q_3)$, $-Si(Q_1)(Q_2)(Q_3)$, $-B(Q_1)(Q_2)$, $-N(Q_1)(Q_2)$, $-P(Q_1)(Q_2)$, $-C(=O)(Q_1)$, $-S(=O)(Qi)$, $-S(=O)_2(Q_1)$, $-P(=O)(Q_1)(Q_2)$, and $-P(=S)(Q_1)(Q_2)$.

4. The organic light-emitting device of claim 3, wherein at least one of $R_{101}$ to $R_{103}$ is selected from a group represented by Formula 11-1, a group represented by Formula 11-2, $-C(Q_1)(Q_2)(Q_3)$, and $-Si(Q_1)(Q_2)(Q_3)$:

Formula 11-1

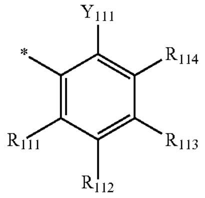

Formula 11-2

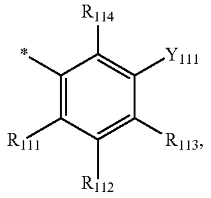

wherein, in Formulae 11-1 and 11-2, $Y_{111}$ is selected from a phenyl group, a biphenyl group, a naphthyl group, a phenalenyl group, an anthracenyl group, a phenanthrenyl group, a fluorenyl group, a carbazolyl group, a dibenzofuranyl group, a dibenzothiophenyl group, $-C(Q_{31})(Q_{32})(Q_{33})$, and $-Si(Q_{31})(Q_{32})(Q_{33})$, and $R_{111}$ to $R_{113}$ are each independently selected from hydrogen, deuterium, a $C_1$-$C_{10}$ alkyl group, a phenyl group, a biphenyl group, a naphthyl group, a phenalenyl group, an anthracenyl group, a phenanthrenyl group, a fluorenyl group, a carbazolyl group, a dibenzofuranyl group, a dibenzothiophenyl group, $-C(Q_{31})(Q_{32})(Q_{33})$, and $-Si(Q_{31})(Q_{32})(Q_{33})$, $Q_1$ to $Q_3$ and $Q_{31}$ to $Q_{33}$ are each independently selected from a phenyl group, a biphenyl group, a naphthyl group, a phenalenyl group, an anthracenyl group, a phenanthrenyl group, a fluorenyl group, a carbazolyl group, a dibenzofuranyl group, and a dibenzothiophenyl group, and

* indicates a binding site to a neighboring atom.

5. The organic light-emitting device of claim 1, wherein the third compound and the fourth compound each satisfy Conditions 1-1 and 1-2 below, and the fourth compound satisfies Condition 2 and/or Condition 3:

$T_1(C3)_{onset} \geq S_1(C4)_{onset}$ Condition 1-1

$T_1(C3)_{max} \geq S_1(C4)_{max}$ Condition 1-2

$K_{RISC}(C4) \geq 10^3 S^{-1}$ Condition 2

$f(C4) \geq 0.1,$ Condition 3 wherein, in Conditions 1-1, 1-2, 2, and 3, $S_1(C4)_{onset}$ is a singlet energy of the fourth compound at the onset wavelength ($\lambda_{onset}$) in a photoluminescence (PL) spectrum of the fourth compound;

$T_1(C3)_{onset}$ is a triplet energy of the third compound at the onset wavelength in a PL spectrum of the third compound;

$S_1(C4)_{max}$ is a singlet energy of the fourth compound at the maximum emission wavelength ($\lambda_{max}$) in a PL spectrum of the fourth compound;

$T_1(C3)_{max}$ is a triplet energy of the third compound at the maximum emission wavelength of a photoluminescence spectrum of the third compound;

$K_{RISC}(C4)$ is a reverse intersystem crossing (RISC) constant of the fourth compound; and f(C4) is an oscillation strength of the fourth compound.

6. The organic light-emitting device of claim 1, wherein the fourth compound has a maximum emission wavelength of about 420 nm to about 490 nm.

7. The organic light-emitting device of claim 1, wherein the first compound is represented by Formula 1, the second compound is represented by Formula 10, the third compound is represented by Formula 3, and the fourth compound is represented by Formula 4:

Formula 1

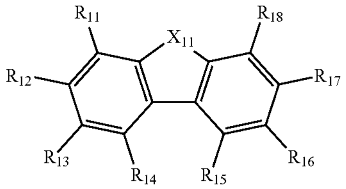

Formula 10

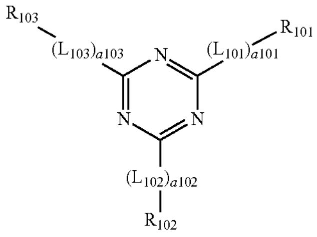

Formula 3

$M_{31}(L_{31})_{n31}(L_{32})_{n32}$

Formula 3A

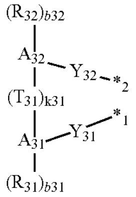

-continued

Formula 3B

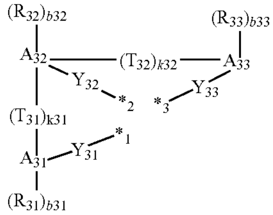

Formula 3C

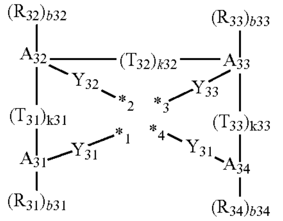

Formula 3D

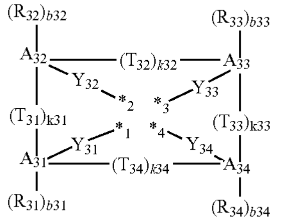

Formula 4

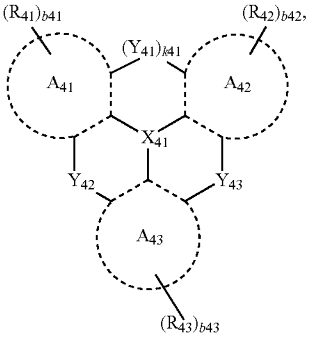

wherein, in Formulae 1, 3, 4, and 10, $X_{11}$ is selected from O, S, $N(R_{19})$, and $C(R_{19})(R_{20})$, $R_{11}$ to $R_{20}$ are each independently selected from:

a group represented by $*-(L_{11})_{a11}-A_{11}$, hydrogen, deuterium, a $C_1$-$C_{60}$ alkyl group, a π electron-depleted nitrogen-free cyclic group, —$C(Q_1)(Q_2)(Q_3)$, —$Si(Q_1)(Q_2)(Q_3)$, —$B(Q_1)(Q_2)$, and —$N(Q_1)(Q_2)$;

a π electron-depleted nitrogen-free cyclic group substituted with at least one selected from deuterium, a $C_1$-$C_{60}$ alkyl group, a π electron-depleted nitrogen-free cyclic group, —$C(Q_{31})(Q_{32})(Q_{33})$, —$S_1(Q_{31})(Q_{32})(Q_{33})$, —$B(Q_{31})(Q_{32})$, and —$N(Q_{31})(Q_{32})$; and a π electron-depleted nitrogen-free cyclic group substituted with a π electron-depleted nitrogen-free cyclic group substituted with at least one selected from deuterium, a $C_1$-$C_{60}$ alkyl group, a π electron-depleted nitrogen-free cyclic group, —$C(Q_{21})(Q_{22})(Q_{23})$, —$S_1(Q_{21})(Q_{22})(Q_{23})$, —$B(Q_{21})(Q_{22})$, and —$N(Q_{21})(Q_{22})$, $L_{11}$ is selected from:

a π electron-depleted nitrogen-free cyclic group, —$C(Q_1)(Q_2)$-, —$Si(Q_1)(Q_2)$-, —$B(Q_1)$-, and —$N(Q_1)$-; and a π electron-depleted nitrogen-free cyclic group substituted with at least one selected from deuterium, a $C_1$-$C_{60}$ alkyl group, a π electron-depleted nitrogen-free cyclic group, —$C(Q_{31})(Q_{32})(Q_{33})$, —$Si(Q_{31})(Q_{32})(Q_{33})$, —$B(Q_{31})(Q_{32})$, and —$N(Q_{31})(Q_{32})$, a11 is selected from 1, 2, and 3, $A_{11}$ is selected from:

a π electron-depleted nitrogen-free cyclic group;

a π electron-depleted nitrogen-free cyclic group substituted with at least one selected from deuterium, a $C_1$-$C_{60}$ alkyl group, a π electron-depleted nitrogen-free cyclic group, —$C(Q_{31})(Q_{32})(Q_{33})$, —$Si(Q_{31})(Q_{32})(Q_{33})$, —$B(Q_{31})(Q_{32})$, and —$N(Q_{31})(Q_{32})$; and a π electron-depleted nitrogen-free cyclic group that is substituted with a π electron-depleted nitrogen-free cyclic group substituted with at least one selected from deuterium, a $C_1$-$C_{60}$ alkyl group, a π electron-depleted nitrogen-free cyclic group, —$C(Q_{21})(Q_{22})(Q_{23})$, —$Si(Q_{21})(Q_{22})(Q_{23})$, —$B(Q_{21})(Q_{22})$, and —$N(Q_{21})(Q_{22})$, $L_{101}$ to $L_{103}$ are each independently selected from a substituted or unsubstituted $C_5$-$C_{30}$ carbocyclic group and a substituted or unsubstituted $C_1$-$C_{30}$ heterocyclic group, a101 to a103 are each independently selected from 0, 1, and 2, and $R_{101}$ to $R_{103}$ are each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$C(Q_1)(Q_2)(Q_3)$, —$Si(Q_1)(Q_2)(Q_3)$, —$B(Q_1)(Q_2)$, —$N(Q_1)(Q_2)$, —$P(Q_1)(Q_2)$, —$C(=O)(Q_1)$, —$S(=O)(Q_1)$, —$S(=O)_2(Q_1)$, —$P(=O)(Q_1)(Q_2)$, and —$P(=S)(Q_1)(Q_2)$, $M_{31}$ is selected from transition metals of Period 4, Period 5, and Period 6 of the Periodic Table of Elements, $L_{31}$ is a ligand represented by one selected from Formulae 3A to 3D, $L_{32}$ is selected from a monodentate ligand, a bidentate ligand, and a tridentate ligand, n31 is selected from 1 and 2, n32 is selected from 0, 1, 2, 3, and 4, $A_{31}$ to $A_{34}$ are each independently selected from a $C_5$-$C_{30}$ carbocyclic group and a $C_1$-$C_{30}$ heterocyclic group, $T_{31}$ to $T_{34}$ are each independently selected from a single bond, a double bond, *—O—*', *—S—*', *—C(=O)—*', *—S(=O)—*', *—$C(R_{35})(R_{36})$—*', *—$C(R_{35})=C(R_{36})$—*', *—$C(R_{35})=$*', *—$Si(R_{35})(R_{36})$—*', *—$B(R_{35})$—*', *—$N(R_{35})$—*', and *—$P(R_{35})$—*', k31 to k34 are each independently selected from 1, 2, and 3, $Y_{31}$ to $Y_{34}$ are each independently selected from a single bond, *—O—*', *—S—*', *—$C(R_{37})(R_{38})$—*', *—$Si(R_{37})(R_{38})$—*', *—$B(R_{37})$—*', *—$N(R_{37})$—*', and *—$P(R_{37})$—*', $*_1$, $*_2$, $*_3$, and $*_4$ each indicate a binding site to $M_{31}$, $R_{31}$ to $R_{38}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$C(Q_1)(Q_2)(Q_3)$, —$Si(Q_1)(Q_2)(Q_3)$, —$B(Q_1)(Q_2)$, —$N(Q_1)(Q_2)$, —$P(Q_1)(Q_2)$, —$C(=O)(Q_1)$, —$S(=O)(Q_1)$, —$S(=O)_2(Q_1)$, —$P(=O)(Q_1)(Q_2)$, and —$P(=S)(Q_1)(Q_2)$, wherein $R_{31}$ to $R_{38}$ are optionally linked to each other to form a substituted or unsubstituted $C_5$-$C_{60}$ carbocyclic group or a substituted or unsubstituted $C_1$-$C_{60}$ heterocyclic group, b31 to b34 are each independently an integer from 0 to 10, $X_{41}$ is N, B, $P(=)(R_{44})$, or $P(=S)(R_{44})$, $Y_{41}$ to $Y_{43}$ are each independently O, S, $N(R_{45})$, $B(R_{45})$, $C(R_{45})(R_{46})$, or $Si(R_{45})(R_{46})$, k41 is 0 or 1, wherein, when k41 is 0, —$(Y_{41})_{k41}$— is not present, $A_{41}$ to $A_{43}$ are each independently selected from a $C_5$-$C_{30}$ carbocyclic group and a $C_1$-$C_{30}$ heterocyclic group, $R_{41}$ to $R_{46}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$C(Q_1)(Q_2)(Q_3)$, —$Si(Q_1)(Q_2)(Q_3)$, —$B(Q_1)(Q_2)$, —$N(Q_1)(Q_2)$, —$P(Q_1)(Q_2)$, —$C(=O)(Q_1)$, —$S(=O)(Q_1)$, —$S(=O)_2(Q_1)$, —$P(=O)(Q_1)(Q_2)$, and —$P(=S)(Q_1)(Q_2)$, wherein $R_{41}$ to $R_{46}$ are optionally linked to each other to form a substituted or unsubstituted $C_5$-$C_{30}$ carbocyclic group and/or a substituted or unsubstituted $C_1$-$C_{30}$ heterocyclic group, b41 to b43 are each independently an integer from 0 to 10, $Q_1$ to $Q_3$, $Q_{21}$ to $Q_{23}$, and $Q_{31}$ to $Q_{33}$ are each independently selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a biphenyl group, and a terphenyl group, and

* indicates a binding site to a neighboring atom.

8. The organic light-emitting device of claim 7, wherein the first compound is represented by one of Formulae 1-1 to 1-5:

1-1

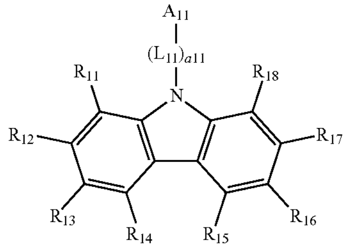

1-2

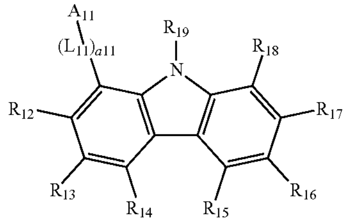

1-3

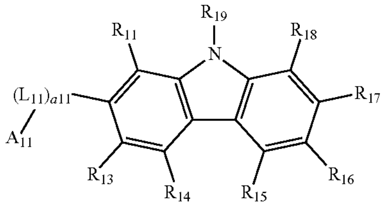

1-4

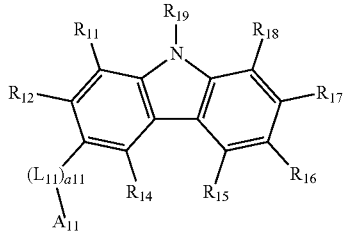

1-5

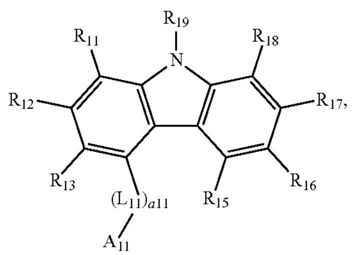

wherein, in Formulae 1-1 to 1-5, $L_{11}$, a11, $A_{11}$, and $R_{11}$ to $R_{19}$ are respectively understood by referring to the descriptions of $L_{11}$, a11, $A_{11}$, and $R_{11}$ to $R_{19}$ provided in connection with Formula 1.

9. The organic light-emitting device of claim 8, wherein $A_{11}$ is represented by one of Formulae 8-1 to 8-5:

8-1

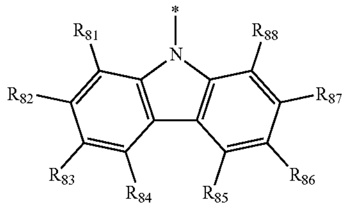

8-2

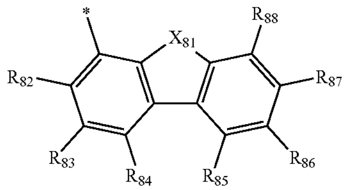

8-3

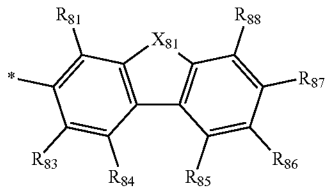

8-4

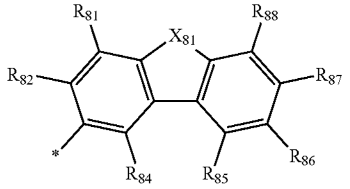

8-5

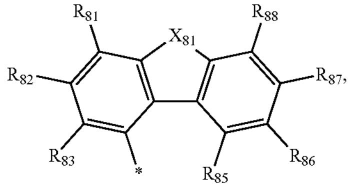

wherein, in Formulae 8-1 to 8-5, $X_{81}$ is selected from O, S, N($R_{89}$), and C($R_{89}$)($R_{90}$), $R_{81}$ to $R_{90}$ are each independently selected from hydrogen, deuterium, a $C_1$-$C_{20}$ alkyl group, a phenyl group, a biphenyl group, a terphenyl group, a fluorenyl group, a carbazolyl group, a dibenzofuranyl group, and a dibenzothiophenyl group, and

* indicates a binding site to a neighboring atom.

10. The organic light-emitting device of claim 7, wherein the third compound is represented by Formula 3-1 or Formula 3-2:

Formula 3-1

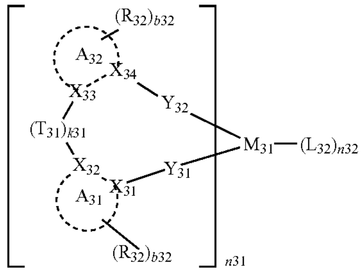

Formula 3-2

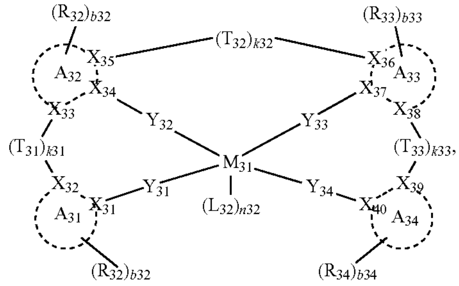

wherein, in Formulae 3-1 and 3-2, $X_{31}$ to $X_{40}$ are each independently selected from N and C.

11. The organic light-emitting device of claim 10, wherein, in Formulae 3-1 and 3-2, the third compound satisfies at least one of Conditions I to IV:

$X_{31}$ is C, and $Y_{31}$ is a single bond; Condition I $X_{34}$ is C, and $Y_{32}$ is a single bond; Condition II $X_{37}$ is C, and $Y_{33}$ is a single bond; and Condition III $X_{40}$ is C, and $Y_{34}$ is a single bond Condition IV.

12. The organic light-emitting device of claim 7, wherein the fourth compound is represented by Formula 4-1:

Formula 4-1

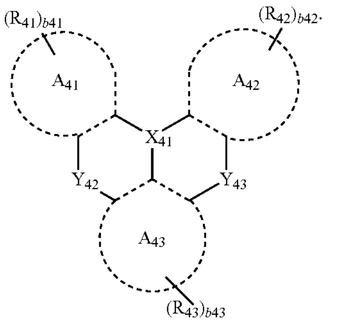

13. The organic light-emitting device of claim 7, wherein the fourth compound is represented by Formula 4-11 or Formula 4-12:

Formula 4-11

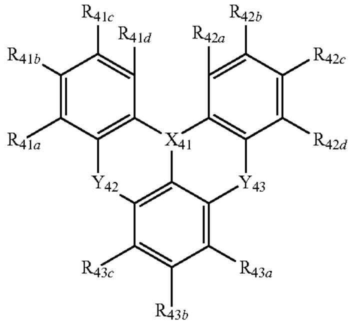

Formula 4-12

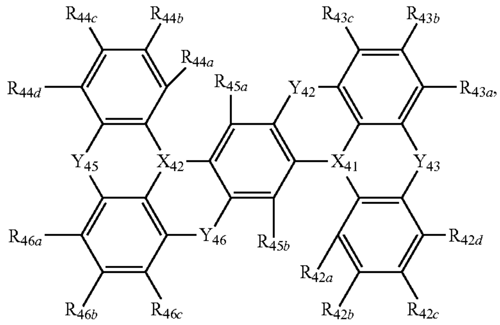

wherein, in Formulae 4-11 and 4-12, $R_{41a}$ to $R_{41d}$, $R_{42a}$ to $R_{42d}$, $R_{43a}$ to $R_{43c}$, $R_{47a}$ to $R_{47d}$, $R_{48a}$, $R_{48b}$, and $R_{49a}$ to $R_{49c}$ are each understood by referring to the description provided in connection with $R_{41}$ in Formula 4.

14. The organic light-emitting device of claim 1, wherein the emission layer is configured to emit blue delayed fluorescence light.

15. The organic light-emitting device of claim 1, wherein each of the first compound, the second compound, and the hole blocking material satisfies at least one of Condition A to C:

$T_1(C1)$ is equal to or greater than 2.7 eV; Condition A $T_1(C2)$ is equal to or greater than 2.7 eV; and Condition B $T_1(HB)$ is equal to or greater than 2.7 eV Condition C.

16. The organic light-emitting device of claim 5, wherein the third compound and the fourth compound each satisfy at least one among Condition D to G:

$T_1(C3)_{onset}$ is equal to or greater than 2.7 eV; Condition D $T_1(C3)_{max}$ is equal to or greater than 2.6 eV; Condition E $S_1(C4)_{onset}$ is equal to or greater than 2.6 eV; and Condition F $S_1(C4)_{max}$ is equal to or greater than 2.6 eV Condition G.

17. An electronic apparatus comprising:

a thin-film transistor comprising a source electrode, a drain electrode, and an activation layer; and the organic light-emitting device of claim 1, wherein the first electrode of the organic light-emitting device is electrically connected to the source electrode or the drain electrode of the thin-film transistor.

18. The electronic apparatus of claim 17, further comprising a sealing part for sealing the organic light-emitting device.

19. The electronic apparatus of claim 18, wherein the sealing part comprises an organic layer, an inorganic layer, or a combination thereof.

20. The electronic apparatus of claim 17, wherein the electronic apparatus is a personal computer, a mobile phone, a digital camera, an electronic organizer, an electronic dictionary, an electronic game machine, a medical instrument, a fish finder, a various measuring instrument, a meter for a vehicle, a meter for an aircraft, a meter for a vessel, or a projector.

* * * * *